(12) United States Patent
Sugishima et al.

(10) Patent No.: US 9,442,374 B2
(45) Date of Patent: Sep. 13, 2016

(54) COLORING COMPOSITION, METHOD FOR MANUFACTURING A COLOR FILTER USING THE SAME, COLOR FILTER AND SOLID-STATE IMAGING DEVICE

(71) Applicant: FUJIFILM CORPORATION, Tokyo (JP)

(72) Inventors: Yasuo Sugishima, Haibara-gun-Shizuoka (JP); Mitsuji Yoshibayashi, Haibara-gun-Shizuoka (JP); Kaoru Aoyagi, Haibara-gun-Shizuoka (JP); Yushi Kaneko, Haibara-gun-Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 135 days.

(21) Appl. No.: 14/189,454

(22) Filed: Feb. 25, 2014

(65) Prior Publication Data

US 2014/0178634 A1    Jun. 26, 2014

Related U.S. Application Data

(63) Continuation of application No. PCT/JP2012/072832, filed on Aug. 31, 2012.

(30) Foreign Application Priority Data

Aug. 31, 2011  (JP) .................................. 2011-190186

(51) Int. Cl.
*B29D 11/00*    (2006.01)
*G03F 7/00*    (2006.01)
(Continued)

(52) U.S. Cl.
CPC ............. *G03F 7/0007* (2013.01); *G02B 5/201* (2013.01); *G02B 5/223* (2013.01); *H01L 27/14621* (2013.01); *H01L 27/14685* (2013.01); *G02B 3/0006* (2013.01); *Y10T 428/24331* (2015.01)

(58) Field of Classification Search
CPC ...... G02B 3/006; G02B 8/201; G02B 5/223; G03C 7/12; G03C 7/14; G03C 7/18; H01L 27/1463; G03F 7/0007; G03F 7/001
USPC ....................... 216/40, 41, 47, 50, 24, 25, 26
See application file for complete search history.

(56) References Cited

U.S. PATENT DOCUMENTS

2007/0298164 A1   12/2007  Ogata et al.
2008/0017607 A1   1/2008  Yoshibayashi
(Continued)

FOREIGN PATENT DOCUMENTS

JP      2003-252864 A    9/2003
JP      2006-222290 A    8/2006
(Continued)

OTHER PUBLICATIONS

Office Action dated Oct. 7, 2014 issued by the Japanese Patent Office in counterpart Japanese Patent Application No. 2012/187696.
(Continued)

*Primary Examiner* — Lan Vinh
(74) *Attorney, Agent, or Firm* — Sughrue Mion, PLLC

(57) ABSTRACT

There is provided a coloring composition including: a colorant; and a resin, wherein a content of the colorant is 50% by mass or more based on total solids of the coloring composition, and a solid acid number of a resin having a highest solid acid number among all kinds of resins contained in the coloring composition, is 80 mg KOH/g or less.

4 Claims, 6 Drawing Sheets

(51) Int. Cl.
*H01L 27/146* (2006.01)
*G02B 5/20* (2006.01)
*G02B 5/22* (2006.01)
*G02B 3/00* (2006.01)

(56) References Cited

U.S. PATENT DOCUMENTS

2010/0119959 A1* 5/2010 Nakashima ......... C09B 67/0033 430/7
2010/0160474 A1* 6/2010 Lee ..................... G03F 7/033 522/42
2010/0261303 A1 10/2010 Ogata et al.

FOREIGN PATENT DOCUMENTS

| | | |
|---|---|---|
| JP | 2007-48774 A | 2/2007 |
| JP | 2008-46584 A | 2/2008 |
| JP | 2008-81732 A | 4/2008 |
| TW | 200821362 A | 5/2008 |

OTHER PUBLICATIONS

International Search Report dated Apr. 12, 2012 issued in International Application No. PCT/JP2012/072832 (PCT/ISA/210).
Written Opinion dated Apr. 12, 2012 issued in International Application No. PCT/JP2012/072832 (PCT/ISA/237).
Office Action dated Oct. 20, 2015, issued by the Taiwanese Intellectual Property Office in counterpart Taiwanese Application No. 101131725.
Office Action dated May 28, 2016, issued by the Korean Intellectual Property Office in counterpart Korean Application No. 10-2014-7003942.

* cited by examiner

COLORING COMPOSITION, METHOD FOR MANUFACTURING A COLOR FILTER USING THE SAME, COLOR FILTER AND SOLID-STATE IMAGING DEVICE

CROSS-REFERENCE TO RELATED APPLICATION(S)

This is a continuation of International Application No. PCT/JP2012/072832 filed on Aug. 31, 2012, and claims priority from Japanese Patent Application No. 2011-190186 filed on Aug. 31, 2011, the entire disclosures of which are incorporated herein by reference.

TECHNICAL FIELD

The present invention relates to a method for manufacturing a color filter, a color filter and a solid-state imaging device.

For example, in a solid-state imaging device, a color filter is installed, in which colored pixels of a plurality of colors such as red pixels, green pixels and blue pixels are two-dimensionally arranged on a support such as a semiconductor substrate. Recently, in the solid-state imaging device, the increase in the number of pixels has been significant. The reduction in the pixel size is significant as compared with the same inch-sized solid-state imaging device in the related art. Further, as the pixel size reduces, performance requirements for color separation have been rigorous, and in order to maintain device characteristics such as color shading characteristics and prevention of color mixing, the performance of a color filter requires thinning, rectangularity and removal of an overlapped region in which colors are overlapped between each colored pixel and the like.

BACKGROUND ART

As a method for manufacturing the color filter, a photolithography has been widely used for a long time. The photolithography is a method including: coating and drying a coloring photosensitive composition on a support to form a colored layer, then exposing and developing the colored layer to form a colored pixel of a first tint (for example, green), and forming a colored pixel of the remaining colors in the same manner.

However, as the pixels of a solid-state imaging device are micronized, it has become difficult to achieve both spectral characteristics and pattern formability of a color filter for the demand for micronization and thinning of the color filter in the pattern formation by a so-called photolithography. Specifically, in a color filter for a solid-state imaging device, the thickness thereof tends to become, for example, 1 μm or less for the thinning of a colored pattern and to become 2 μm or less (for example, 0.5 μm to 2.0 μm) for the pixel pattern size, thereby achieving a microsize.

In particular, as the thinning of a film progresses, the relative amount of colorants such as pigments in a film increases, while the amount of components other than the colorants, which contribute to the photolithographic properties, in a film relatively decreases, and the pattern formability due to the decrease has effects of improving the shape of a pattern observed on the top surface thereof even when a correction such as OPC is performed for the requirement of forming a pattern below 2.0 μm, but there is a problem such as insufficient rectangularity that the pattern edge of the pattern shape is round when observed the cross-section. It is known that in a color filter (a color filter manufactured by photolithography using a coloring radiation sensitive composition in which a pigment is dispersed in various compositions) using a pigment dispersion liquid, the rounding of the pattern edge become significant by influence of light scattering by the pigment when exposuring.

In particular, recently, due to the demand for the higher definition of the color filter for a solid-state imaging device, the formability of a pattern of, for example, 1.4 μm becomes problematic, and thus, the resolution may almost reach a limit in the photolithography in the related art.

For a method for manufacturing a color filter using the photolithography, a processing method using dry etching has been suggested as a method effective to realize micronization and thinning of a pattern. The dry etching has been adopted in the related art as a method for forming a pattern (each colored pixel) in a rectangular form, and a method for forming a pattern which combines the photolithography and the dry etching have been suggested (see, for example, Patent Documents Japanese Patent Application Laid-Open No. 2006-222290 and Japanese Patent Application Laid-Open No. 2007-48774).

However, for the purpose of further enhancing the performance of the solid-state imaging device, it has been still required to suppress a crosstalk (color mixing of light). As a method to solve this, a technique for further thinning the thickness of colored pixels is contemplated. However, in this case, a simple thinning process causes a problem that color formation is insufficient. Therefore, as a technique to solve this problem, it is contemplated to increase the concentration of a colorant in colored pixels. However, on the other hand, it is understood that a problem arises in that dispersion stability is damaged in the liquid of the coloring composition for making colored pixels.

The present invention has been made in consideration of the above-described problems. Therefore, an object of the present invention is to provide a coloring composition having excellent dispersion stability of a colorant in a liquid while containing a high concentration of the colorant in order to further thin colored pixels.

Further, another object of the present invention is to provide a coloring composition capable of reducing the occurrence of overlap region overlapped with colors in other colored layers by forming colored pixels having excellent solvent resistance and alkaline developing solution resistance, and having small change in color in various processes of manufacturing a color filter, thereby making it possible to prepare a color filter having high performance.

Further, still another object of the present invention is to provide a method for preparing a color filter using the coloring composition, a color filter and a solid-state imaging device.

SUMMARY OF INVENTION

The detailed means to solve the above problems is described as follows.

(1) A coloring composition including: a colorant; and a resin, wherein a content of the colorant is 50% by mass or more based on total solids of the coloring composition, and a solid acid number of a resin having a highest solid acid number among all kinds of resins contained in the coloring composition, is 80 mg KOH/g or less.

(2) A method for manufacturing a color filter including: (a) forming a first colored layer with a first coloring composition; and (b) patterning the first coloring composition by dry etching to form a group of through-holes in the first colored layer, wherein the first coloring composition is the coloring composition according to (1).

(3) The method according to (2), wherein the group of through-holes includes a first group of through-holes and a second group of through-holes, the method further including: (c) stacking a second colored radiation sensitive layer with a second coloring radiation sensitive composition on the first colored layer such that the second coloring radiation sensitive composition is embedded inside each of the through-holes in the first group of the through-holes and the second group of the through-holes so as to form a plurality of second colored pixels; (d) removing the second colored radiation sensitive layer and a plurality of the second colored pixels formed inside each of the through-holes in the second group of the through-holes by exposing and developing a position in the second colored radiation sensitive layer, which corresponds to the first group of the through-holes formed in the first colored layer; (e) stacking a third colored radiation sensitive layer with a third coloring radiation sensitive composition on the first colored layer such that the third coloring radiation sensitive composition is embedded inside each of the through-holes in the second group of the through-holes so as to form a plurality of third colored pixels; and (f) removing the third colored radiation sensitive layer by exposing and developing a position in the third colored radiation sensitive layer, which corresponds to the second group of the through-holes formed in the first colored layer.

(4) The method according to (2) or (3), wherein the second coloring radiation sensitive composition contains a colorant in amount of 30% by mass or more based on total solids of the second coloring radiation sensitive composition, and the third coloring radiation sensitive composition contains a colorant in amount of 30% by mass or more based on total solids of the third coloring radiation sensitive composition, and the second coloring composition contains a colorant in amount of 30% by mass or more based on total solids of the third coloring radiation sensitive composition.

(5) The method according to any one of (2) to (4), wherein the first colored layer is a green transmitting layer.

(6) The method according to (5), wherein one of the second pixels and the third pixels is a red transmitting part, and the other is blue transmitting part.

(7) A color filter obtained by the method for preparing a color filter according to any one of (2) to (6).

(8) A solid-state imaging device including the color filter of (7).

According to the present invention, there is provided a coloring composition having excellent dispersion stability of a colorant in a liquid while containing a high concentration of the colorant in order to further thin colored pixels.

Further, there is provided a coloring composition capable of reducing the occurrence of overlap region overlapped with colors in other colored layers by forming colored pixels having excellent solvent resistance and alkaline developing solution resistance, and having small change in color in various processes of manufacturing a color filter, thereby making it possible to prepare a color filter having high performance.

Further, according to the present invention, there are provided a method for preparing a color filter using the coloring composition, a color filter and a solid-state imaging device.

DESCRIPTION OF EMBODIMENTS

Figure 1:
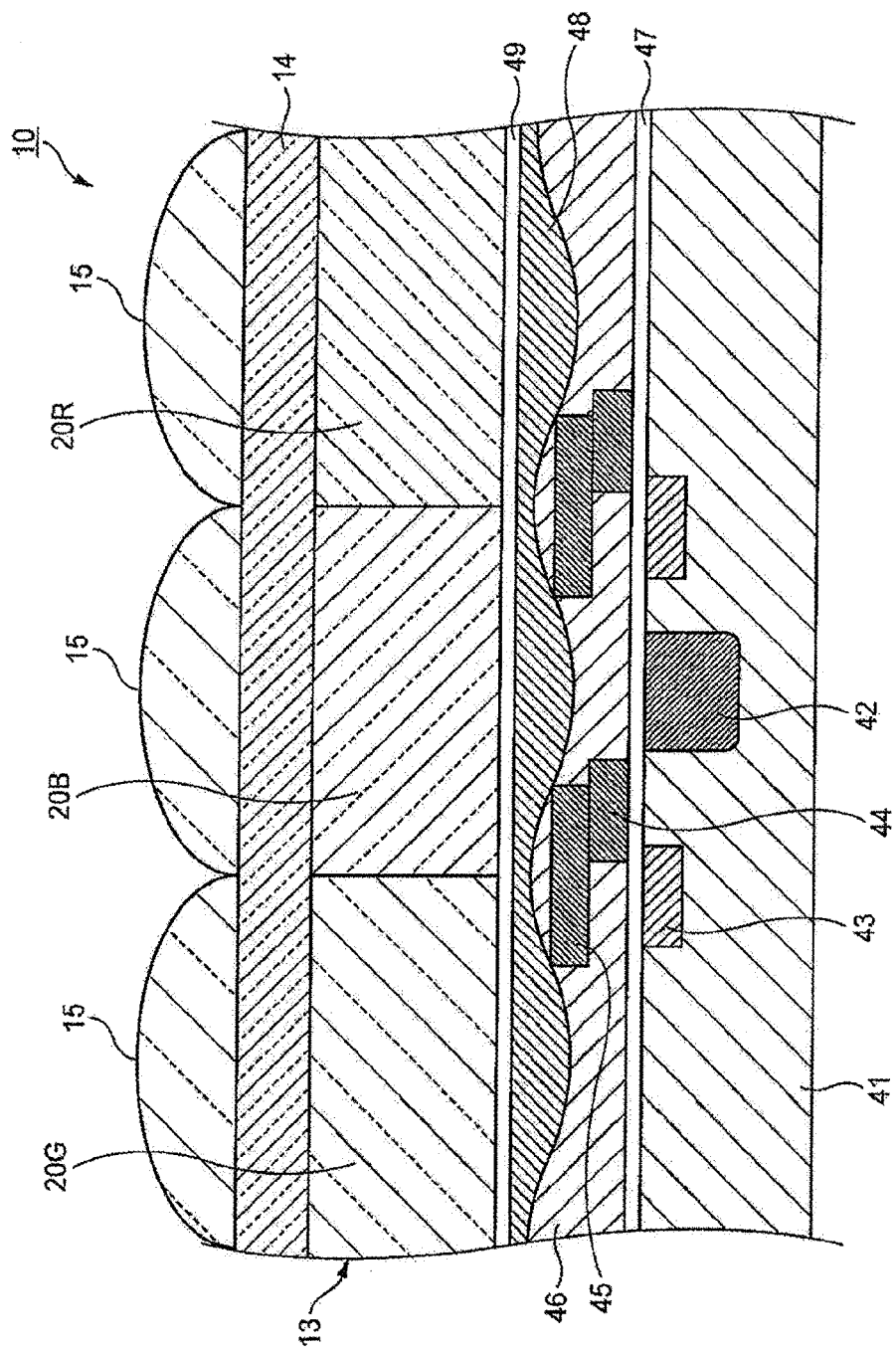
FIG. 1 is a schematic cross-sectional view illustrating an exemplary configuration of a color filter and a solid-state imaging device.

Hereinafter, the composition of the present invention will be described in detail.

In representation of a group (atomic group) in the present specification, the representation which does not describe "substituted" and "unsubstituted" also includes a representation having substituents along with a representation having no substituent. For example, "an alkyl group" includes an alkyl group having no substituent (an unsubstituted alkyl group) and an alkyl group having substituents (a substituted alkyl group).

The explanation of constitutional requirements described hereinafter may be made based on the representative embodiment of the present invention, but the present invention is not limited to such an embodiment. Meanwhile, in the present specification, a numerical range represented by using "to" denotes a range including numerical values described before and after "to" as a lower limit and an upper limit.

Meanwhile, in the present specification, "(meth)acrylate" represents acrylate and methacrylate, "(meth)acryl" represents acryl and methacryl, and "(meth)acryloyl" represents acryloyl and methacryloyl. Further, in the present specification, "monomeric body" and "monomer" are synonymous with each other. In the present invention, monomer is differentiated from oligomer and polymer, and refers to a compound having a mass average molecular weight of less than 2,000. In the present specification, the polymerizable compound refers to a compound having a polymerizable group, and may be a monomer or a polymer. The polymerizable group refers to a group which is involved in a polymerization reaction.

<Coloring Composition>

The coloring composition of the present invention contains a colorant and a resin. In the coloring composition of the present invention, a content of the colorant is 50% by mass or more based on the total solids of the coloring composition, and the corresponding solid acid number of a resin having the highest solid acid number is 80 mgKOH/g or less among the entire resins contained in the coloring composition.

Hereinafter, each component constituting the coloring composition of the present invention will be described.

[1] Colorant

The coloring composition of the present invention contains at least one of colorants. The colorant is not particularly limited, and a mixture of one or two or more of various dyes or pigments known in the related art may be used.

As the pigment, various inorganic pigments or organic pigments known in the art may be used. Further, when it is considered that it is preferred that any of inorganic pigments or organic pigments has a high transmittance, it is preferred to use a pigment having an average particle diameter as small as possible, and when the handling ability is considered, the average particle diameter of the pigment is preferably 0.01 μm to 0.1 μm, and more preferably 0.01 μm to 0.05 μm.

Pigments which may be preferably used in the present invention are as follows. However, the present invention is not limited thereto.

C.I. Pigment Yellow 1, 2, 3, 4, 5, 6, 10, 11, 12, 13, 14, 15, 16, 17, 18, 20, 24, 31, 32, 34, 35, 35:1, 36, 36:1, 37, 37:1, 40, 42, 43, 53, 55, 60, 61, 62, 63, 65, 73, 74, 77, 81, 83, 86, 93, 94, 95, 97, 98, 100, 101, 104, 106, 108, 109, 110, 113, 114, 115, 116, 117, 118, 119, 120, 123, 125, 126, 127, 128, 129, 137, 138, 139, 147, 148, 150, 151, 152, 153, 154, 155, 156, 161, 162, 164, 166, 167, 168, 169, 170, 171, 172, 173, 174, 175, 176, 177, 179, 180, 181, 182, 185, 187, 188, 193, 194, 199, 213, 214 and the like, C.I. Pigment Orange 2, 5, 13, 16, 17:1, 31, 34, 36, 38, 43, 46, 48, 49, 51, 52, 55, 59, 60, 61, 62, 64, 71, 73 and the like, C.I. Pigment Red 1, 2, 3, 4, 5, 6, 7, 9, 10, 14, 17, 22, 23, 31, 38, 41, 48:1, 48:2, 48:3, 48:4, 49, 49:1, 49:2, 52:1, 52:2, 53:1, 57:1, 60:1, 63:1, 66, 67, 81:1, 81:2, 81:3, 83, 88, 90, 105, 112, 119, 122, 123, 144, 146, 149, 150, 155, 166, 168, 169, 170, 171, 172, 175, 176, 177, 178, 179, 184, 185, 187, 188, 190, 200, 202, 206, 207, 208, 209, 210, 216, 220, 224, 226, 242, 246, 254, 255, 264, 270, 272 and 279

C.I. Pigment Green 7, 10, 36, 37 and 58

C.I. Pigment Violet 1, 19, 23, 27, 32, 37 and 42

C.I. Pigment Blue 1, 2, 15, 15:1, 15:2, 15:3, 15:4, 15:6, 16, 22, 60, 64, 66, 79 and 80

C.I. Pigment Black 1

These organic pigments may be used either alone or in combination of various pigments in order to enhance the color purity.

In the present invention, when the colorant is a dye, a coloring composition which is uniformly dissolved in the composition may be obtained.

The dye is not particularly limited, and a dye for a color filter known in the related art may be used.

As the chemical structure, dyes such as pyrazole azo-based, anilino azo-based, triphenylmethane-based, anthraquinone-based, anthrapyridone-based, benzilidene-based, oxonol-based, pyrazolotriazole azo-based, pyridone azo-based, cyanine-based, phenothiazine-based, pyrrolo pyrazole azomethine-based, xanthene-based, phthalocyanine-based, benzopyran-based, indigo-based and pyromethene-based dyes may be used. Further, a multimer of these dyes may be used.

In addition, as the colorant, an acidic dye and/or a derivative thereof may be suitably used.

Besides, it is possible to usefully use a direct dye, a basic dye, a mordant dye, an acidic mordant dye, an azoic dye, a disperse dye, an oil-soluble dye, a food dye, and/or a derivative thereof and the like.

Hereinafter, specific examples of the acidic dye will be enumerated, but are not limited thereto. Examples thereof include acid alizarin violet N; acid black 1, 2, 24 and 48; acid blue 1, 7, 9, 15, 18, 23, 25, 27, 29, 40 to 45, 62, 70, 74, 80, 83, 86, 87, 90, 92, 103, 112, 113, 120, 129, 138, 147, 158, 171, 182, 192, 243 and 324:1; acid chrome violet K; acid Fuchsin; acid green 1, 3, 5, 9, 16, 25, 27 and 50; acid orange 6, 7, 8, 10, 12, 50, 51, 52, 56, 63, 74 and 95; acid red 1, 4, 8, 14, 17, 18, 26, 27, 29, 31, 34, 35, 37, 42, 44, 50, 51, 52, 57, 66, 73, 80, 87, 88, 91, 92, 94, 97, 103, 111, 114, 129, 133, 134, 138, 143, 145, 150, 151, 158, 176, 183, 198, 211, 215, 216, 217, 249, 252, 257, 260, 266 and 274; acid violet 6B, 7, 9, 17 and 19; acid yellow 1, 3, 7, 9, 11, 17, 23, 25, 29, 34, 36, 42, 54, 72, 73, 76, 79, 98, 99, 111, 112, 114, 116, 184 and 243; Food Yellow 3; and derivatives of these dyes.

Besides the above, acidic dyes such as azo-based, xanthene-based and phthalocyanine-based acidic dyes, and C.I. Solvent Blues 44 and 38; C.I. Solvent Orange 45; Rhodamine B and Rhodamine 110 dyes, and derivatives of these dyes are also preferably used.

Among them, the colorant is preferably selected from triarylmethane-based, anthraquinone-based, azomethine-based, benzylidene-based, oxonol-based, cyanine-based, phenothiazine-based, pyrrolopyrazole azomethine-based, xanthene-based, phthalocyanine-based, benzopyran-based, indigo-based, pyrazole azo-based, anilino azo-based, pyrazolotriazole azo-based, pyridone azo-based, anthrapyridone-based and pyromethene-based colorants.

Further, pigments and dyes may be used in combination.

The colorant in the present invention is preferably a dye or a pigment. In particular, a pigment having an average particle diameter (r) satisfying 20 nm≤r≤300 nm, preferably 25 nm≤r≤250 nm, and particularly preferably 30 nm≤r≤200 nm is preferred. A pixel having a high contrast ratio and a high light transmittance may be obtained by using a pigment having the average particle diameter. As used herein, the term "average particle diameter" means an average particle diameter of secondary particles in which primary particles (single crystallites) of a pigment are aggregated. The average primary particle diameter may be obtained by measuring 100 particle sizes in portions where particles are not aggregated by observation through SEM or TEM and calculating the average value thereof.

In addition, the particle diameter distribution of secondary particles of a pigment which may be used in the present invention (hereinafter, simply referred to as "particle diameter distribution") is suitable when secondary particles with diameter range within (average particle diameter±100) nm are present in an amount of 70% by mass, and preferably 80% by mass based on the entire secondary particles.

A pigment having the above-described average particle diameter and particle diameter distribution may be prepared by using a commercially available pigment together with another pigment (the average particle diameter thereof usually exceeds 300 nm) used in some cases to prepare a pigment mixture solution in which a dispersion agent and a solvent are preferably mixed, and mixing and dispersing the pigment mixture solution while pulverizing the pigment by using a pulverizer such as, for example, bead mill and roll mill. The pigment thus obtained usually takes a form of pigment dispersion liquid.

—Micronization of Pigment—

In the present invention, a fine and particle-size-regulated organic pigment may be used if necessary. Micronization of the pigment is achieved through a process which includes preparing a highly viscous liquid composition together with the pigment, a water-soluble organic solvent and water-soluble inorganic salts and adding stress and grinding the pigment by using a wet pulverizing apparatus and the like.

Examples of the water-soluble organic solvent used in the micronization process of the pigment include methanol, ethanol, isopropanol, n-propanol, isobutanol, n-butanol, ethylene glycol, diethylene glycol, diethylene glycol monomethyl ether, diethylene glycol monoethyl ether, diethylene glycol monobutyl ether, propylene glycol, propylene glycol monomethyl ether acetate and the like.

Further, other solvents which have a low water-solubility or no water-solubility, for example, benzene, toluene, xylene, ethylbenzene, chlorobenzene, nitrobenzene, aniline, pyridine, quinoline, tetrahydrofuran, dioxane, ethyl acetate, isopropyl acetate, butyl acetate, hexane, heptane, octane, nonane, decane, undecane, dodecane, cyclohexane, methylcyclohexane, halogenated hydrocarbon, acetone, methyl ethyl ketone, methyl isobutyl ketone, cyclohexanone, dimethylformamide, dimethylsulfoxide, N-methylpyrrolidone, or the like may be used as long as the amount thereof is so small that the solvent is adsorbed on the pigment and do not flow into waste water.

The solvent used in the micronization process of the pigment may be used either alone or in combination of two or more if necessary.

In the present invention, examples of the water-soluble inorganic salt used in the micronization process of the pigment include sodium chloride, potassium chloride, calcium chloride, barium chloride, sodium sulfate and the like.

The amount of the water-soluble inorganic salt used in the micronization process is 1 time by mass to 50 times by mass the amount of the pigment, and more preferably 1 time by mass to 10 times by mass the amount of the pigment, from the viewpoint of productivity, although a greater amount provides a higher grinding effect. Further, it is preferred that inorganic salts with a moisture content of 1% or less are used.

The amount of the water-soluble organic solvent used in the micronization process is 50 parts by mass to 300 parts by mass, and preferably 100 parts by mass to 200 parts by mass, based on 100 parts by mass of the pigment.

The operation conditions of the wet pulverizing apparatus in the micronization process of the pigment are not particularly limited, but in order to effectively perform milling by a pulverizing media, in the operation conditions when a kneader is used as an apparatus, the number of rotations of a blade in the apparatus is preferably from 10 rpm to 200 rpm, and the rotation ratio between two axes is preferably relatively higher because a higher grinding effect is obtained. The operation time including a dry pulverizing time is preferably 1 hour to 8 hours, and the internal temperature of the apparatus is preferably 50° C. to 150° C. In addition, the water-soluble inorganic salt as a pulverizing media preferably has a pulverized particle size of 5 µm to 50 µm, a sharp particle diameter distribution, and a spherical shape.

—Combination of Pigments—(Color Matching)

These organic pigments may be used either alone or in combination thereof in order to enhance the color purity. Specific examples of the combination will be shown in the following. For example, as a red pigment, anthraquinone-based pigments, perylene-based pigments and diketopyrrolopyrrole-based pigments may be used, either alone or in mixture of at least one thereof, with disazo-based yellow pigments, isoindoline-based yellow pigments and quinophthalone-based yellow pigments or perylene-based red pigments, anthraquinone-based red pigments and diketopyrrolopyrrole-based red pigments, or the like. Examples of the anthraquinone-based pigments include C.I. Pigment Red 177, examples of the perylene-based pigments include C.I. Pigment Red 155 and C.I. Pigment Red 224, and examples of the diketopyrrolopyrrole-based pigments include C.I. Pigment Red 254, and from the viewpoint of color reproducibility, a mixture with C.I. Pigment Yellow 83, C.I. Pigment Yellow 139 or C.I. Pigment Red 177 is preferred. Further, the mass ratio of the red pigment to other pigments is preferably 100:5 to 100:80. Within this range, light transmittance in a range from 400 nm to 500 nm is suppressed to improve the color purity and a sufficient color developing power is achieved. In particular, the mass ratio is optimally 100:10 to 100:65. Meanwhile, in the case of a combination of red pigments, the mass ratio may be adjusted in accordance with the chromaticity.

In addition, as a green pigment, halogenated phthalocyanine-based pigments may be used either alone or in mixture of the halogenated phthalocyanine-based pigment with disazo-based yellow pigments, quinophthalone-based yellow pigments, azomethine-based yellow pigments or isoindoline-based yellow pigments. For example, as an example thereof a mixture with C.I. Pigment Green 7, 36, 37 and 58 and C.I. Pigment Yellow 83, C.I. Pigment Yellow 138, C.I. Pigment Yellow 139, C.I. Pigment Yellow 150, C.I. Pigment Yellow 180 or C.I. Pigment Yellow 185 is preferred. The mass ratio of the green pigment to the yellow pigment is preferably 100:5 to 100:200. In the mass ratio within the above-described range, the light transmittance in a range of 400 nm to 450 nm may be suppressed to improve the color purity, and a color in the vicinity of an NTSC target color which is a designed value as it is may be obtained without the main wavelength thereof being in the vicinity of the long wavelength. The mass ratio is particularly preferably 100:20 to 100:150.

As a blue pigment, phthalocyanine-based pigments may be used either alone or in mixture of the phthalocyanine-based pigment with dioxazine-based violet pigments. Particularly suitable examples thereof include mixtures with C.I. Pigment Blue 15:6 and C.I. Pigment Violet 23.

The mass ratio of the blue pigment to the violet pigment is preferably 100:0 to 100:100, and more preferably 100:70 or less.

In the coloring composition of the present invention, the content of a colorant is 50% by mass or more, preferably 55% by mass or more, and more preferably 60% by mass or more based on the total solids of the coloring composition. In such a content, for example, in order to promote suppressing a crosstalk (color mixing of light), even if the thickness of colored pixels obtained from the coloring composition is made very thin (for example, 0.7 µm or less), it is possible to obtain a sufficient color formation. In contrast, if the content of the colorant is less than 50% by mass based on the total solids of the coloring composition, it is difficult to obtain a sufficient color formation when the thickness of the colored pixels is made very thin as described above.

In addition, although there is no particular limitation on the upper limit of the colorant based on total solids of the coloring composition, the content may be, for example, 99.5% by mass or less.

[2] Resin

The coloring composition of the present invention contains a resin. The resin may be exemplified by a resin functioning as a dispersion resin which disperses the above-described colorant, or a resin functioning as a binder resin. In addition, the resin may function as a dispersion resin as well as a binder resin.

As described above, the corresponding solid acid number of the resin having the highest solid acid number (hereinafter, the acid number will be referred to as "maximum solid acid number of resin" as well) among all kinds of resins contained in the coloring composition, is 80 mg KOH/g or less. In such an embodiment, the dispersion stability of the colorant in the liquid of the composition may become excellent. It is considered that this is because the formation of hydrogen bonding between resins is suppressed and the increase in viscosity is, in turn, suppressed by using a resin having few acid groups. Further, when only one kind of resin is contained in the coloring composition, the maximum solid acid number of resins is the acid number of the one kind of resin.

In addition, since the maximum solid acid number of resins is 80 mg KOH/g or less, even in the case where the colored layer formed by the coloring composition of the present invention comes into contact with organic solvents in other coloring compositions or an alkaline developing solution during manufacturing a color filter, the colored layer has high durability with respect to these liquids, and it is possible to suppress the occurrence of color loss in the colored layer or the occurrence of overlap region in which a plurality of colors are overlapped with each other, thereby improving in the performance of the color filter finally obtained.

Particularly, in the case where a somewhat high polar solvent is used as a solvent for other coloring compositions, since the maximum solid acid number of resins is 80 mg KOH/g or less according to the colored layer formed by the coloring composition of the present invention, it is considered that the affinity with such a solvent is lowered, and solvent resistance is enhanced. In addition, since the maximum solid acid number of resins is 80 mg KOH/g or less, it is considered that the colored layer formed by the coloring composition of the present invention has decreased solubility in a developing solution (especially, alkine developing solution), and thus, solvent resistance is enhanced.

The highest solid acid number of the resin is preferably 70 mg KOH/g or less, and more preferably 60 mg KOH/g or less.

When the highest solid acid number of the resin is 0 mg KOH/g, the value is within the range of the present invention and is a preferred form, but when the highest solid acid number of the resin exceeds 0 mg KOH/g, the highest solid acid number of the resin is, for example, 1 mg KOH/g or more.

The solid acid number of the resin may be adjusted by adjusting the amount of the acid group in the resin.

More specifically, the dispersion resin in the present invention may or may not have a structural unit (repeating unit) having an acid group, but when the dispersion resin has a structural unit having an acid group, the content of the structural unit having an acid group is preferably 1% by mass to 40% by mass, more preferably 1% by mass to 30% by mass, and still more preferably 1% by mass to 20% by mass, based on the total mass of the dispersion resin.

The content of the structural unit having an acid group is within the above-described range, and thus, the acid number of the dispersion resin may be suitably adjusted to 80 mg KOH/g or less.

Examples of the acid group include a carboxylic acid group, a sulfonic acid group, a phosphoric acid group, a phenolic hydroxyl group and the like. The acid groups may be used either alone or in combination of two or more kinds thereof.

In the present invention, the acid number of the dispersion resin may be calculated, for example, from the average content of acid groups in the dispersion resin. In addition, a resin having a desired acid number may be obtained by changing the content of a monomer unit containing an acid group, which constitutes the dispersion resin.

As the dispersion resin, many kinds of compounds may be used, but among them, the dispersion resin in the present invention is preferably a graft polymer. The graft polymer preferably has a graft chain having the number of atoms except hydrogen atoms in a range of 40 to 10,000, and the graft chain in this case indicates a portion from the source of the main chain of a copolymer (an atom which binds with the main chain in a group branched from the main chain) to the terminal of the group branched from the main chain. In the coloring composition, the dispersion resin is a dispersion resin which imparts dispersibility to a colorant (particularly, a pigment), and the dispersion resin has affinity for the solvent by the graft chain, and thus the dispersibility and dispersion stability after the passage of time of the colorant are excellent. Further, when the dispersion resin is made into a coloring composition, the graft chain shows excellent interaction with the solvent, and thus the uniformity of film thickness in a coating film is enhanced more.

The graft copolymer has the number of atoms except hydrogen atoms of preferably 40 to 10,000 per graft chain, the number of atoms except hydrogen atoms of more preferably 100 to 500 per graft chain, and the number of atoms except hydrogen atoms of still more preferably 150 to 260 per graft chain.

When the number of atoms except hydrogen atoms per graft chain is less than 40, the graft chain is short, and thus the steric repulsive effect decreases, resulting in deteriorating the dispersibility or dispersion stability. Meanwhile, when the number of atoms except hydrogen atom per graft chain exceeds 10,000, the graft chain is too long, and thus, adsorptivity to the colorant decreases, resulting in reducing dispersibility or dispersion stability.

Meanwhile, the number of atoms except hydrogen atoms per graft chain refers to the number of atoms except hydrogen atoms included in a chain from an atom of the source bound to a polymer chain constituting the main chain to the terminal of a branched polymer branched from the main chain. Further, when two or more kinds of graft chains are included in the graft copolymer, it is sufficient for the number of atoms of at least one graft chain except hydrogen atoms to satisfy the requirements.

As the polymer structure of the graft chain, a poly(meth)acrylic structure, a polyester structure, a polyurethane structure, a polyurea structure, a polyamide structure, a polyether structure and the like may be used. In order to improve the interaction of the graft chain with a solvent and accordingly enhance the dispersibility or dispersion stability, a graft chain including a poly(meth)acrylic structure, a polyester structure, or a polyether structure is preferred, and a graft chain including a polyester structure or a polyether structure is more preferred.

The graft copolymer preferably has a structural unit (repeating unit) having the graft chain, and may be obtained, for example, by polymerizing a macro monomer having a polymer structure as the graft chain based on a typical method. The structure of a macro monomer is not particularly limited, as long as the macro monomer has a substituent capable of reacting with the polymer main chain moiety, and also has a graft chain satisfying the requirements of the present invention. Preferably, macro monomers having a reactive double bond group may be suitably used.

Examples of commercially available macro monomers that are suitably used for the synthesis of the graft polymer include AA-6 (manufactured by TOAGOSEI Co., Ltd.), AA-10 (manufactured by TOAGOSEI Co., Ltd.), AB-6 (manufactured by TOAGOSEI Co., Ltd.), AS-6 (manufactured by TOAGOSEI Co., Ltd.), AN-6 (manufactured by TOAGOSEI Co., Ltd.), AW-6 (manufactured by TOAGO- SEI Co., Ltd.), AA-714 (manufactured by TOAGOSEI Co., Ltd.), AY-707 (manufactured by TOAGOSEI Co., Ltd.), AY-714 (manufactured by TOAGOSEI Co., Ltd.), AK-5 (manufactured by TOAGOSEI Co., Ltd.), AK-30 (manufactured by TOAGOSEI Co., Ltd.), AK-32 (manufactured by TOAGOSEI Co., Ltd.), BLEMMER PP-100 (manufactured by NOF Corporation), BLEMMER PP-500 (manufactured by NOF Corporation), BLEMMER PP-800 (manufactured by NOF Corporation), BLEMMER PP-1000 (manufactured by NOF Corporation), BLEMMER 55-PET-800 (manufactured by NOF Corporation), BLEMMER PME-4000 (manufactured by NOF Corporation), BLEMMER PSE-400 (manufactured by NOF Corporation), BLEMMER PSE-1300 (manufactured by NOF Corporation), BLEMMER 43PAPE-600B (manufactured by NOF Corporation), and the like. Among them, AA-6 (manufactured by TOAGOSEI Co., Ltd.), AA-10 (manufactured by TOAGOSEI Co., Ltd.), AB-6 (manufactured by TOAGOSEI Co., Ltd.), AS-6 (manufactured by TOAGOSEI Co., Ltd.), AN-6 (manufactured by TOAGOSEI Co., Ltd.), BLEMMER PME-4000 (manufactured by NOF Corporation) and the like are preferred.

The graft polymer used in the present invention preferably includes, as a structure having the graft chain, at least one structural unit represented by any one of the following Formulas (1) to (4), and more preferably includes at least one structural unit represented by any one of the following Formula (1A), the following Formula (2A), the following Formula (3A), the following Formula (3B) and the following Formula (4).

In Formulas (1) to (4), each of $X^1$, $X^2$, $X^3$, $X^4$ and $X^5$ independently represents a hydrogen atom or a monovalent organic group. From the viewpoint of the restrictions on synthesis, a hydrogen atom or an alkyl group having 1 to 12 carbon atoms is preferred, a hydrogen atom or a methyl group is more preferred, and a methyl group is particularly preferred.

In Formulas (1) to (4), each of $W^1$, $W^2$, $W^3$ and $W^4$ independently represents an oxygen atom or NH, and an oxygen atom is particularly preferred.

In Formulas (1) to (4), each of $Y^1$, $Y^2$, $Y^3$, and $Y^4$ is independently a divalent linking group, and is not particularly limited in structure. Specifically, examples thereof include linking groups from the following (Y-1) to (Y-21), and the like. In the following structures, each of A and B represents a bond to the left terminal group and a bond to the right terminal group in Formulas (1) to (4), respectively. Among the following structures, (Y-2) and (Y-13) are more preferably used due to the simplicity of synthesis.

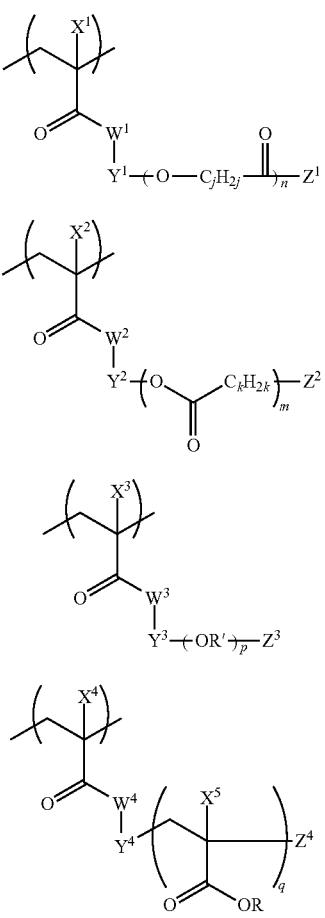

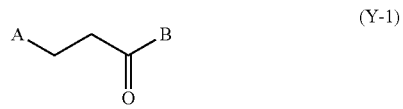
(Y-1)

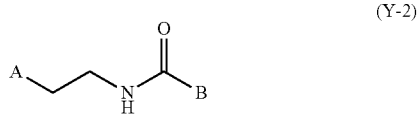
(Y-2)

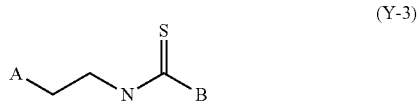
(Y-3)

(Y-4)

(Y-5)

(Y-6)

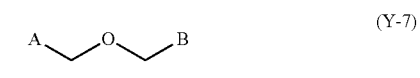
(Y-7)

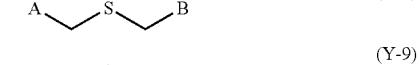
(Y-8)

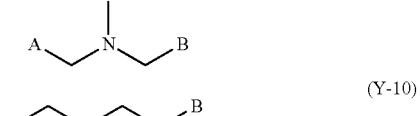
(Y-9)

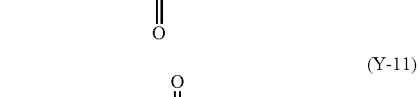
(Y-10)

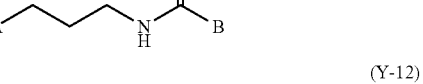
(Y-11)

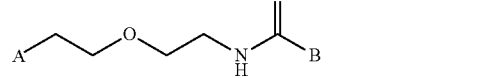
(Y-12)

(Y-13) 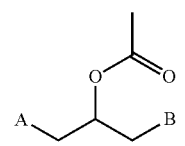

(Y-14) 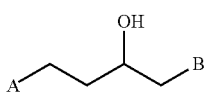

(Y-15) 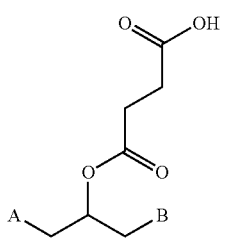

(Y-16) 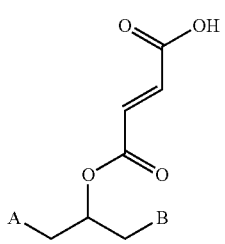

(Y-17) 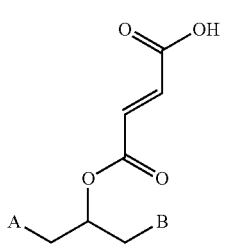

(Y-18) 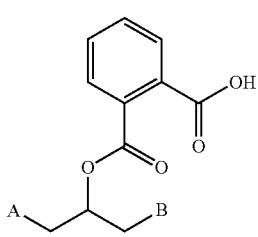

(Y-19) 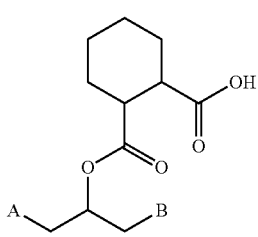

(Y-20) 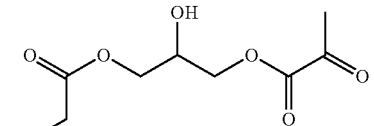

(Y-21) 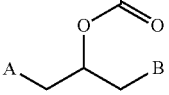

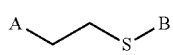

In formulas (1) to (4), each of $Z^1$, $Z^2$, $Z^3$, and $Z^4$ is independently a hydrogen atom or a monovalent substituent, and the structure of the substituent is not particularly limited, but specific examples thereof include an alkyl group, a hydroxyl group, an alkoxy group, an aryloxy group, or a heteroaryloxy group, an alkyl thioether group, an aryl thioether group, or a heteroaryl thioether group, an amino group and the like. Among them, particularly from the viewpoint of improving dispersibility, the group preferably has a steric repulsive effect, and as a monovalent substituent represented by $Z^1$ to $Z^3$, each of the groups is independently preferably an alkyl group having 5 to 24 carbon atoms or an alkoxy group having 5 to 24 carbon atoms, and among them, each of the group is independently particularly preferably an alkoxy group having a branched alkyl group having 5 to 24 carbon atoms or an alkoxy group having a cyclic alkyl group having 5 to 24 carbon atoms. Further, a monovalent substituent represented by $Z^4$ is preferably an alkyl group having 5 to 24 carbon atoms, and among them, each of the groups is independently preferably a branched alkyl group having 5 to 24 carbon atoms or a cyclic alkyl group having 5 to 24 carbon atoms.

In Formulas (1) to (4), each of n, m, p, and q is an integer of 1 to 500.

In Formulas (1) and (2), each of j and k is independently an integer of 2 to 8. In Formulas (1) and (2), from the viewpoint of dispersion stability, j and k are preferably an integer of 4 to 6, and most preferably 5.

In Formula (3), R' represents a branched or straight chained alkylene group. R' in Formula (3) is preferably an alkylene group having 1 to 10 carbon atoms, and more preferably an alkylene group having 2 or 3 carbon atoms.

Further, as R' in Formula (3), two or more kinds of R's having different structures from one another in the dispersion resin may be mixed and used.

In Formula (4), R represents a hydrogen atom or a monovalent organic group, and the structure thereof is not particularly limited, but examples thereof include preferably a hydrogen atom, an alkyl group, an aryl group, and a heteroaryl group, and more preferably a hydrogen atom and an alkyl group. When R is an alkyl group, the alkyl group is preferably a straight chained alkyl group having 1 to 20 carbon atoms, a branched alkyl group having 3 to 20 carbon atoms, or a cyclic alkyl group having 5 to 20 carbon atoms, more preferably a straight chained alkyl group having 1 to 20 carbon atoms, and particularly preferably a straight chained alkyl group having 1 to 6 carbon atoms In addition, as R in Formula (4), two or more kinds of R's having different structures from one another in the dispersion resin may be mixed and used.

As a structural unit represented by Formula (1), from the viewpoint of dispersion stability, a structural unit represented by the following Formula (1A) or Formula (2A) is more preferred.

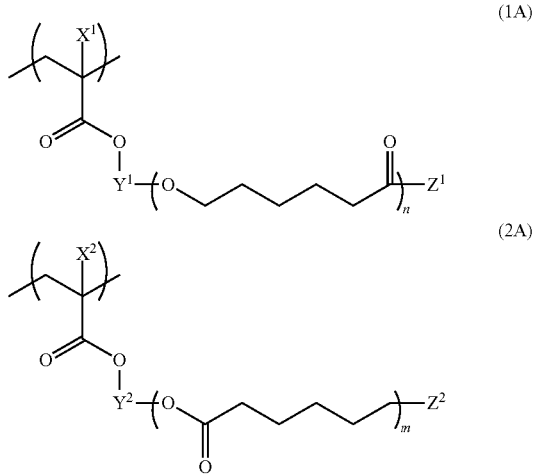

In Formula (1A), $X^1$, $Y^1$, $Z^1$ and n have the same meanings as $X^1$, $Y^1$, $Z^1$ and n in Formula (1), and the preferred ranges are also the same.

In Formula (2A), $X^2$, $Y^2$, $Z^2$ and m have the same meanings as $X^2$, $Y^2$, $Z^2$ and m in Formula (2), and the preferred ranges are also the same.

Further, as a structural unit represented by Formula (3), from the viewpoint of dispersion stability, a structural unit represented by the following Formula (3A) or the following Formula (3B) is more preferred.

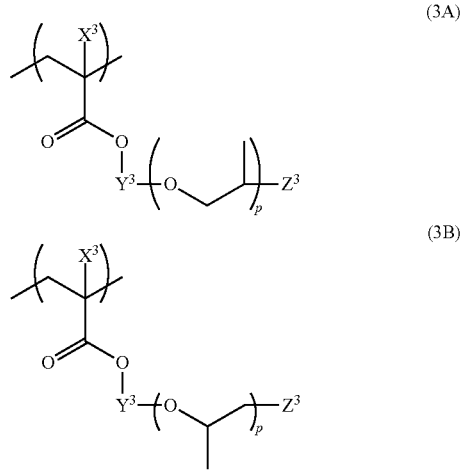

In Formula (3A) or Formula (3B), $X^3$, $Y^3$, $Z^3$ and p have the same meanings as $X^3$, $Y^3$, $Z^3$ and p in Formula (3), and the preferred ranges are also the same.

The graft polymer more preferably has a structural unit represented by Formula (1A).

In the graft polymer used in the present invention, the structural unit (repeating unit) having the graft chain is included in a range preferably 10% by mass to 75% by mass, more preferably 12% by mass to 50% by mass, and particularly preferably 15% by mass to 40% by mass, based on the total mass of the dispersion resin. When the amount is within these ranges, the dispersibility or dispersion stability of the colorant is high, and thus the uniformity of film thickness in a coating film formed by using the coloring composition is further improved. Further, the dispersion resin used in the present invention may be a combination of two or more kinds of graft copolymers whose structures are different from one another.

In addition, in order to improve various performances such as strength, the dispersion resin in the present invention may include another structural unit having further various functions, for example, a structural unit having a functional group and the like having affinity for a dispersion medium used in a dispersoid as a structural unit derived from copolymerization components, as long as the effect of the present invention is not impaired.

Examples of the copolymerization components that are copolymerizable with the dispersion resin according to the present invention include a radical polymerizable compound selected from acrylic esters, methacrylic esters, styrenes, acrylonitriles, methacrylonitriles, acrylamides, methacrylamides and the like.

Specific examples thereof include acrylic esters such as alkyl acrylate (the alkyl group preferably has 1 to 20 carbon atoms) (specifically, for example, benzyl acrylate, 4-biphenyl acrylate, butyl acrylate, sec-butyl acrylate, t-butyl acrylate, 4-t-butylphenyl acrylate, 4-chlorophenyl acrylate, pentachlorophenyl acrylate, 4-cyanobenzyl acrylate, cyanomethyl acrylate, cyclohexyl acrylate, 2-ethoxyethyl acrylate, ethyl acrylate, 2-ethylhexyl acrylate, heptyl acrylate, hexyl acrylate, isobornyl acrylate, isopropyl acrylate, methyl acrylate, 3,5-dimethyl adamantyl acrylate, 2-naphthyl acrylate, neopentyl acrylate, octyl acrylate, phenethyl acrylate, phenyl acrylate, propyl acrylate, tolyl acrylate, amyl acrylate, tetrahydrofurfuryl acrylate, 2-hydroxyethyl acrylate, 3-hydroxypropyl acrylate, 2-hydroxypropyl acrylate, 4-hydroxybutyl acrylate, 5-hydroxypentyl acrylate, allyl acrylate, 2-allyloxyethyl acrylate, propargyl acrylate and the like), methacrylic esters such as alkyl methacrylate (the alkyl group preferably has 1 to 20 carbon atoms) (for example, benzyl methacrylate, 4-biphenyl methacrylate, butyl methacrylate, sec-butyl methacrylate, t-butyl methacrylate, 4-t-butylphenyl methacrylate, 4-chlorophenyl methacrylate, pentachlorophenyl methacrylate, 4-cyanophenyl methacrylate, cyanomethyl methacrylate, cyclohexyl methacrylate, 2-ethoxy ethyl methacrylate, ethyl methacrylate, 2-ethylhexyl methacrylate, heptyl methacrylate, hexyl methacrylate, isobornyl methacrylate, isopropyl methacrylate, methyl methacrylate, 3,5-dimethyl adamantyl methacrylate, 2-naphthyl methacrylate, neopentyl methacrylate, octyl methacrylate, phenethyl methacrylate, phenyl methacrylate, propyl methacrylate, tolyl methacrylate, amyl methacrylate, tetrahydrofurfuryl methacrylate, 2-hydroxyethyl methacrylate, 3-hydroxypropyl methacrylate, 2-hydroxypropyl methacrylate, 4-hydroxybutyl methacrylate, 5-hydroxypentyl methacrylate, allyl methacrylate, 2-allyloxyethyl methacrylate, propargyl methacrylate, 2-diethylaminoethyl methacrylate, 2-dimethylamino ethyl methacrylate and the like), styrenes such as styrene, alkyl styrene and the like (for example, methyl styrene, dimethyl styrene, trimethyl styrene, ethyl styrene, diethyl styrene, isopropyl styrene, butyl styrene, hexyl styrene, cyclohexyl styrene, decyl styrene, benzyl styrene, chloromethyl styrene, trifluoromethyl styrene, ethoxymethyl styrene, acetoxymethyl styrene and the like), alkoxy styrene (for example, methoxy styrene, 4-methoxy-3-methyl styrene, dimethoxy styrene and the like), halogen styrene (for example, chlorostyrene, dichlorostyrene, trichlorostyrene, tetrachlorostyrene, pentachlorostyrene, bromostyrene, dibromostyrene, iodostyrene, fluorostyrene, trifluorostyrene, 2-bromo-4-trifluoromethylstyrene, 4-fluoro-3-trifluoromethylstyrene and the like) and acrylonitrile, methacrylonitrile.

Of these radical polymerizable compounds, methacrylic esters, acrylamides, methacrylamides and styrenes are suitably used, and examples of particularly suitably used compounds include benzyl methacrylate, t-butyl methacrylate, 4-t-buthyphenyl methacrylate, pentachlorophenyl methacrylate, 4-cyanophenyl methacrylate, cyclohexyl methacrylate, ethyl methacrylate, 2-ethylhexyl methacrylate, isobornyl methacrylate, isopropyl methacrylate, methyl methacrylate, 3,5-dimethyladamantyl methacrylate, 2-naphthyl methacrylate, neopentyl methacrylate, phenylmethacrylate, tetrahydrofurfuryl methacrylate, 2-hydroxyethyl methacrylate, 3-hydroxypropyl methacrylate, 2-hydroxypropyl methacrylate, allyl methacrylate, acrylamide, N-methyl acrylamide, N-isopropyl acrylamide, morpholyl acrylamide, piperidyl acrylamide, N-t-butyl acrylamide, N-cyclohexyl acrylamide, N-phenyl acrylamide, N-naphthyl acrylamide, N-hydroxymethyl acrylamide, N-hydroxyethyl acrylamide, N-allylacrylamide, 4-hydroxyphenyl acrylamide, 2-hydroxyphenyl acryl amide, N,N-dimethyl acrylamide, N,N-diisopropyl acrylamide, N,N-di-t-butyl acrylamide, N,N-dicyclohexyl acrylamide, N,N-phenyl acrylamide, N,N-dihydroxyethyl acrylamide, N,N-diallyl acrylamide, methacrylamide, N-methyl methacrylamide, N-isopropyl methacrylamide, morpholyl methacrylamide, piperidyl methacrylamide, N-t-butyl methacrylamide, N-cyclohexyl methacrylamide, N-phenyl methacrylamide, N-naphthyl methacrylamide, N-hydroxymethyl methacrylamide, N-hydroxyethyl methacrylamide, N-allyl methacrylamide, 4-hydroxyphenyl methacrylamide, 2-hydroxyphenyl methacrylamide, N,N-dimethyl methacrylamide, N,N-diisopropyl methacrylamide, N,N-di-t-butyl methacrylamide, N,N-dicyclohexyl methacrylamide, N,N-phenyl methacrylamide, N,N-dihydroxyethyl methacrylamide, N,N-diallyl methacrylamide, styrene, methyl styrene, dimethyl styrene, trimethyl styrene, isopropyl styrene, butyl styrene, cyclohexyl styrene, chloromethyl styrene, trifluoromethyl styrene, ethoxymethyl styrene, acetoxymethyl styrene, methoxy styrene, 4-methoxy-3-methyl styrene, chlorostyrene, dichlorostyrene, trichlorostyrene, tetrachlorostyrene, pentachlorostyrene, bromostyrene, dibromostyrene, iodostyrene, fluorostyrene, trifluorostyrene, 2-bromo-4-trifluoromethyl styrene, and 4-fluoro-3-trifluoromethyl styrene.

The radical polymerizable compounds may be used either alone or in combination of two or more thereof. The dispersion resin may or may not contain the above-described radical polymerizable compounds, but when the resin contains the compound, the content of a structural unit corresponding to the radical polymerizable compounds is from 0.1% by mass to 50% by mass and particularly preferably from 0.1% by mass to 30% by mass, based on the total mass of the dispersion resin.

The dispersion resin in the present invention may be synthesized by a method known in the related art. Examples of solvents used in the synthesis include ethylene dichloride, cyclohexanone, methyl ethyl ketone, acetone, methanol, ethanol, propanol, butanol, ethylene glycol monomethyl ether, ethylene glycol monoethyl ether, 2-methoxyethyl acetate, 1-methoxy-2-propanol, 1-methoxy-2-propyl acetate, N,N-dimethyl formamide, N,N-dimethyl acetamide, dimethyl sulfoxide, toluene, ethyl acetate, methyl lactate, ethyl lactate and the like. These solvents may be used alone or in mixture of two or more thereof.

Specifically preferred examples of the dispersion resin in the present invention include the following Exemplary Compounds 1 to 7, but the present invention is not limited thereto. Among the following Exemplary Compounds, the numerical value written in each of the structural units (numerical value written in the repeating units of the main chain) represents a content of the structural unit [in % by mass (wt %)]. The numerical value added in the repeating moiety of the side chains represents a repeat number of the repeating moiety.

(Exemplary Compound 1)

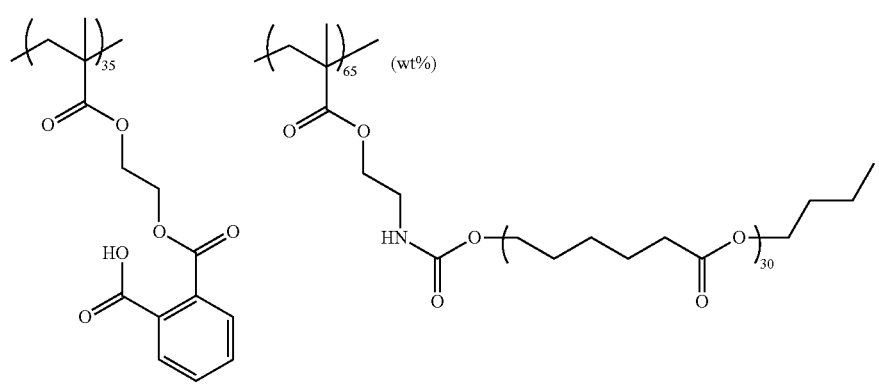

Acid number
71 mgKOH/g

-continued
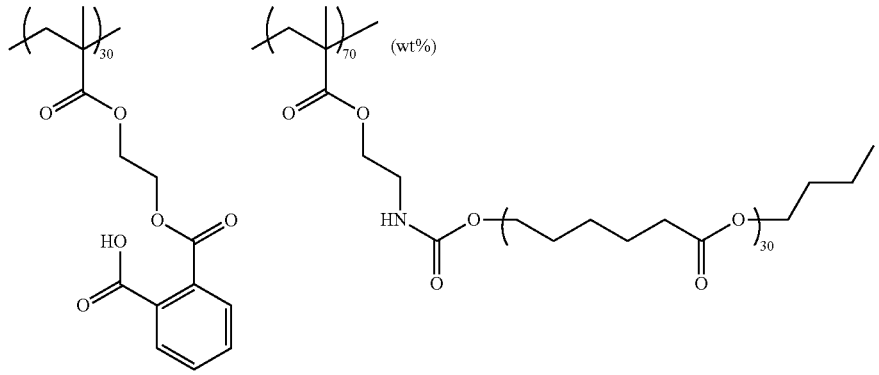
(Exemplary Compound 2)
Acid number
60 mgKOH/g
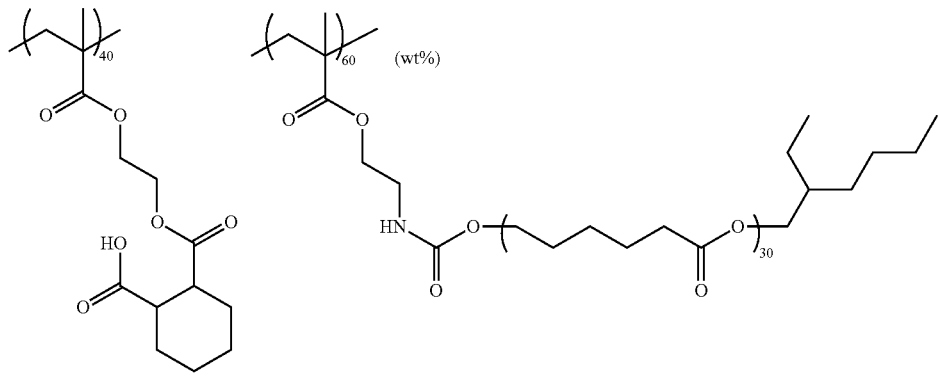
(Exemplary Compound 3)
Acid number
79 mgKOH/g
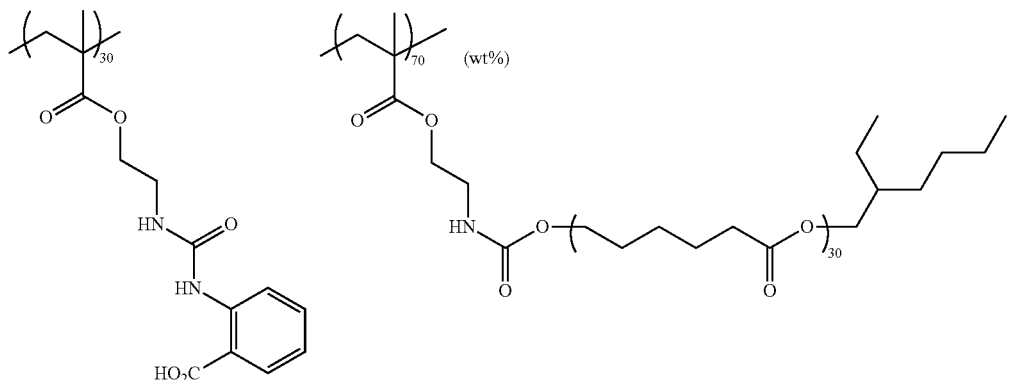
(Exemplary Compound 4)
Acid number
58 mgKOH/g -continued (Exemplary Compound 5)

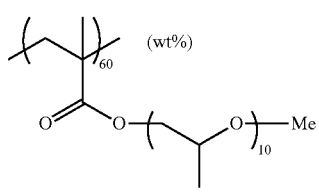

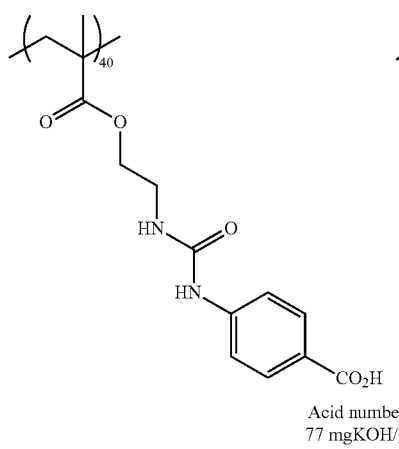

Acid number
77 mgKOH/g (Exemplary Compound 6)

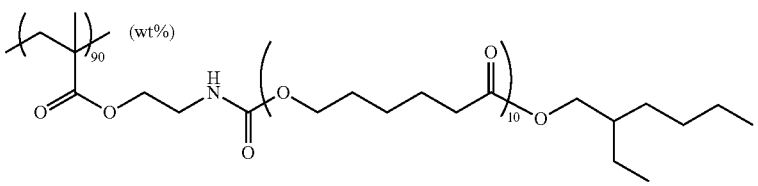

Acid number
10 mgKOH/g (Exemplary Compound 7)

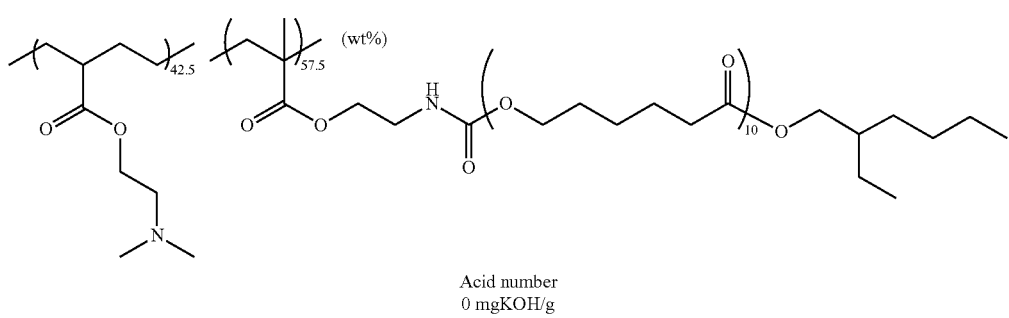

Acid number
0 mgKOH/g

Further, it is also preferred that the dispersion resin is a form of a resin (B1) having a repeating unit which has a group X having a functional group with pKa of 14 or less and an oligomer chain or polymer chain Y having the number of atoms of from 40 to 10,000 in the side chain thereof and also containing a basic nitrogen atom. However, the solid acid number of the resin (B1) is 80 mg KOH/g or less. Due to using the resin (B1) as a dispersion resin, resistance of a first colored pattern, which is formed by dry etching the first colored layer to be described below, to a solvent and a developer can be more improved.

Herein, the basic nitrogen atom is not particularly limited as long as the basic nitrogen atom is a nitrogen atom showing basicity, but the resin (B1) preferably contains a structure having a nitrogen atom with a pKb of 14 or less and more preferably contains a structure having a nitrogen atom with a pKb of 10 or less.

The basic strength pKb in the present invention refers to a pKb at a water temperature of 25° C., is one of the indices to quantitatively represent the intensity of a base, and is the same as the basicity constant. The basic strength pKb and an acid strength pKa to be described below have a relationship of pKb=14−pKa.

The group X having a functional group with a pKa of 14 or less is the same as the group X as described below with respect to the resin (B).

The oligomer chain or polymer chain Y having the number of atoms of 40 to 10,000, which the resin (B1) has in the side chain thereof is also the same as the oligomer chain or polymer chain Y having the number of atoms of 40 to 10,000 to be described below on the resin (B).

Examples of the resin (B1) include a resin containing a repeating unit which has a group X having a functional group with a pKa of 14 or less represented by the following formula, a repeating unit having the basic nitrogen atom represented by the following formula and a repeating unit (corresponding in sequence from the left side of a structure of the following repeating unit) which has an oligomer chain or polymer chain Y having the number of atoms of 40 to 10,000, represented by the following formula and the like.

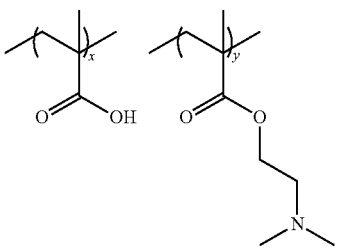

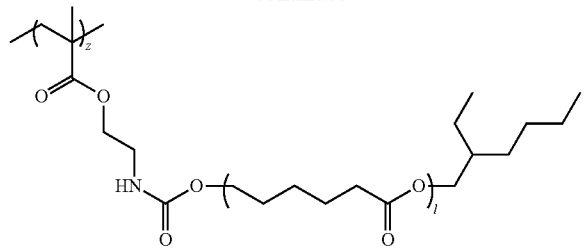

In the formula, each of x, y, and z represents a polymerization molar ratio of the repeating unit, and it is preferred that x is 5 to 50, y is 5 to 60, and z is 10 to 90. l represents a linking number of a polyester chain, is an integer that may form an oligomer chain or polymer chain having the number of atoms of 40 to 10,000, and is preferably 70 to 2,000.

The resin (B1) is preferably a resin (B2) having a repeating unit which contains a nitrogen atom bonded to the group X having a functional group with a pKa of 14 or less and an oligomer chain or polymer chain Y which has the number of atoms of 40 to 10,000 in the side chain thereof.

The resin (B1) is particularly preferably a resin (B) (hereinafter, suitably referred to as "specific resin") having (i) at least one repeating unit containing a nitrogen atom, selected from the group consisting of a poly(lower alkyleneimine)-based repeating unit, a polyallylamine-based repeating unit, a polydiallylamine-based repeating unit, a metaxylenediamine-epichlorohydrin polycondensate-based repeating unit and a polyvinylamine-based repeating, the repeating unit having a group X that has a functional group with a pK$_a$ of 14 or less, the group X being bonded to the nitrogen atom, and (ii) an oligomer chain or polymer chain Y having the number of atoms of 40 to 10,000 in the side chain thereof.

((i) at least one repeating unit containing a nitrogen atom, selected from the group consisting of a poly(lower alkyleneimine)-based repeating unit, a polyallylamine-based repeating unit, a polydiallylamine-based repeating unit, a methylenediamine-epichlorohydrin polycondensate-based repeating unit and a polyvinylamine-based repeating unit)

The specific resin has (i) at least one repeating unit containing a nitrogen atom, selected from the group consisting of a poly(lower alkyleneimine)-based repeating unit, a polyallylamine-based repeating unit, a polydiallylamine-based repeating unit, a metaxylenediamine-epichlorohydrin polycondensate-based repeating unit and a polyvinylamine-based repeating unit. Accordingly, the adsorptivity on the surface of the colorant is improved and interaction between colorant molecules may also be reduced.

The poly(lower alkyleneime) may be in a chain-shape or a mesh form.

The number average molecular weight of a main chain obtained by polymerizing (i) at least one repeating unit containing a nitrogen atom, selected from the group consisting of a poly(lower alkyleneimine)-based repeating unit, a polyallylamine-based repeating unit, a polydiallylamine-based repeating unit, a metaxylenediamine-epichlorohydrin polycondensate-based repeating unit and a polyvinylamine-based repeating unit, that is, the number average molecular weight of a moiety except the oligomer chain or polymer chain Y moiety of the side chain from the resin (B) is preferably 100 to 10,000, more preferably 200 to 5,000, and most preferably 300 to 2,000. The number average molecular weight of the main chain moiety may be determined from a proportion of the hydrogen atom integral value of the terminal group and of the main chain moiety measured by nuclear magnetic resonance spectroscopy or may be determined by the measurement of the molecular weight of the oligomer or polymer containing an amino group as a starting material.

The repeating unit (i) containing a nitrogen atom is particularly preferably a poly(lower alkyleneimine)-based repeating unit or a polyallylamine-based repeating unit. Meanwhile, in the present invention, the expression "lower" used in the poly(lower alkyleneimine) indicates that the number of carbon atoms is 1 to 5, and the lower-alkyleneimine represents an alkyleneimine having 1 to 5 carbon atoms. If this structure is specified, it is preferred that the specific resin includes a structure having a repeating unit represented by Formula (I-1) and a repeating unit represented by Formula (I-2) or a structure having a repeating unit represented by Formula (II-1) and a repeating unit represented by Formula (II-2).

(Repeating unit represented by Formula (I-1) and repeating unit represented by Formula (I-2))

A repeating unit represented by Formula (I-1) and a repeating unit represented by Formula (I-2) as preferred constituting components of the specific resin of the present invention will be described in detail.

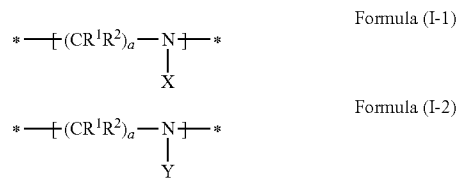

In Formula (I-1) and Formula (I-2), each of $R^1$ and $R^2$ independently represents a hydrogen atom, a halogen atom or an alkyl group. Each of a's independently represents an integer of 1 to 5. * represents a linking portion between the repeating units.

X represents a group having a functional group with a pKa of 14 or less.

Y represents an oligomer chain or polymer chain having the number of atoms of 40 to 10,000.

It is preferred that the specific resin has a repeating unit represented by Formula (I-3) in addition to a repeating unit represented by Formula (I-1) or Formula (I-2), as a copolymerization component. By using these repeating units in combination, the dispersion performance is further improved when the resin is used as a dispersant of the colorant.

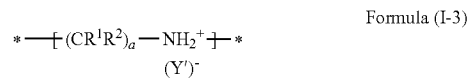

In Formula (I-3), *, R', $R^2$ and a are the same as those of Formula (I-1).

Y' represents an oligomer chain or polymer chain having an anion group, which has the number of atoms of 40 to 10,000.

It is possible to form the repeating unit represented by Formula (I-3) by performing a reaction by adding an oligomer or polymer having a group, which reacts with an amine to form a salt, to a resin having a primary or secondary amino group in the main chain moiety thereof.

In Formula (I-1), Formula (I-2) and Formula (I-3), $R^1$ and $R^2$ are particularly preferably a hydrogen atom. a is preferably 2 from the viewpoint of availability of starting materials.

The specific resin may include a lower alkyleneimine as a repeating unit, in addition to the repeating units represented by Formula (I-1), Formula (I-2) and Formula (I-3). As described above, the lower alkyleneimine represents an alkyleneimine having 1 to 5 carbon atoms. The specific resin may or may not contain such a lower alkyleneimine repeating unit, but when the specific resin contains a lower alkyleneimine repeating unit, the lower alkyleneimine repeating unit is contained in an amount of preferably 1% by mole to 70% by mole, and most preferably 3% by mole to 50% by mole, based on the entire repeating unit included in the specific resin. Meanwhile, to the nitrogen atom in such a lower alkyleneimine repeating unit, the group represented by X, Y, or Y' may also be bonded. A resin which includes both the repeating unit having a group represented by X bonded thereto and the repeating unit having Y bonded thereto in the main chain structure is also included in the specific resin.

The repeating unit represented by Formula (I-1) is a repeating unit containing a nitrogen atom to which a group X having a functional group with a pKa of 14 or less is bonded, and the repeating unit containing a nitrogen atom is contained in an amount of preferably 1% by mole to 80% by mole, and most preferably 3% by mole to 50% by mole, based on the entire repeating units included in the specific resin, from the viewpoint of storage stability.

The repeating unit represented by Formula (I-2) is a repeating unit which has an oligomer chain or polymer chain having the number of atoms of 40 to 10,000, and the repeating unit is contained in an amount of preferably 10% by mole to 90% by mole, and most preferably 30% by mole to 70% by mole, based on the entire repeating units of the specific resin, from the viewpoint of storage stability.

Upon reviewing both the content ratios, the molar ratio of the repeating units (I-1):(I-2) is preferably 10:1 to 1:100, and more preferably 1:1 to 1:99, from the viewpoint of dispersion stability and balance of hydrophilicity/hydrophobicity.

Meanwhile, the repeating unit represented by Formula (I-3), which is used in combination, as desired, is a repeating unit in which a partial structure including an oligomer chain or polymer chain having the number of atoms of 40 to 10,000 is ionically bonded to a nitrogen atom of the main chain, and is contained in an amount of preferably 0.5% by mole to 20% by mole and most preferably 1% by mole to 10% by mole, based on the entire repeating units of the specific resin, from the viewpoint of the effect.

Meanwhile, the ionic bond of the polymer chain Y may be confirmed by infrared spectroscopy, or base titration.

(Repeating unit represented by Formula (II-1) and repeating unit represented by Formula (II-2))

A repeating unit represented by Formula (II-1) and a repeating unit represented by Formula (II-2) as other preferred constituting components of the specific resin will be described in detail.

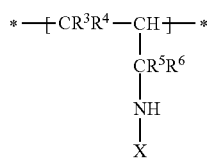

Formula (II-1)

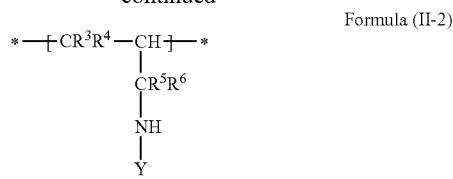

Formula (II-2)

In Formula (II-1) and Formula (II-2), each of $R^3$, $R^4$, $R^5$ and $R^6$ independently represents a hydrogen atom, a halogen atom and an alkyl group. *, X, and Y are the same as *, X, and Y in Formula (I-1) and Formula (I-2).

It is preferred that the specific resin includes a repeating unit represented by Formula (II-3) in addition to the repeating unit represented by Formula (II-1) and the repeating unit represented by Formula (II-2), as a copolymerization component. By using these repeating units in combination, the dispersion performance is further improved when the resin is used as a dispersant of the colorant.

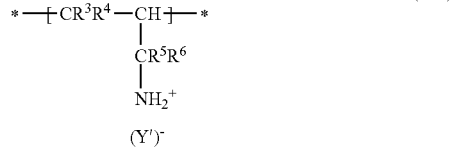

Formula (II-3)

In Formula (II-3), *, $R^3$, $R^4$, $R^5$ and $R^6$ are the same as those of Formula (II-1). Y' are the same as Y' in Formula (I-3).

In Formula (II-1), Formula (II-2) and Formula (II-3), $R^3$, $R^4$, $R^5$ and $R^6$ are preferably a hydrogen atom from the viewpoint of availability of starting materials.

Formula (II-1) is a repeating unit containing a nitrogen atom to which a group X having a functional group with a pKa of 14 or less is bonded, and the repeating unit containing a nitrogen atom is contained in an amount of preferably 1% by mole to 80% by mole, and most preferably 3% by mole to 50% by mole, based on all of the repeating units included in the specific resin, from the viewpoint of storage stability.

Formula (II-2) is a repeating unit which has an oligomer chain or polymer chain Y having the number of atoms of 40 to 10,000, and the repeating unit is contained in an amount of preferably 10% by mole to 90% by mole and most preferably 30% by mole to 70% by mole, based on all of the repeating units of the specific resin, from the viewpoint of storage stability.

Upon reviewing both the content ratios, the molar ratio of the repeating units (II-1):(II-2) is preferably 10:1 to 1:100, and more preferably 1:1 to 1:10, from the viewpoint of dispersion stability and balance of hydrophilicity/hydrophobicity.

The repeating unit represented by Formula (II-3), which is used in combination, as desired, is contained in an amount of preferably 0.5% by mole to 20% by mole, and most preferably 1% by mole to 10% by mole, based on all of the repeating units of the resin of the present invention.

In the specific resin, it is most preferred to include particularly both a repeating unit represented by Formula (I-1) and a repeating unit represented by Formula (I-2) from the view point of dispersibility.

<Group X Having Functional Group with pKa of 14 or Less>

X has a functional group with a pKa of 14 or less at a water temperature of 25° C. The "pKa" as mentioned herein is the definition as described in Chemical Handbook (II) ($4^{th}$ Revised Edition, 1993, edited by The Chemical Society of Japan, Maruzen Co., Ltd.).

The "functional group with a pKa of 14 or less" is not particularly limited in structure and the like as long as the physical properties thereof satisfy this condition, and examples thereof include known functional groups with a pKa satisfying the above-described range, but a functional group having a pKa of 12 or less is particularly preferred and a group having a pKa of 11 or less is most preferred. Specific examples thereof include carboxylic acid (pKa of approximately 3 to 5), sulfonic acid (pKa of approximately −3 to −2), —COCH$_2$CO— (pKa of approximately 8 to 10), —COCH$_2$CN (pKa of approximately 8 to 11), —CONHCO—, a phenolic hydroxyl group, —R$_F$CH$_2$OH or —(R$_F$)$_2$CHOH(R$_F$ represents a perfluoroalkyl group. pKa of approximately 9 to 11), a sulfonamide group (pKa of approximately 9 to 11) and the like, and carboxylic acid (pKa of approximately 3 to 5), sulfonic acid (pKa of approximately −3 to −2), and —COCH$_2$CO— (pKa of approximately 8 to 10) are particularly preferred.

The pKa of a functional group in the group X is 14 or less, and thus, interaction between the group and the colorant may be achieved.

It is preferred that the group X having a functional group with a pKa of 14 or less is directly bonded to a nitrogen atom in the repeating unit containing the nitrogen atom, but the nitrogen atom of the repeating unit containing the nitrogen atom and the group X may be linked through covalent bonding as well as through ionic bonding to form a salt.

It is particularly preferred that the group X containing a functional group with a pKa of 14 or less in the present invention has a structure represented by Formula (V-1), Formula (V-2), or Formula (V-3).

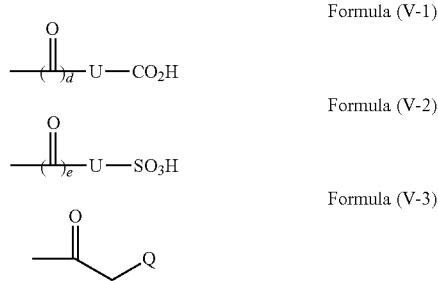

Formula (V-1)

Formula (V-2)

Formula (V-3)

In Formula (V-1) and Formula (V-2), U represents a single bond or a divalent linking group.

Each of d and e independently represents 0 or 1.

In Formula (V-3), Q represents an acyl group or an alkoxycarbonyl group.

Examples of the divalent linking group represented by U include alkylene (more specifically, for example, —CH$_2$—, —CH$_2$CH$_2$—, —CH$_2$CHMe-, —(CH$_2$)$_5$—, —CH$_2$CH(n-C$_{10}$H$_{21}$)— and the like), an oxygen-containing alkylene (more specifically, for example, —CH$_2$OCH$_2$—, —CH$_2$CH$_2$OCH$_2$CH$_2$— and the like), an arylene group (for example, phenylene, tolylene, biphenylene, naphthylene, furanylene, pyrrolylene and the like), alkyleneoxy (for example, ethyleneoxy, propyleneoxy, phenyleneoxy and the like), an alkenylene group (for example, a vinylene group) and the like. Among them, an alkylene group having 1 to 30 carbon atoms, or an arylene group having 6 to 20 carbon atoms is particularly preferred, and alkylene having 1 to 20 carbon atoms, alkenylene having 2 to 20 carbon atoms or arylene having 6 to 15 carbon atoms is most preferred. Further, from the viewpoint of productivity, d is preferably 1, and e is preferably 0.

Q represents an acyl group or an alkoxycarbonyl group. As the acyl group in Q, an acyl group having 1 to 30 carbon atoms (for example, formyl, acetyl, n-propanoyl, benzoyl and the like) is preferred, and acetyl is particularly preferred. As the alkoxycarbonyl group in Q, an alkoxycarbonyl group having 2 to 30 carbon atoms (for example, a methoxycarbonyl group, an ethoxycarbonyl group, n-propoxycarbonyl group and the like) is preferred. As Q, an acyl group is particularly preferred, and an acetyl group is preferred from the viewpoint of ease in preparation and availability of starting materials (precursor X' of X).

The group X in the present invention is preferably bonded to a nitrogen atom of the repeating unit that contains the nitrogen atom. By such a state, the dispersibility and dispersion stability of the colorant is drastically improved. The reason is not clear, but it is thought as follows. That is, it is thought that the nitrogen atom of the repeating unit containing the nitrogen atom exists as a structure of an amino group, an ammonium group or an amide group, and the groups have interaction, such as hydrogen bonding and ionic bonding, with an acidic portion on the colorant surface, to be adsorbed to each other. In addition, the X in the present invention functions as an acid group, and thus, may show stronger interaction when the colorant shows basicity. That is, it is thought that the specific resin may adsorb both the basic portion and the acidic portion of the colorant with the nitrogen atom and the group X, such that the adsorption capacity is increased, thereby drastically improving the dispersibility and storage stability.

Furthermore, it is thought that the X in the present invention imparts the solvent solubility to suppress resins from being precipitated over time, thereby contributing to dispersion stability.

The content of the functional group with a pKa of 14 or less in X is not particularly limited, but is preferably 0.01 mmol to 5 mmol, and most preferably 0.05 mmol to 1 mmol, based on 1 g of the specific resin. Within this range, the dispersiblity and dispersion stability of the colorant are improved.

(Oligomer Chain or Polymer Chain Y Having Number of Atoms of 40 to 10,000)

Examples of Y include known polymer chains such as polyester, polyamide, polyimide and poly(meth)acrylic acid ester, which may be linked to the main chain moiety of the specific resin. The binding site of Y to the specific resin is preferably a terminal end of the oligomer chain or polymer chain Y.

Y is preferably bonded to a nitrogen atom of at least one repeating unit containing the nitrogen atom, selected from a poly(lower alkyleneimine)-based repeating unit, a polyallylamine-based repeating unit, a polydiallylamine-based repeating unit, a methxylenediamine-epichlorohydrin polycondensate-based repeating unit and a polyvinylamine-based repeating unit. The bonding mode between Y and the main chain moiety such as at least one repeating unit containing a nitrogen atom, selected from a poly(lower alkyleneimine)-based repeating unit, a polyallylamine-based repeating unit, a polydiallylamine-based repeating unit, a metaxylenediamine-epichlorohydrin polycondensate-based repeating unit and a polyvinylamine-based repeating unit is covalent bonding, ionic bonding, or a combination of covalent bonding and ionic bonding. The ratio of the bonding modes of Y and the main chain moiety is in a range of covalent bonding:ionic bonding=100:0 to 0:100, but is preferably 95:5 to 5:95 and most preferably 90:10 to 10:90. When the ratio is out of the range, the dispersibility and dispersion stability are deteriorated and the solvent solubility is also decreased.

To the nitrogen atom of the repeating unit that contains the nitrogen atom, Y is preferably amide-bonded, or ionically bonded as carboxylate.

The number of atoms of the oligomer chain or polymer chain Y is preferably 50 to 5,000, and more preferably 60 to 3,000, from the viewpoint of dispersibility and dispersion stability.

When the number of atoms per the oligomer chain or polymer chain Y is less than 40, the graft chain is short, and thus the steric repulsive effect is decreased, resulting in reducing the dispersibility. Meanwhile, when the number of atoms per the oligomer chain or polymer chain Y exceeds 10,000, the oligomer chain or polymer chain Y is too long, and thus adsorptivity to the colorant is decreased, resulting in reducing the dispersibility.

Further, the number average molecular weight of Y may be measured by a polystyrene converted value by a GPC method. The number average molecular weight of Y is particularly preferably 1,000 to 50,000, and most preferably 1,000 to 30,000 from the viewpoint of dispersibility and dispersion stability.

Preferably two or more, and most preferably five or more of the side chain structures represented by Y are bonded to the main chain linkage in one molecule of the resin.

In particular, Y preferably has a structure represented by Formula (III-1).

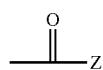

Formula (III-1)

In Formula (III-1), Z is a polymer or oligomer having a polyester chain as a partial structure, and represents a residue except the carboxyl group from a polyester having a free carboxyl acid represented by the following Formula (IV).

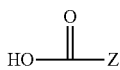

Formula (IV)

In Formula (IV), Z is the same as Z in Formula (III-1).

When the specific resin contains a repeating unit represented by Formula (I-3) or Formula (II-3), Y' is preferably Formula (III-2).

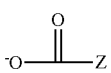

Formula (III-2)

In Formula (III-2), Z is the same as Z in Formula (III-1).

A polyester having a carboxyl group at one end (polyester represented by Formula (IV)) may be obtained by polycondensation (IV-1) of carboxylic acid and lactone, polycondensation (IV-2) of a hydroxy group-containing carboxylic acid, polycondensation (IV-3) of a dihydric alcohol and a divalent carboxylic acid (or a cyclic acid anhydride) and the like.

The carboxylic acid used in the polycondensation reaction (IV-1) of carboxylic acid and lactone may be an aliphatic carboxylic acid (preferably straight chained or branched carboxylic acid having 1 to 30 carbon atoms, for example, formic acid, acetic acid, propionic acid, butyric acid, valeric acid, n-hexanoic acid, n-octanoic acid, n-decanoic acid, n-dodecanoic acid, palmitic acid, 2-ethylhexanoic acid, cyclohexanoic acid and the like), a hydroxy group-containing carboxylic acid (preferably a straight chained or branched hydroxy group-containing carboxylic acid having 1 to 30 carbon atoms, for example, glycolic acid, lactic acid, 3-hydroxypropionic acid, 4-hydroxydodecanoic acid, 5-hydroxydodecanoic acid, ricinoleic acid, 12-hydroxydodecanoic acid, 12-hydroxystearic acid and 2,2-bis(hydroxymethyl)butyric acid and the like), but particularly preferably a straight chained aliphatic carboxylic acid having 6 to 20 carbon atoms or a hydroxy group-containing carboxylic acid having 1 to 20 carbon atoms. These carboxylic acids may be used in a mixture thereof. As the lactone, a known lactone may be used, and examples thereof include β-propiolactone, β-butyrolactone, γ-butyrolactone, γ-hexanolactone, γ-octanolactone, δ-valerolactone, δ-hexanolactone, δ-octanolactone, ε-caprolactone, δ-dodecanolactone, α-methyl-γ-butyrolactone and the like, and ε-caprolactone is particularly preferred from the viewpoint of reactivity and availability.

These lactones may be used in a mixture of plural kinds thereof.

The feed molar ratio of the carboxylic acid and the lactone at the time of the reaction depends on the molecular weight of a target polyester chain, and thus may not be exclusively determined, but is preferably carboxylic acid:lactone=1:1 to 1:1,000, and most preferably 1:3 to 1:500.

The hydroxy group-containing carboxylic acid in the polycondensation (IV-2) of the hydroxy group-containing carboxylic acid is the same as the hydroxy group-containing carboxylic acid in (IV-1), and the preferred ranges thereof are also the same.

The dihydric alcohol in the polycondensation reaction (IV-3) of the dihydric alcohol and divalent carboxylic acid (or cyclic acid anhydride) may be a straight chained or branched aliphatic diol (preferably a diol having 2 to 30 carbon atoms, for example, ethylene glycol, diethylene glycol, triethylene glycol, dipropylene glycol, 1,2-propanediol, 1,3-propanediol, 1,5-pentanediol, 1,6-hexanediol, 1,8-octanediol and the like), and particularly preferably an aliphatic diol having 2 to 20 carbon atoms.

Examples of the divalent carboxylic acid include a straight chained or branched divalent aliphatic carboxylic acid (preferably a divalent aliphatic carboxylic acid having 1 to 30 carbon atoms, for example, succinic acid, maleic acid, adipic acid, sebacic acid, dodecanoic diacid, glutaric acid, suberic acid, tartaric acid, oxalic acid, malonic acid and the like), and a divalent carboxylic acid having 3 to 20 carbon atoms is particularly preferred. Further, acid anhydride (for example, succinic anhydride, glutaric anhydride and the like), which are equivalent to these divalent carboxylic acids, may also be used.

The divalent carboxylic acid and the dihydric alcohol are preferably fed at a molar ratio of 1:1. Accordingly, it is possible to introduce carboxylic acid into a terminal end.

The polycondensation at the time of preparation of polyester is preferably carried out with the addition of a catalyst.

The catalyst is preferably a catalyst which functions as a Lewis acid, and examples thereof include a Ti compound (for example, Ti(OBu)$_4$, Ti(O—Pr)$_4$ and the like), an Sn compound (for example, tin octylate, dibutyltin oxide, dibutyltin laurate, monobutyltin hydroxybutyl oxide, stannic chloride and the like), protonic acid (for example, sulfuric acid, paratoluenesulfonic acid and the like) and the like. The amount of the catalyst is preferably 0.01% by mole to 10% by mole, and most preferably 0.1% by mole to 5% by mole, based on the number of moles of all of the monomers. The reaction temperature is preferably 80° C. to 250° C., and most preferably 100° C. to 180° C. The reaction time varies depending on the reaction condition, but is usually 1 hour to 24 hours.

The number average molecular weight of the polyester may be measured by a polystyrene converted value by a GPC method. The number average molecular weight of the polyester is 1,000 to 1,000,000, preferably 2,000 to 100,000, and most preferably 3,000 to 50,000. When the molecular weight is within the range, the dispersiblity is more improved.

The polyester partial structure forming a polymer chain in Y is preferably polyester, obtained by particularly the polycondensation (IV-1) of carboxylic acid and lactone, and the polycondensation (IV-2) of a hydroxy group-containing carboxylic acid, from the viewpoint of ease in preparation.

The specific embodiments [(A-1) to (A-61)] of the specific resin are shown below by the specific structures of the repeating units which the resin has and the combinations thereof, but the present invention is not limited thereto. In the following formulas, each of k, l, m, and n represents a polymerization molar ratio of the repeating unit, k is 1 to 80, l is 10 to 90, m is 0 to 80, n is 0 to 70, and also k+l+m+n=100. p and q represent a linking number of a polyester chain, and each of p and q independently represents 5 to 100,000. R represents a hydrogen atom or an alkylcarbonyl group.

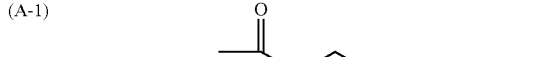
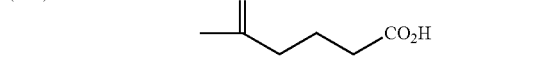

(A-1) 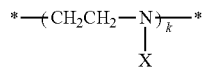

(A-2) 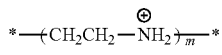

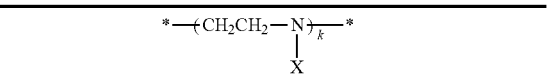
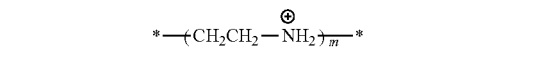
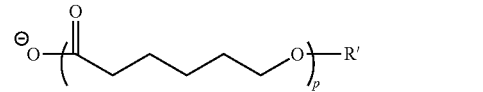
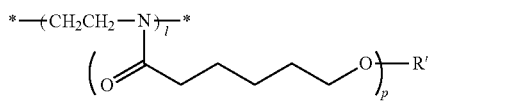
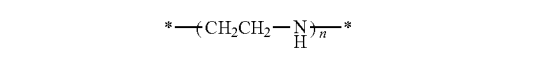

X (A-3) 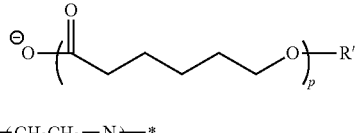

(A-4) 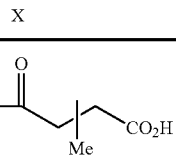

(A-5) 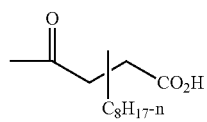

(A-6) 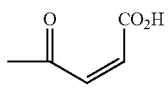

(A-7) 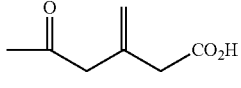

(A-8) 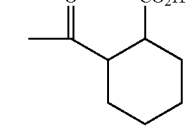

(A-9) 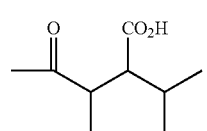

(A-10) 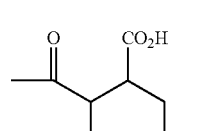

-continued
| 33 | 34 |
|---|---|
| 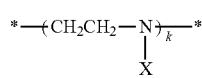 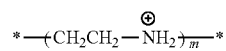 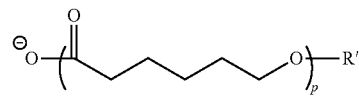 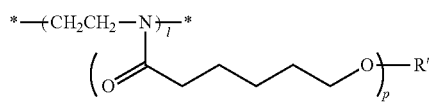 | *―(CH₂CH₂―N)ₖ―* \| X  *―(CH₂CH₂―NH₂⁺)ₘ―*  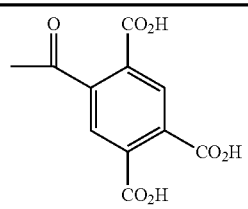  *―(CH₂CH₂―N)ₗ―* \| (O=)C―(CH₂)₄―O)ₚR'  *―(CH₂CH₂―N)ₙ―* \| H |
| X | | X | |
|---|---|---|---|
| (A-11) | 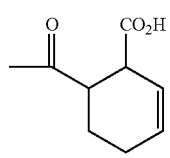 | (A-16) | 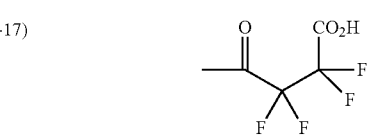 |
| (A-12) | 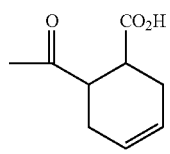 | (A-17) | 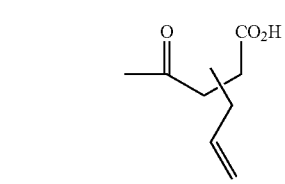 |
| (A-13) | 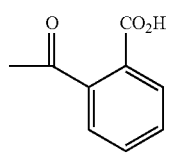 | (A-18) | 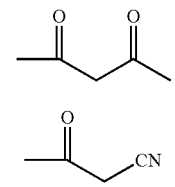 |
| | | (A-19) | |
| (A-14) | 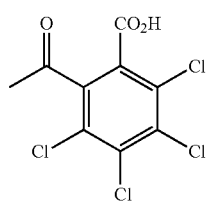 [SMILES: CC(=O)c1c(Cl)c(Cl)c(Cl)c(Cl)c1C(=O)O] | (A-20) | |
| | | (A-21) | 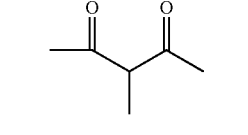 |
| | | (A-22) | |
| | | (A-23) | |
| (A-15) | 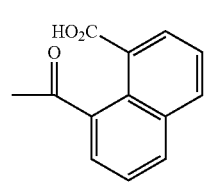 [SMILES: CC(=O)c1cccc2cccc(C(=O)O)c12] | (A-24) | 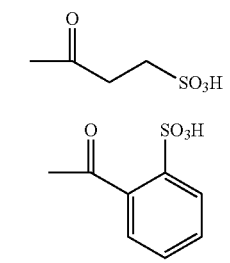 |

35

-continued

*—(CH₂CH₂—N)ₖ—*
          |
          X

*—(CH₂CH₂—⁺NH₂)ₘ—*

$^{\ominus}O-C(=O)-(CH_2)_4-CH_2-O-[\phantom{x}]_p-R'$

*—(CH₂CH₂—N)ₗ—*
          |
  (C(=O)—(CH₂)₄—CH₂—O)ₚ—R'

*—(CH₂CH₂—N)ₙ—*
          H

X (A-25)   —CH₂CO₂H (A-26)   —CH₂CH₂CO₂H (A-27)   CH₃—C(=O)—CH₂—C(=O)—OMe (A-28)   CH₃—C(=O)—CH₂—C(=O)—CF₃

---

*—(CH₂CH₂—N)ₖ—*
          |
          C(=O)
          |
          CH₂CH₂
          |
          CO₂H

*—(CH₂CH₂—N)ₗ—*
          |
          Y

*—(CH₂CH₂—⁺NH₂)ₘ—*
          |
          ⁻O—Y

*—(CH₂CH₂—N)ₙ—*
          H

Y (A-29)   —[C(=O)—(CH₂)₅—O]ₚ—C(=O)—C₇H₁₅-n

36

-continued

*—(CH₂CH₂—N)ₖ—*
          |
          C(=O)
          |
          CH₂CH₂
          |
          CO₂H

*—(CH₂CH₂—N)ₗ—*
          |
          Y

*—(CH₂CH₂—⁺NH₂)ₘ—*
          |
          ⁻O—Y

*—(CH₂CH₂—N)ₙ—*
          H

Y (A-30)   —[C(=O)—(CH₂)₅—O]ₚ—C(=O)—C₁₅H₃₁-n (A-31)   —[C(=O)—(CH₂)₅—O]ₚ—C(=O)—CH(C₂H₅)(C₄H₉)

(A-32)   —[C(=O)—(CH₂)₅—O]ₚ—C(=O)—C₆H₁₁ (cyclohexyl)

(A-33)   —[C(=O)—(CH₂)₅—O]ₚ—H (A-34)   —C(=O)—CH₂—O—[C(=O)—(CH₂)₄—O]ₚ—H (A-35)   —C(=O)—CH₂—O—[C(=O)—(CH₂)₅—O]ₚ—H

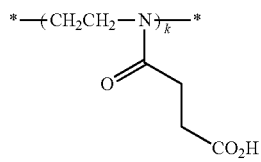
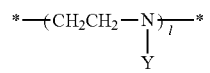
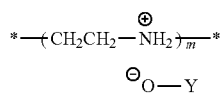
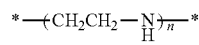
| | Y |
|---|---|
| (A-36) | 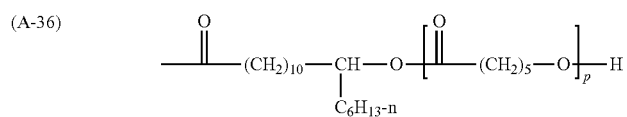 |
| (A-37) | 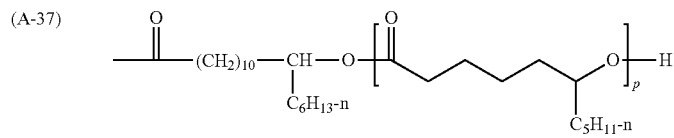 |
| (A-38) | 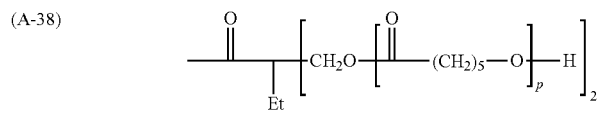 |
| (A-39) | 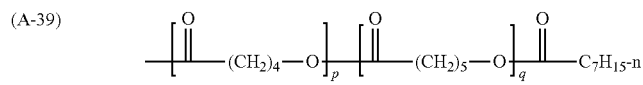 |
| (A-40) | 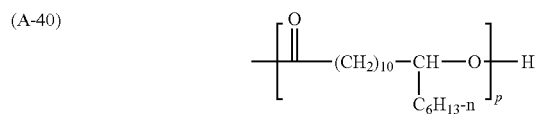 |
| (A-41) | 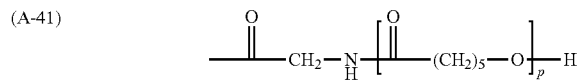 |
| (A-42) | 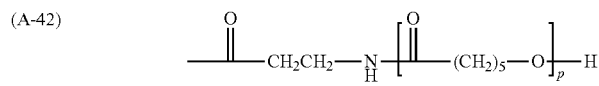 |

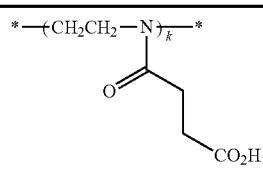
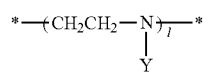
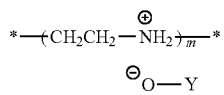
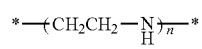
Y
(A-43) 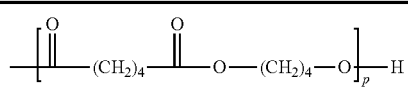
(A-44) 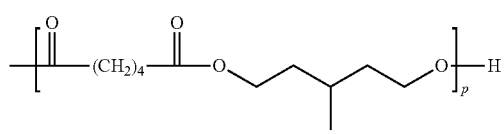
(A-45) 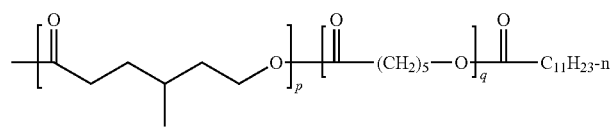
(A-46) 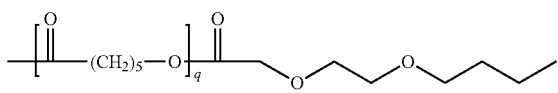
(A-47) 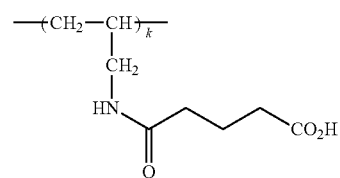
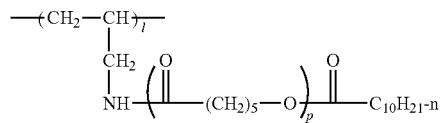
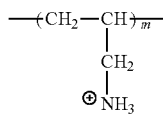
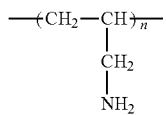
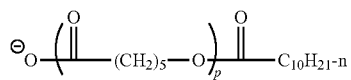

-continued
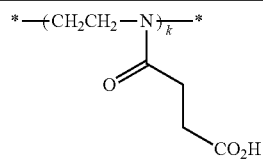
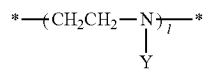
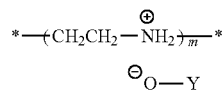
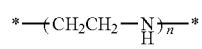
Y
(A-48)
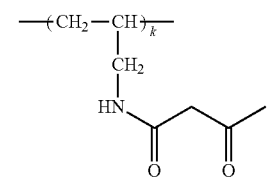
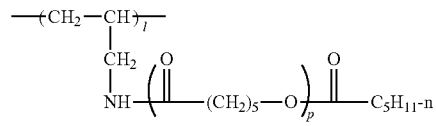
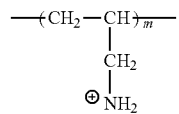
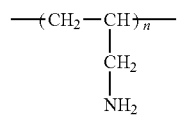
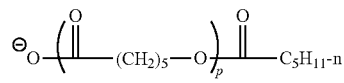
(A-49)
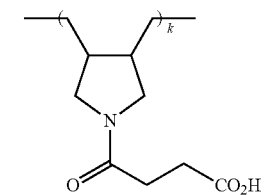
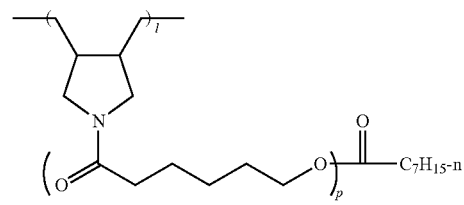

-continued
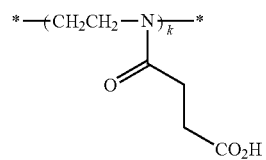
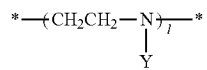
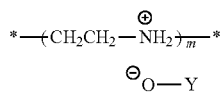
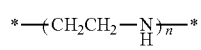
Y
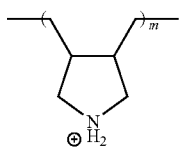
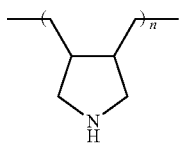
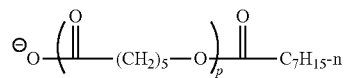
(A-50)
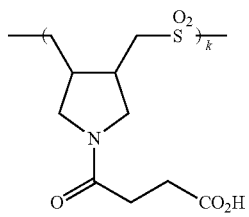
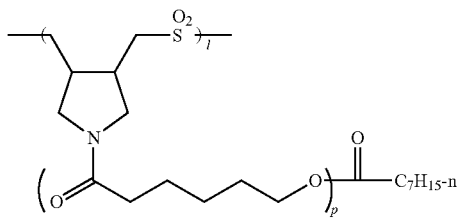
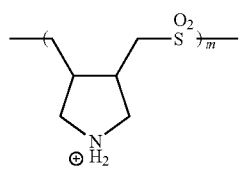

-continued
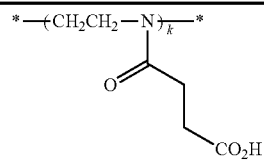
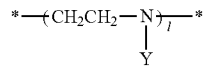
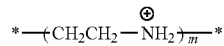
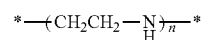
Y
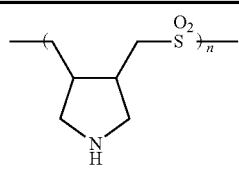
(A-51)
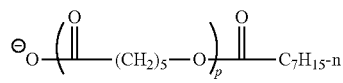
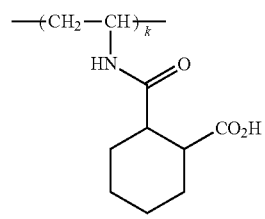
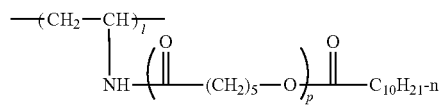
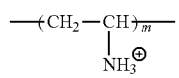
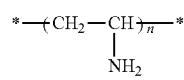
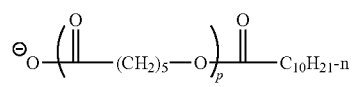
(A-52)
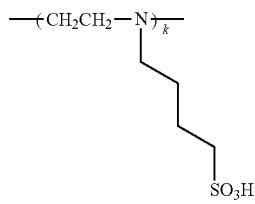
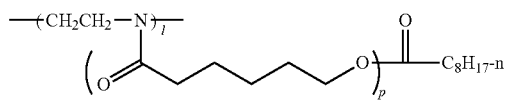

-continued
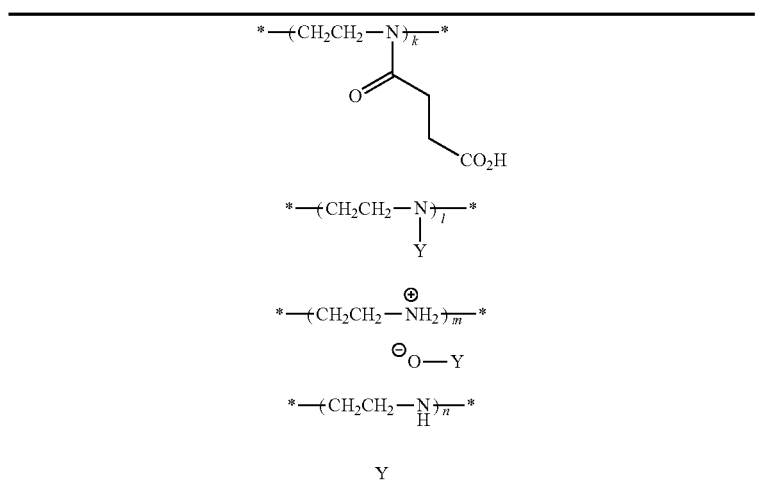
(A-53)
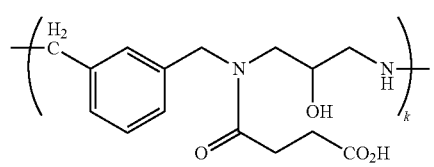
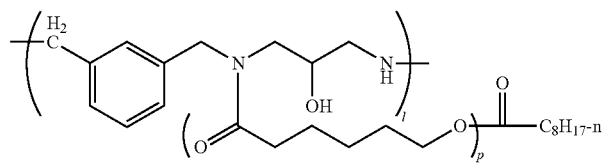
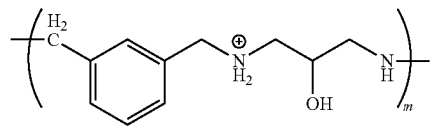
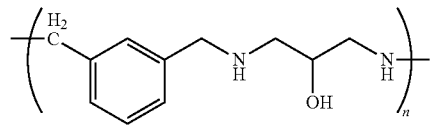
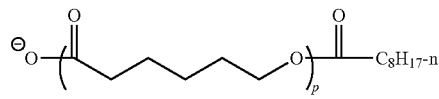
(A-54)
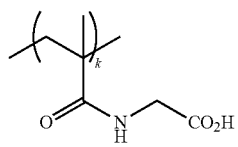

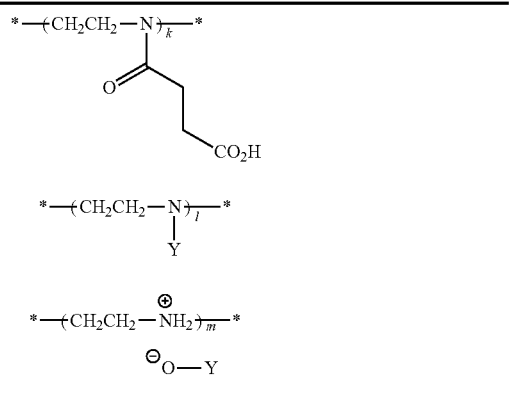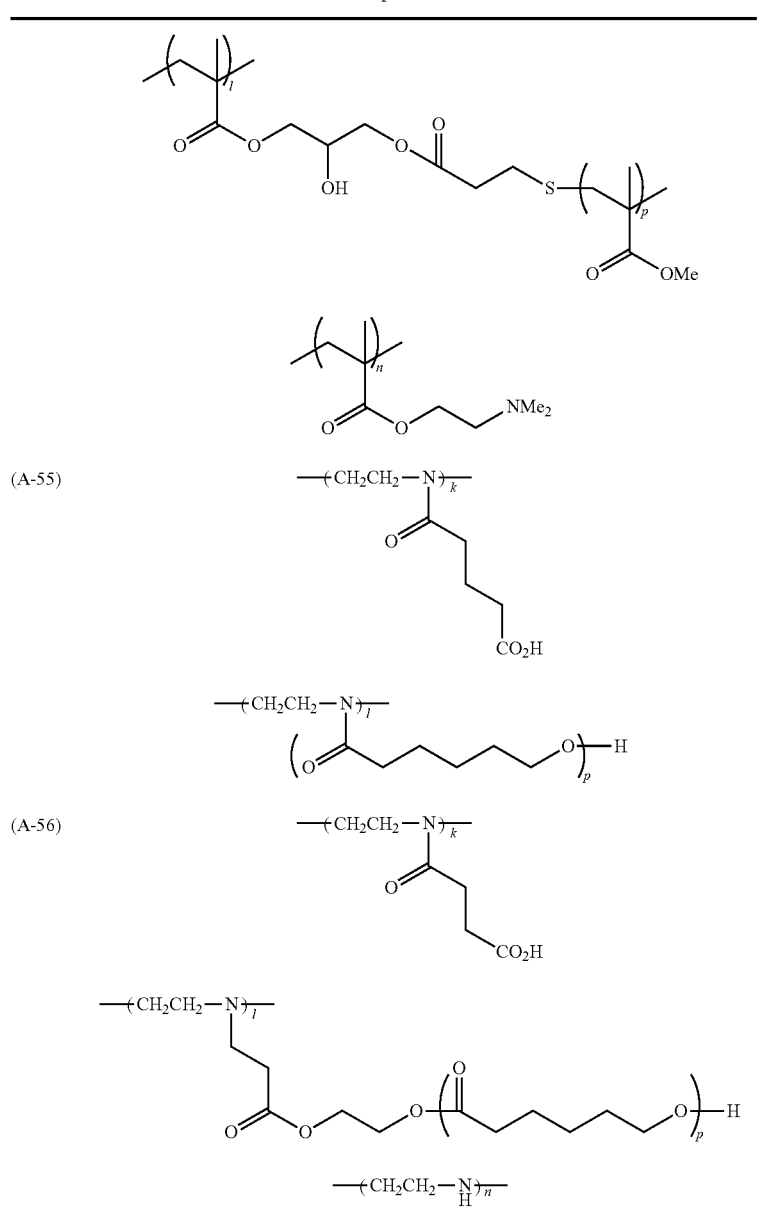

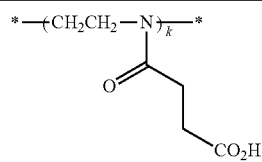
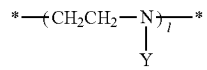
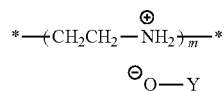
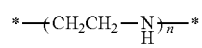
(A-57)
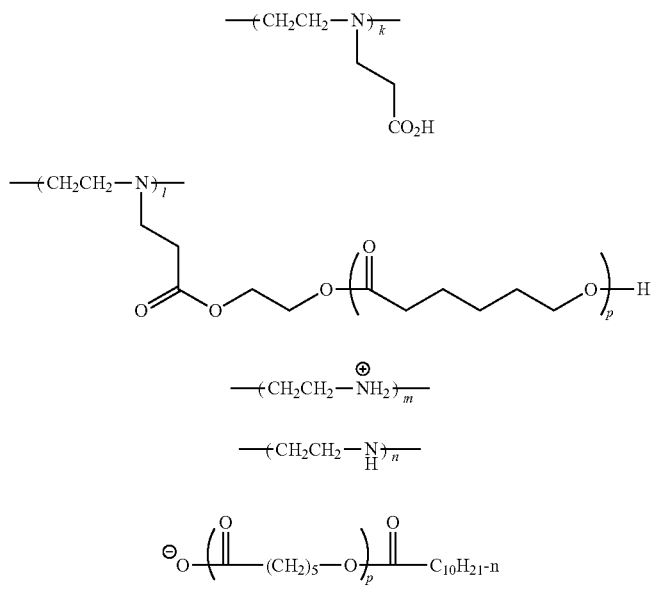
(A-58)
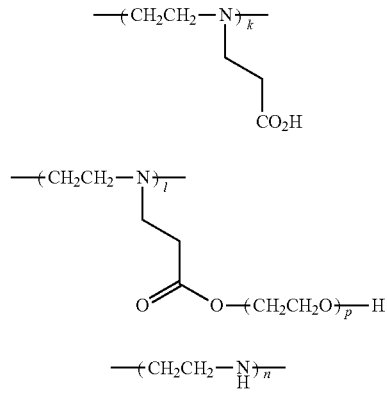
(A-59)

-continued
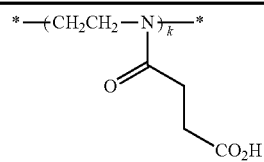
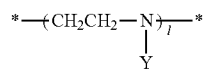
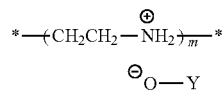
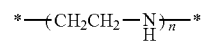
Y
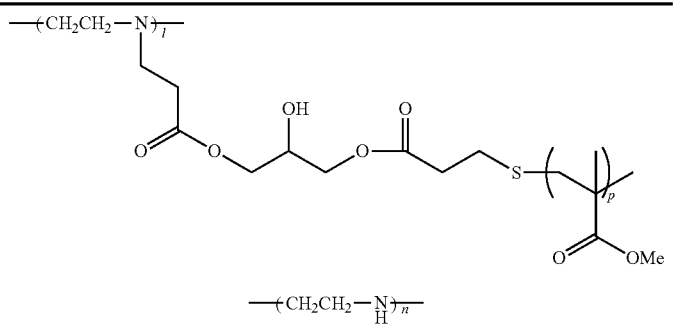
(A-60)
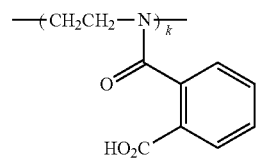
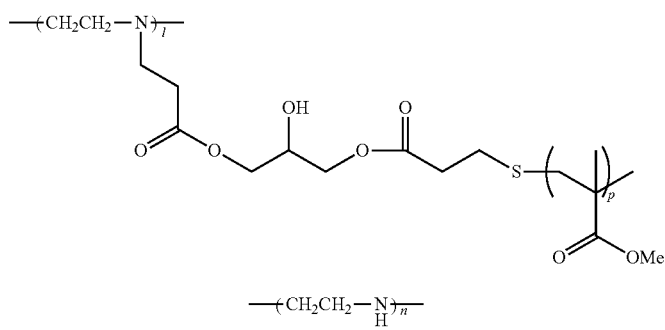
(A-61)
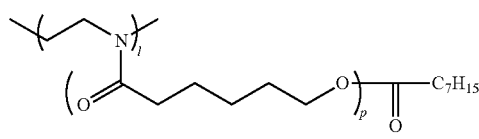
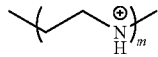
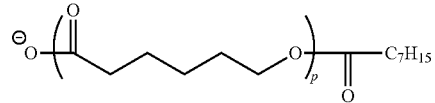

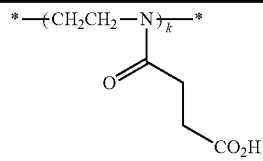

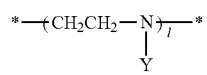

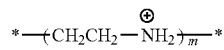

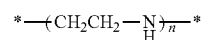

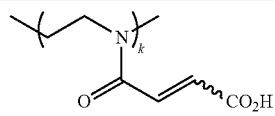

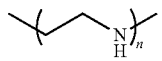

In order to synthesize the specific resin, the specific resin may be prepared by (1) a method for reacting a resin having a primary or secondary amino group, a precursor x of X and a precursor y of Y, (2) a method by polymerizing a monomer containing X and a macromonomer containing Y, and the like, but the specific resin is preferably prepared by first synthesizing a resin having a primary or secondary amino group in the main chain, and then allowing the resin to undergo a reaction with the precursor x of X and the precursor y of Y to introduce the reaction products into a nitrogen atom present in the main chain by a polymer reaction.

Examples of the resin having a primary or secondary amino group include an oligomer or polymer containing a primary or secondary amino group, which constitutes the main chain moiety having a nitrogen atom, and for example, poly(lower alkyleneimine), polyallylamine, polydiallylamine, a metaxylenediamine-epichlorohydrin polycondensate, polyvinylamine and the like. Among them, an oligomer or polymer including poly(lower alkyleneimine) or polyallylamine is preferred.

The precursor x of the group X having a functional group with a pKa of 14 or less represents a compound which may react with the resin having a primary or secondary amino group to introduce X into the main chain.

Examples of the x include a cyclic carboxylic anhydride (a cyclic carboxylic anhydride having 4 to 30 carbon atoms is preferred, and for example, succinic anhydride, glutaric anhydride, itaconic anhydride, maleic anhydride, allylsuccinic anhydride, butylsuccinic anhydride, n-octylsuccinic anhydride, n-decylsuccinic anhydride, n-dodecylsuccinic anhydride, n-tetradecylsuccinic anhydride, n-docosenylsuccinic anhydride, (2-hexen-1-yl)succinic anhydride, (2-methylpropen-1-yl)succinic anhydride, (2-dodecen-1-yl)succinic anhydride, n-octenyl succinic anhydride, (2,7-octanedien-1-yl)succinic anhydride, acetylmalic anhydride, diacetyltartaric anhydride, hetic anhydride, cyclohexane-1,2-dicarboxylic anhydride, 3- or 4-methylcyclohexane-1,2-dicarboxylic anhydride, tetrafluorosuccinic anhydride, 3- or 4-cyclohexene-1,2-dicarboxylic anhydride, 4-methyl-4-cyclohexene-1,2-dicarboxylic anhydride, phthalic anhydride, tetrachlorophthalic anhydride, naphthalic anhydride, bicyclo[2.2.2]oct-7-ene-2,3,5,6-tetracarboxylic dianhydride, pyromellitic dianhydride, meso-butane-1,2,3,4-tetracarboxylic dianhydride, 1,2,3,4-cyclopentane carboxylic dianhydride and the like), halogen atom-containing carboxylic acid (for example, chloroacetic acid, bromoacetic acid, iodoacetic acid, 4-chloro-n-butyric acid and the like), sultone (for example, propanesultone, 1,4-butanesultone and the like), diketone, a cyclic sulfocarboxylic acid anhydride (for example, 2-sulfobenzoic acid anhydride and the like), a —COCH$_2$COCl-containing compound (for example, ethylmalonyl chloride and the like), or a cyano acetic acid chloride and the like, and a cyclic carboxylic acid anhydride, sultone and diketone are particularly preferred from the viewpoint of productivity.

The precursor y of the oligomer chain or polymer chain Y having the number of atoms of 40 to 10,000 represents a compound which may react with resin having a primary or secondary amino group to introduce the oligomer chain or polymer chain Y.

The y is preferably an oligomer or polymer having the number of atoms of 40 to 10,000 and having a group, that may be covalently or ionically bonded to a nitrogen atom of the specific resin, at a terminal end, and particularly, an oligomer or polymer having the number of atoms of 40 to 10,000 and having a free carboxyl group at one end is most preferred.

Examples of y include a polyester represented by Formula (IV), which has a free carboxyl acid at one end, a polyamide which has a free carboxyl acid at one end, a poly(meth)acrylic acid-based resin which has a free carboxyl acid at one end and the like, but particularly, a polyester represented by Formula (IV), which contains a free carboxyl acid at one end, is most preferred.

The y may be synthesized by a known method, for example, a polyester containing a free carboxyl acid at one end, which is represented by Formula (IV) is formed by the polycondensation (IV-1) of carboxylic acid and lactone, the polycondensation (IV-2) of a hydroxy group-containing carboxylic acid or the polycondensation (IV-3) of a dihydric alcohol and a divalent carboxylic acid (or a cyclic acid anhydride) as described above. The polyamide containing a free carboxyl acid at one end may be prepared by self-condensation of an amino group-containing carboxylic acid (for example, glycine, alanine, β-alanine, 2-aminobutyric acid and the like) and the like. The poly(meth)acrylic acid ester having a free carboxyl acid at one end may be prepared by radical polymerization of (meth)acrylic acid-based monomers in the presence of a carboxyl group-containing chain transfer agent (for example, 3-mercaptopropionic acid and the like).

The specific resin may be prepared by (a) a method in which a resin having a primary or secondary amino group, x and y are simultaneously reacted with each other, (b) a method in which a resin having a primary or secondary amino group is first reacted with x, and then reacted with y or (c) a method in which a resin having a primary or secondary amino group is first reacted with y, and then reacted with x. In particular, (c) a method in which a resin having a primary or secondary amino group is first reacted with y, and then reacted with x is preferred.

The reaction temperature may be suitably selected according to the conditions, but is preferably 20° C. to 200° C., and most preferably 40° C. to 150° C. The reaction time is preferably 1 hour to 48 hours, and more preferably 1 hour to 24 hours from the viewpoint of productivity.

The reaction may be carried out in the presence of a solvent. Examples of the solvent include water, a sulfoxide compound (for example, dimethylsulfoxide and the like), a ketone compound (for example, acetone, methyl ethyl ketone, cyclohexanone and the like), an ester compound (for example, ethyl acetate, butyl acetate, ethyl propionate, propylene glycol 1-monomethyl ether 2-acetate and the like), an ether compound (for example, diethyl ether, dibutyl ether, tetrahydrofuran and the like), an aliphatic hydrocarbon compound (for example, pentane, hexane and the like), an aromatic hydrocarbon compound (for example, toluene, xylene, mesitylene and the like), a nitrile compound (for example, acetonitrile, propionitrile and the like), an amide compound (for example, N,N-dimethyl formamide, N,N-dimethylacetamide, N-methylpyrrolidone and the like), a carboxylic acid compound (for example, acetic acid, propionic acid and the like), an alcohol compound (for example, methanol, ethanol, isopropanol, n-butanol, 3-methyl butanol, 1-methoxy-2-propanol and the like) and a halogen-based solvent (for example, chloroform, 1,2-dichloroethane and the like).

When a solvent is used, the solvent is preferably used at 0.1 times by mass to 100 times by mass, and most preferably 0.5 times by mass to 10 times by mass, based on a substrate.

The specific resin may be purified by a reprecipitation method. When the specific resin obtained by removing low molecular weight components by the reprecipitation method is used as a dispersant, the dispersion performance is improved.

For the reprecipitation, a hydrocarbon-based solvent such as hexane and an alcohol-based solvent such as methanol are preferably used.

Hereinafter, specific examples of the specific resin will be described along with the molecular weights thereof. R' represents an alkyl group.

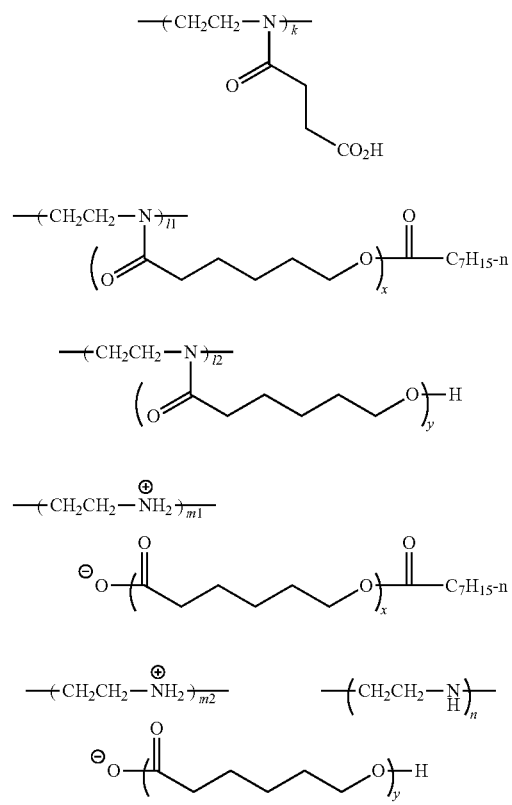

$k/(l1+l2)/(m1+m2)/n=10/50/5/35$  $x+y=40$  Mw 24,000
Mw/Mn=1.6

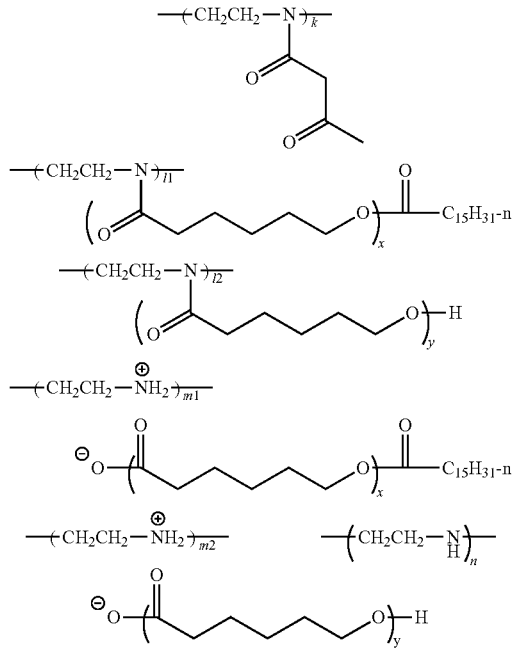

$k/(l1+l2)/(m1+m2)/n=20/4/5/35$  $x+y=60$  Mw 18,000
Mw/Mn=1.6

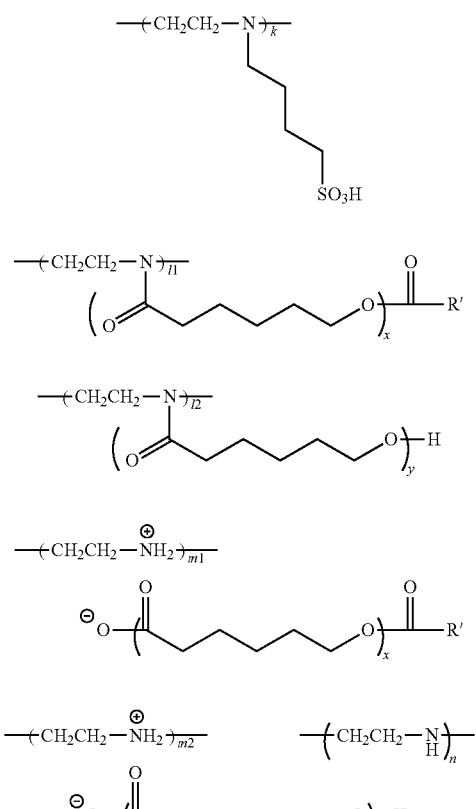
k/(l1+l2)/(m1+m2)/n=5/60/10/25  x+y=20  Mw 12,000
Mw/Mn=1.6
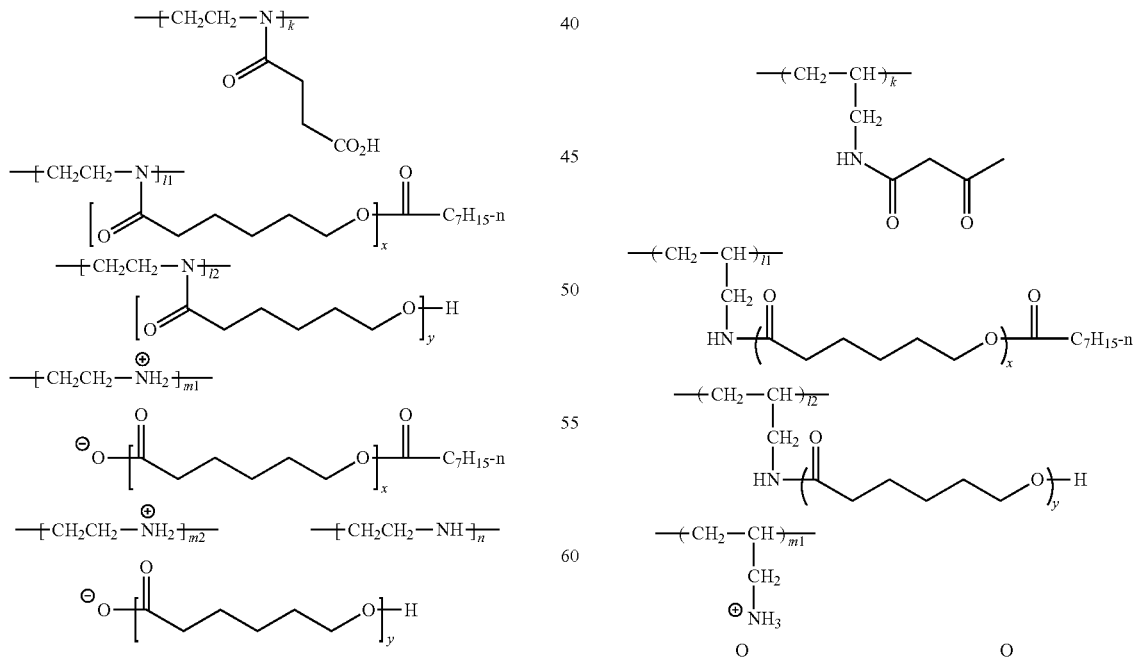
k/(l1+l2)/(m1+m2)/n=30/60/5/5  Mw 40,000  Mw/Mn=2.5
x+y=20
k/(l1+l2)/(m1+m2)/n=10/50/5/35  x+y=40  Mw 24,000
Mw/Mn=1.6

-continued

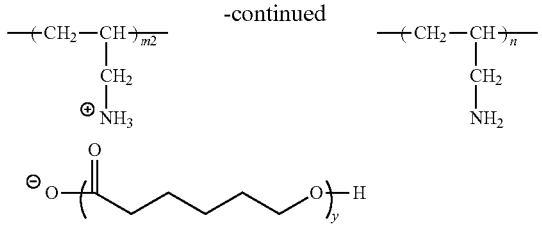

k(l1+l2)/(m1+m2)/n=20/70/5/5 Mw 42,000 Mw/Mn=2.5
x+y=40

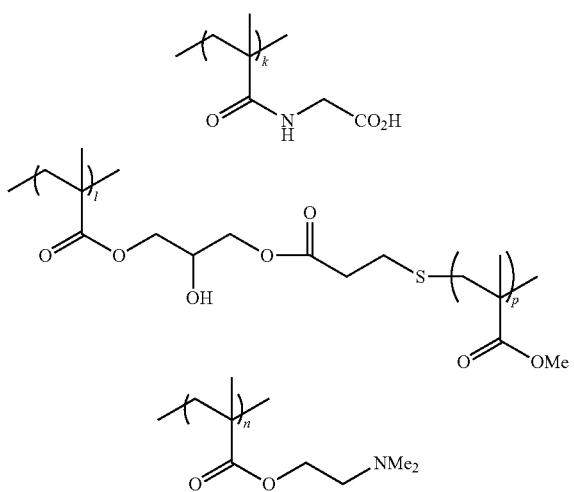

k/l/n=10/64/26 Mw 32,000 Mw/Mn=1.6 p=5~100000

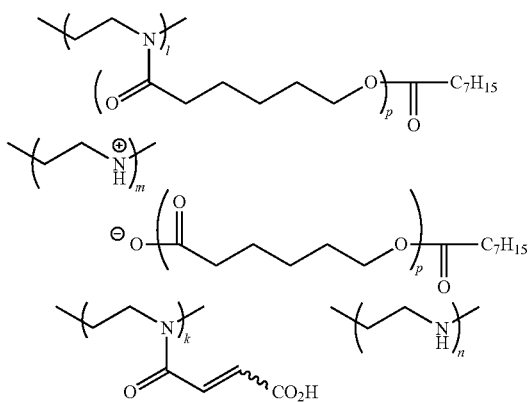

k/l/m/n=25/41/4/30 p=60 Mw 9,000 Mw/Mn=2.1

A binder resin is often added during the preparation of a pigment dispersion liquid, does not need alkali solubility, and is soluble only in an organic solvent.

As the binder, a linear organic high polymer which is soluble in an organic solvent is preferred. Examples of the linear organic high polymer include polymers having carboxylic acid at the side chain thereof, and methacrylic acid copolymers, acrylic acid copolymers, itaconic acid copolymers, crotonic acid copolymers, maleic acid copolymers, partially esterified maleic acid copolymers and the like as described in, for example, Japanese Patent Publication No. S59-44615, Japanese Patent Publication No. S54-34327, Japanese Patent Publication No. S58-12577, Japanese Patent Publication No. S54-25957, Japanese Patent Application Laid-Open No. S59-53836 and Japanese Patent Application Laid-Open No. S59-71048, and an acidic cellulose derivative having carboxylic acid similarly at the side chain thereof is also useful.

Among these various binders, polyhydroxystyrene-based resins, polysiloxane-based resins, acrylic resins, acrylamide-based resins and acrylic/acrylamide copolymer resins are preferred from the viewpoint of heat resistance, and acrylic resins, acrylamide-based resins and acrylic/acrylamide copolymer resins are more preferred.

As the acrylic resin, copolymers including a monomer selected from benzyl (meth)acrylate, (meth)acrylic acid, hydroxyethyl (meth)acrylate, (meth)acrylamide and the like, for example, each copolymer such as benzyl methacrylate/methacrylic acid and benzyl methacrylate/benzyl methacrylamide, KS RESIST-106 (manufactured by Osaka Organic Chemical Industry Ltd.) and CYCLOMER-P SERIES (manufactured by Daicel Corporation) are preferred.

Adhesion to the lower layer and the like may be imparted by dispersing the above-mentioned colorant in these binders at high concentration, and these binders also contribute to the coated surface shape during spin-coating and slit-coating (formation of a colored layer).

The weight average molecular weight of the resin in the present invention (a polystyrene converted value measured by GPC method) is preferably 5,000 to 300,000, more preferably 7,000 to 100,000, and particularly preferably 10,000 to 50,000.

In particular, the specific resin as a dispersion resin has a weight average molecular weight of 3,000 to 100,000, and more preferably 5,000 to 55,000, as measured by a GPC method. The molecular weight in the above-described range is advantageous in that high storage stability may be achieved. Further, the presence of a nitrogen atom in (i) the repeating unit containing the nitrogen atom in the specific resin of the present invention may be confirmed by a method such as acid titration, and the presence of a functional group having a pKa of 14 or less and the bonding of the functional group to the nitrogen atom of the repeating unit may be confirmed by a method such as base titration, nuclear magnetic resonance spectroscopy and infrared spectroscopy. In addition, the fact that the specific resin has (ii) an oligomer chain or polymer chain Y having 40 to 10,000 atoms as a side chain may be confirmed by a method such as nuclear magnetic resonance spectroscopy and a GPC method.

In the coloring composition of the present invention, the resins may be used either alone or in combination of two or more thereof.

In addition, examples of the resin also include resins in which a curable compound to be described below is a polymer compound and resins in which a surfactant to be described below is a polymer compound.

The content of the resin is preferably 10% by mass to 50% by mass, more preferably 11% by mass to 40% by mass, and still more preferably 12% by mass to 30% by mass, based on the total solids of the coloring composition of the present invention.

[3] Curable Compound

The coloring composition of the present invention preferably contains at least one of curable compounds.

As the curable compound, a compound, which may be subjected to film curing by heating, is preferred, and for example, a compound having a heat curable functional group may be used. The heat curable compound preferably has at least one group selected from, for example, an epoxy group, a methylol group, an alkoxymethyl group, an acyloxymethyl group, a (meth)acryloyl group, an isocyanate group, a vinyl group and a mercapto group, as the heat curable functional group. As the heat curable compound, a heat curable compound having two or more heat curable functional groups per a molecular is preferred.

More preferred examples thereof include an epoxy resin, an alkoxymethylated or acyloxymethylated melamine compound or resin, an alkoxymethylated or acyloxymethylated urea compound or resin, a hydroxymethylated or alkoxymethylated phenol compound or resin, an alkoxymethyl-etherified phenol compound or resin and the like.

Particularly preferred examples of the curable compounds include a phenol derivative having a molecular weight of 1,200 or less, including from three to five benzene rings in the molecule and further having two or more hydroxymethyl groups or alkoxymethyl groups in total, in which the hydroxymethyl groups or alkoxymethyl groups are concentrated to at least any one benzene ring or classified and bonded. By using such a phenol derivative, the effects of the present invention may be more remarkably brought out. The alkoxymethyl group bonded to the benzene ring preferably has 6 or less carbon atoms. Specifically, a methoxymethyl group, an ethoxymethyl group, an n-propoxymethyl group, an i-propoxymethyl group, an n-butoxymethyl group, an i-butoxymethyl group, a sec-butoxymethyl group and a t-butoxymethyl group are preferred. Further, an alkoxy-substituted alkoxy group such as a 2-methoxyethoxy group and a 2-methoxy-1-propoxy group is also preferred.

The curable compound is preferably a phenol compound having a benzene ring in the molecule and more preferably a phenol compound having two or more benzene rings in the molecule, and is preferably a phenol compound containing no nitrogen atom.

The curable compound is preferably a phenol compound having from two to eight heat curable functional groups per molecule, and more preferably has from three to six heat curable functional groups.

Among these phenol derivatives, particularly preferred compounds are exemplified below. In the formulas, each of $L^1$ to $L^8$ represents a heat curable functional group such as an alkoxymethyl group, and may be the same as or different from every other $L^1$ to $L^8$, and the heat curable functional group is preferably a hydroxymethyl group, a methoxymethyl group or an ethoxymethyl group

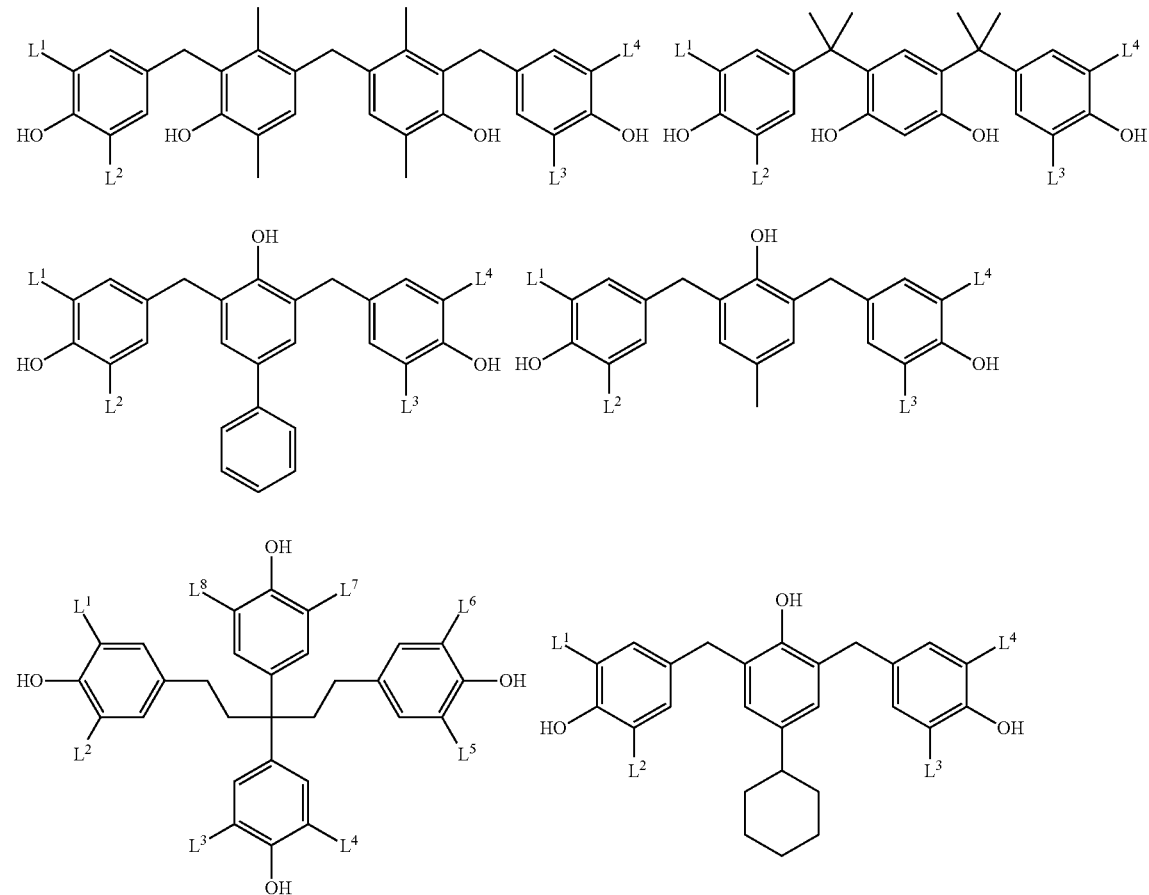

-continued
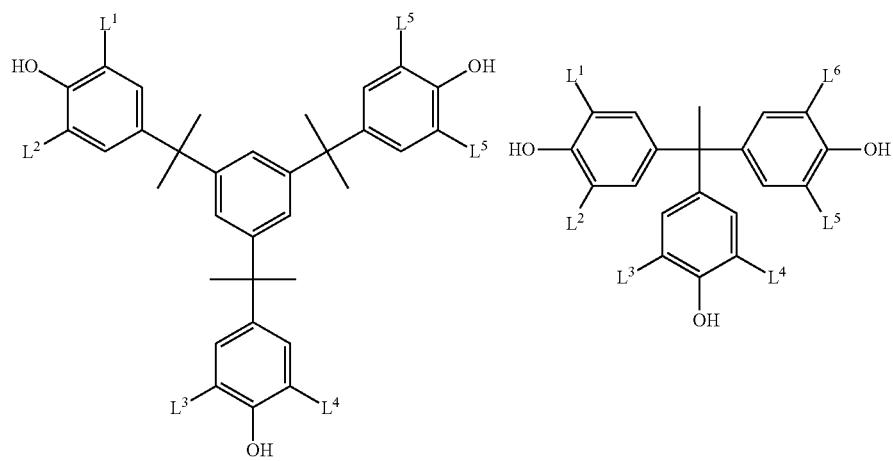
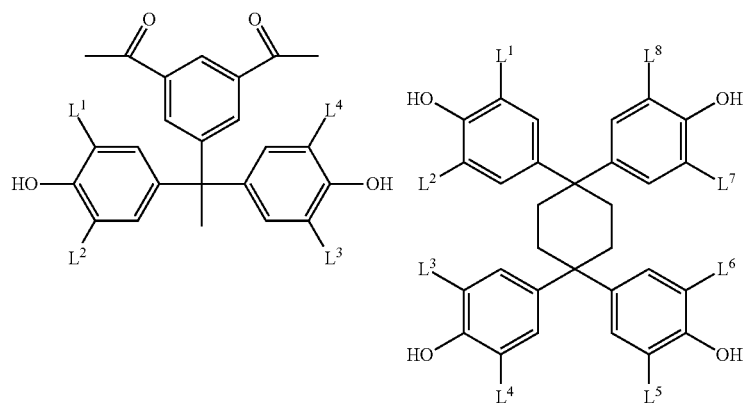
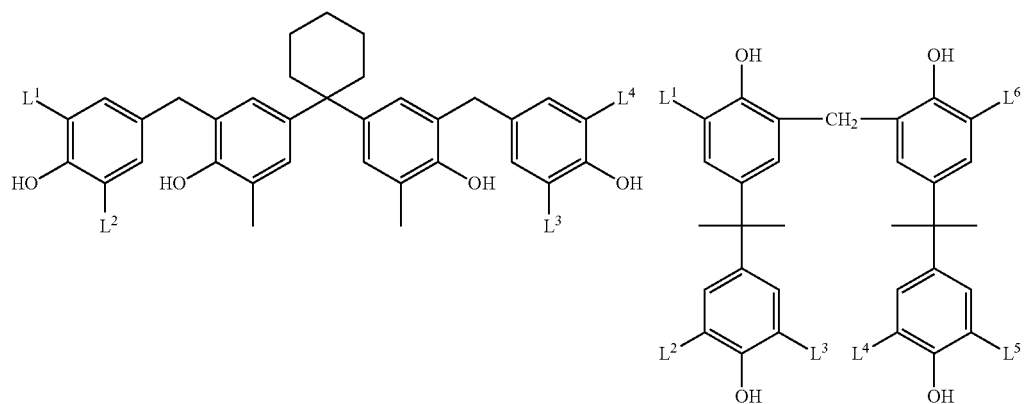
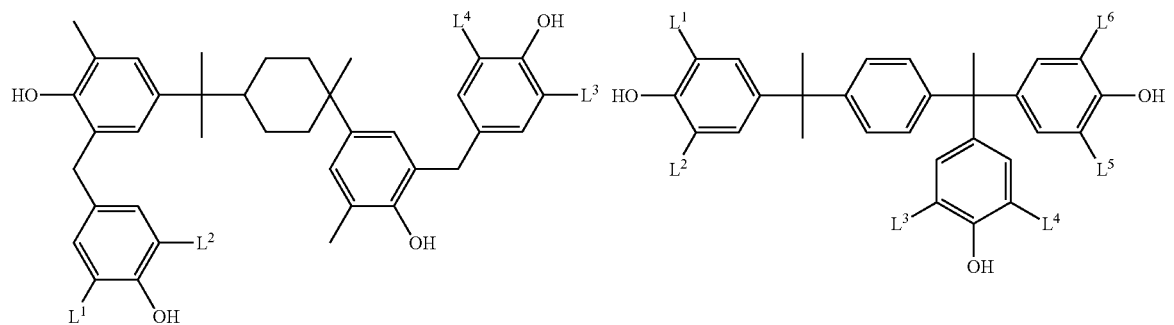

-continued

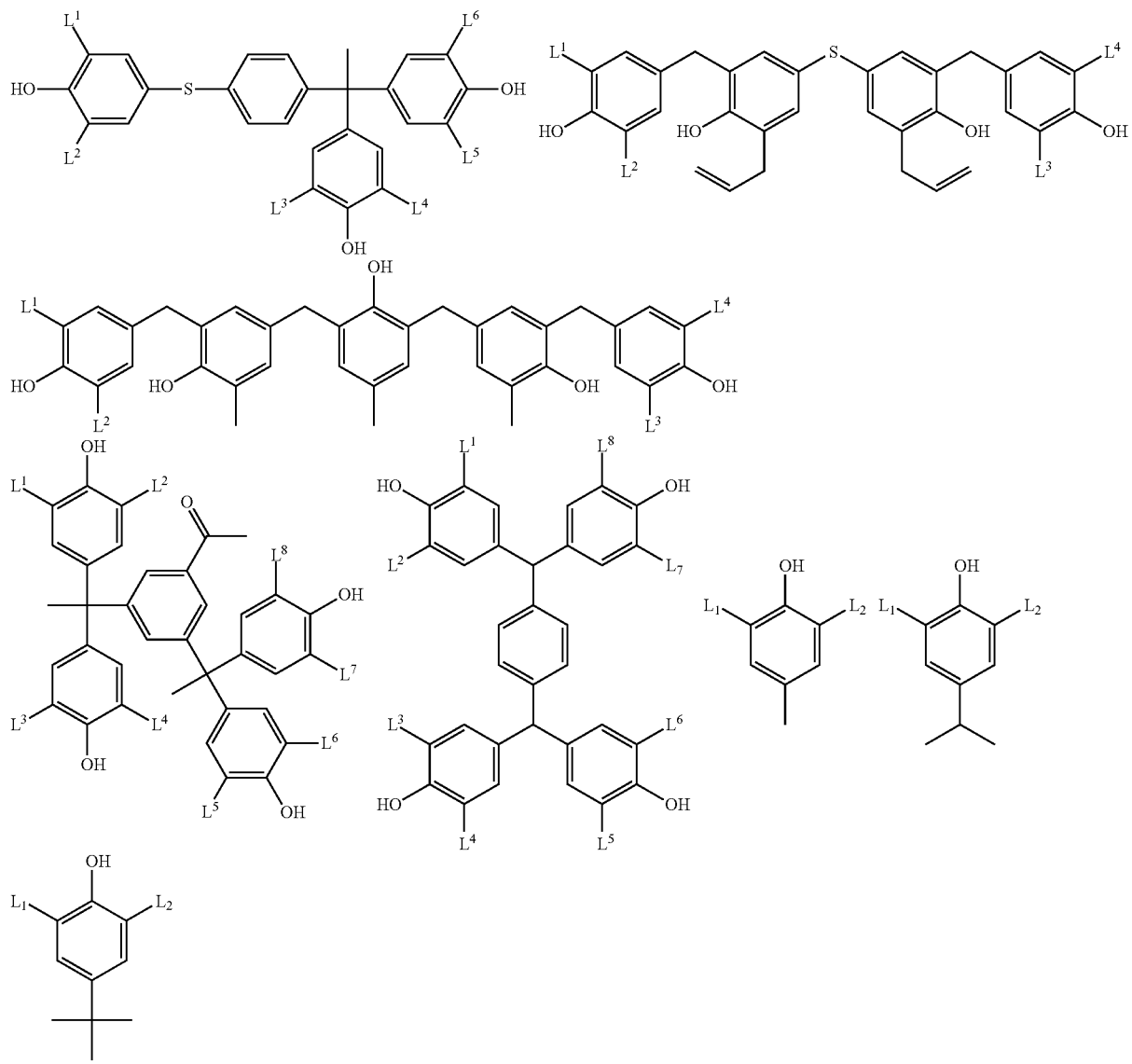

As the curable compound, a commercially available product may be used, or the compound may be synthesized by a known method. For example, a phenol derivative having a hydroxymethyl group may be obtained by reacting a phenol compound having no hydroxymethyl group (in the formula, a compound in which each of $L^1$ to $L_8$ is a hydrogen atom) with formaldehyde in the presence of a base catalyst. At this time, in order to prevent resinification or gelling, the reaction is preferably performed at a temperature of 60° C. or less. Specifically, this derivative may be synthesized by the method as described in Japanese Patent Application Laid-Open No. H6-282067, Japanese Patent Application Laid-Open No. H7-64285 and the like.

A phenol derivative having an alkoxymethyl group may be obtained by reacting a phenol derivative having a hydroxymethyl group with an alcohol in the presence of an acid catalyst. At this time, in order to prevent resinification or gelling, the reaction is preferably performed at a temperature of 100° C. or less. Specifically, this derivative may be synthesized by the method as described in EP632003A1 and the like. The thus-synthesized phenol derivative having a hydroxymethyl group or an alkoxymethyl group is preferred from the viewpoint of stability during storage, but a phenol derivative having an alkoxymethyl group is particularly preferred from the viewpoint of stability during storage. These phenol derivatives having two or more hydroxymethyl groups or alkoxymethyl groups in total that are concentrated to at least any one benzene ring or classified and bonded, may be used either alone or in combination of two or more thereof.

In addition, the curable compound also includes (i) a compound having an N-hydroxymethyl group, an N-alkoxymethyl group or an N-acyloxymethyl group and (ii) an epoxy compound, as described below.

(i) The compound having an N-hydroxymethyl group, an N-alkoxymethyl group or an N-acyloxymethyl group is preferably a compound having two or more (more preferably from two to eight) partial structures represented by the following Formula (CLNM-1).

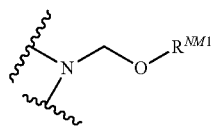

(CLNM-1)

In Formula (CLNM-1), $R^{NM1}$ represents a hydrogen atom, an alkyl group, a cycloalkyl group or an oxoalkyl group.

The alkyl group of $R^{NM1}$ in Formula (CLNM-1) is preferably a straight chained or branched alkyl group having 1 to 6 carbon atoms. The cycloalkyl group of $R^{NM1}$ is preferably a cycloalkyl group having 5 to 6 carbon atoms. The oxoalkyl group of $R^{NM1}$ is preferably an oxoalkyl group having 3 to 6 carbon atoms, and examples thereof include a β-oxopropyl group, a β-oxobutyl group, a β-oxopentyl group, a β-oxohexyl group and the like.

More preferred aspects of the compound having two or more partial structures represented by Formula (CLNM-1) include a urea-based crosslinking agent represented by the following Formula (CLNM-2), an alkylene urea-based crosslinking agent represented by the following Formula (CLNM-3), a glycoluril-based crosslinking agent represented by the following Formula (CLNM-4) and a melamine-based crosslinking agent represented by the following Formula (CLNM-5).

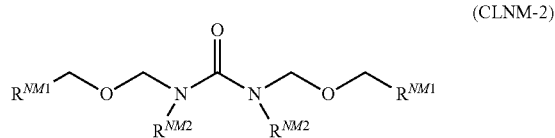

(CLNM-2)

In Formula (CLNM-2), each $R^{NM1}$ independently is the same as $R^{NM1}$ in Formula (CLNM-1).

Each $R^{NM2}$ independently represents a hydrogen atom, an alkyl group (preferably having 1 to 6 carbon atoms) or a cycloalkyl group (preferably having 5 to 6 carbon atoms).

Specific examples of the urea-based crosslinking agent represented by Formula (CLNM-2) include N,N-di(methoxymethyl)urea, N,N-di(ethoxymethyl)urea, N,N-di(propoxymethyl)urea, N,N-di(isopropoxymethyl)urea, N,N-di(butoxymethyl)urea, N,N-di(t-butoxymethyl)urea, N,N-di(cyclohexyloxymethyl)urea, N,N-di(cyclopentyloxymethyl)urea, N,N-di(adamantyloxymethyl)urea, N,N-di(norbornyloxymethyl)urea and the like.

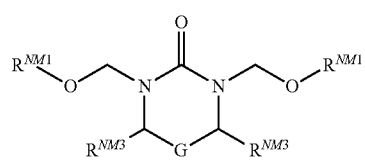

(CLNM-3)

In Formula (CLNM-3), each $R^{NM1}$ independently is the same as $R^{NM1}$ in Formula (CLNM-1).

Each $R^{NM3}$ independently represents a hydrogen atom, a hydroxyl group, a straight chained or branched alkyl group (preferably having 1 to 6 carbon atoms), a cycloalkyl group (preferably having 5 to 6 carbon atoms), an oxoalkyl group (preferably having 1 to 6 carbon atoms), an alkoxy group (preferably having 1 to 6 carbon atoms) or an oxoalkoxy group (preferably having 1 to 6 atoms).

G represents a single bond, an oxygen atom, a sulfur atom, an alkylene group (preferably having 1 to 3 carbon atoms) or a carbonyl group. More specific examples thereof include a methylene group, an ethylene group, a propylene group, a 1-methylethylene group, a hydroxymethylene group, a cyanomethylene group and the like.

Specific examples of the alkylene urea-based crosslinking agent represented by Formula (CLNM-3) include N,N-di(methoxymethyl)-4,5-di(methoxymethyl)ethylene urea, N,N-di(ethoxymethyl)-4,5-di(ethoxymethyl)ethylene urea, N,N-di(propoxymethyl)-4,5-di(propoxymethyl)ethylene urea, N,N-di(isopropoxymethyl)-4,5-di(isopropoxymethyl) ethylene urea, N,N-di(butoxymethyl)-4,5-di(butoxymethyl) ethylene urea, N,N-di(t-butoxymethyl)-4,5-di(t-butoxymethyl)ethylene urea, N,N-di(cyclohexyloxymethyl)-4,5-di(cyclohexyloxymethyl)ethylene urea, N,N-di(cyclopentyloxymethyl)-4,5-di(cyclopentyloxymethyl) ethylene urea, N,N-di(adamantyloxymethyl)-4,5-di(adamantyloxymethyl)ethylene urea, N,N-di(norbornyloxymethyl)-4,5-di(norbornyloxymethyl)ethylene urea and the like.

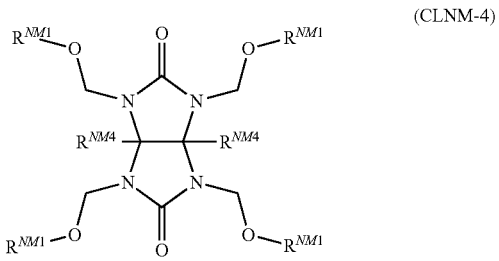

(CLNM-4)

In Formula (CLNM-4), each $R^{NM1}$ independently is the same as $R^{NM1}$ in Formula (CLNM-1).

Each $R^{NM4}$ independently represents a hydrogen atom, a hydroxyl group, an alkyl group, a cycloalkyl group or an alkoxy group.

More specific examples of the alkyl group (preferably having 1 to 6 carbon atoms), cycloalkyl group (preferably having 5 to 6 carbon atoms) and alkoxy group (preferably having 1 to 6 carbon atoms) of $R^{NM4}$ include a methyl group, an ethyl group, a butyl group, a cyclopentyl group, a cyclohexyl group, a methoxy group, an ethoxy group, a butoxy group and the like.

Specific examples of the glycoluril-based crosslinking agent represented by Formula (CLNM-4) include N,N,N,N-tetra(methoxymethyl)glycoluril, N,N,N,N-tetra(ethoxymethyl)glycoluril, N,N,N,N-tetra(propoxymethyl)glycoluril, N,N,N,N-tetra(isopropoxymethyl)glycoluril, N,N,N,N-tetra(butoxymethyl)glycoluril, N,N,N,N-tetra(t-butoxymethyl) glycoluril, N,N,N,N-tetra(cyclohexyloxymethyl)glycoluril, N,N,N,N-tetra(cyclopentyloxymethyl)glycoluril, N,N,N,N-tetra(adamantyloxymethyl)glycoluril, N,N,N,N-tetra(norbornyloxymethyl)glycoluril and the like.

(CLNM-5)

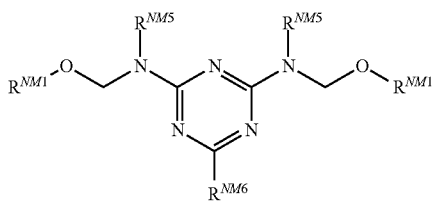

In Formula (CLNM-5), each $R^{NM1}$ independently is the same as $R^{NM1}$ in Formula (CLNM-1).

Each $R^{NM5}$ independently represents a hydrogen atom, an alkyl group, a cycloalkyl group, an aryl group or an atomic group represented by the following Formula (CLNM-5').

Each $R^{NM6}$ independently represents a hydrogen atom, an alkyl group, a cycloalkyl group, an aryl group or an atomic group represented by the following Formula (CLNM-5").

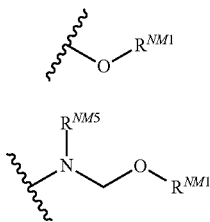

In Formula (CLNM-5), $R^{NM1}$ is the same as $R^{NM1}$ in Formula (CLNM-1).

In Formula (CLNM-5"), $R^{NM1}$ is the same as $R^{NM1}$ in Formula (CLNM-1), and $R^{NM5}$ is the same as $R^{NM3}$ in Formula (CLNM-5).

More specific examples of the alkyl group (preferably having 1 to 6 carbon atoms), cycloalkyl group (preferably having 5 to 6 carbon atoms) and aryl group (preferably having 6 to 10 carbon atoms) of $R^{NM5}$ and $R^{NM6}$ include a methyl group, an ethyl group, a propyl group, an isopropyl group, a butyl group, an isobutyl group, a t-butyl group, a pentyl group, a cyclopentyl group, a hexyl group, a cyclohexyl group, a phenyl group, a naphthyl group and the like.

Examples of the melamine-based crosslinking agent represented by Formula (CLNM-5) include N,N,N,N,N,N-hexa(methoxymethyl)melamine, N,N,N,N,N,N-hexa(ethoxymethyl)melamine, N,N,N,N,N,N-hexa(propoxymethyl)melamine, N,N,N,N,N,N-hexa(isopropoxymethyl)melamine. N,N,N,N,N,N-hexa(butoxymethyl)melamine, N,N,N,N,N,N-hexa(t-butoxymethyl)melamine, N,N,N,N,N,N-hexa(cyclohexyloxymethyl)melamine, N,N,N,N,N,N-hexa(cyclopentyloxymethyl)melamine, N,N,N,N,N,N-hexa(adamantyloxymethyl)melamine, N,N,N,N,N,N-hexa(norbornyloxymethyl)melamine, N,N,N,N,N,N-hexa(methoxymethyl)acetoguanamine, N,N,N,N,N,N-hexa(ethoxymethyl)acetoguanamine, N,N,N,N,N,N-hexa(propoxymethyl)acetoguanamine, N,N,N,N,N,N-hexa(isopropoxymethyl)acetoguanamine, N,N,N,N,N,N-hexa(butoxymethyl)acetoguanamine, N,N,N,N,N,N-hexa(t-butoxymethyl)acetoguanamine, N,N,N,N,N,N-hexa(methoxymethyl)benzoguanamine, N,N,N,N,N,N-hexa(ethoxymethyl)benzoguanamine, N,N,N,N,N,N-hexa(propoxymethyl)benzoguanamine, N,N,N,N,N,N-hexa(isopropoxymethyl)benzoguanamine, N,N,N,N,N,N-hexa(butoxymethyl)benzoguanamine, N,N,N,N,N,N-hexa(t-butoxymethyl)benzoguanamine and the like.

The groups represented by $R^{NM1}$ to $R^{NM6}$ in Formulas (CLNM-1) to (CLNM-5) may further have a substituent. Examples of the substituent which $R^{NM1}$ to $R^{NM6}$ may have include a halogen atom, a hydroxyl group, a nitro group, a cyano group, a carboxyl group, a cycloalkyl group (preferably having 3 to 20 carbon atoms), an aryl group (preferably having 6 to 14 carbon atoms), an alkoxy group (preferably having 1 to 20 carbon atoms), a cycloalkoxy group (preferably having 3 to 20 carbon atoms), an acyl group (preferably having 2 to 20 carbon atoms), an acyloxy group (preferably having 2 to 20 carbon atoms) and the like.

Hereinafter, specific examples of the compound having two or more partial structures represented by Formula (CLNM-1) will be exemplified, but the present invention is not limited thereto.

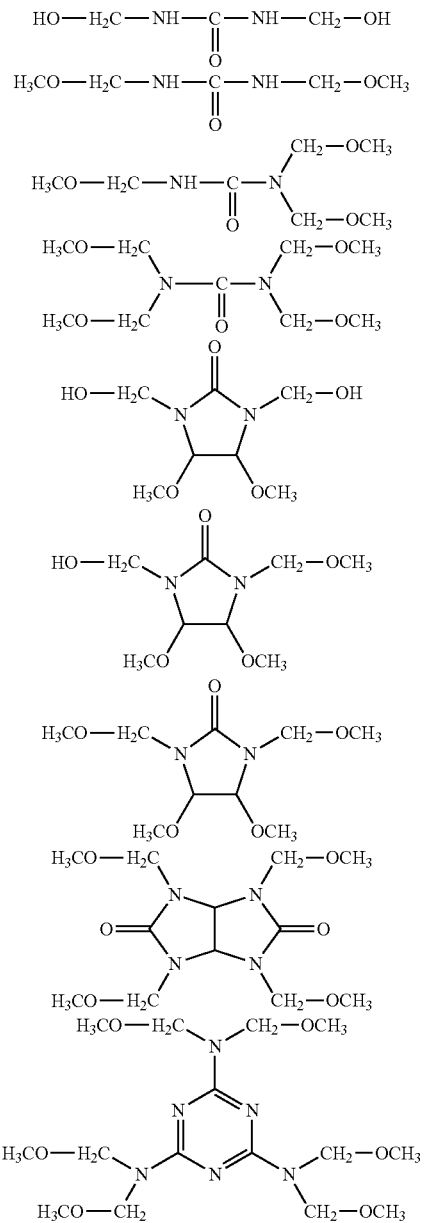

(ii) The epoxy compound includes a compound represented by the following Formula (EP1).

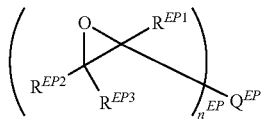

In Formula (EP1), each of $R^{EP1}$ to $R^{EP3}$ independently represents a hydrogen atom, a halogen atom, an alkyl group or a cycloalkyl group, and the alkyl group and cycloalkyl group may have a substituent. Further, $R^{EP1}$ and $R^{EP2}$, and $R_{EP2}$ and $R_{EP3}$ may combine with each other to form a ring structure.

Examples of the substituent which the alkyl group and cycloalkyl group may have include a hydroxyl group, a cyano group, an alkoxy group, an alkylcarbonyl group, an alkoxycarbonyl group, an alkylcarbonyloxy group, an alkylthio group, an alkylsulfone group, an alkylsulfonyl group, an alkylamino group, an alkylamide group and the like.

$Q^{EP}$ represents a single bond or an $n^{EP}$-valent organic group. $R^{EP1}$ to $R^{EP3}$ may combine not only with each other but also with $Q^{EP}$ to form a ring structure.

$n^{EP}$ represents an integer of 2 or more, and is preferably 2 to 10, and more preferably 2 to 6. However, when $Q^{EP}$ is a single bond, $n^{EP}$ is 2.

When $Q^{EP}$ is an $n^{EP}$-valent organic group, the organic group is preferably a chain or cyclic $n^{EP}$-valent saturated hydrocarbon group (preferably having 2 to 20 carbon atoms), an $n^{EP}$-valent aromatic ring group (preferably having 6 to 30 carbon atoms), or an $n^{EP}$-valent organic group and the like having a structure in which a divalent linking group such as ether, ester, amide, sulfonamide and alkylene (preferably having 1 to 4 carbon atoms, more preferably methylene), a trivalent linking group such as —N(-)$_2$, or a combination thereof is linked to a chain or cyclic saturated hydrocarbon or aromatic hydrocarbon.

Hereinafter, specific examples of the compound having an epoxy structure will be exemplified, but the present invention is not limited thereto.

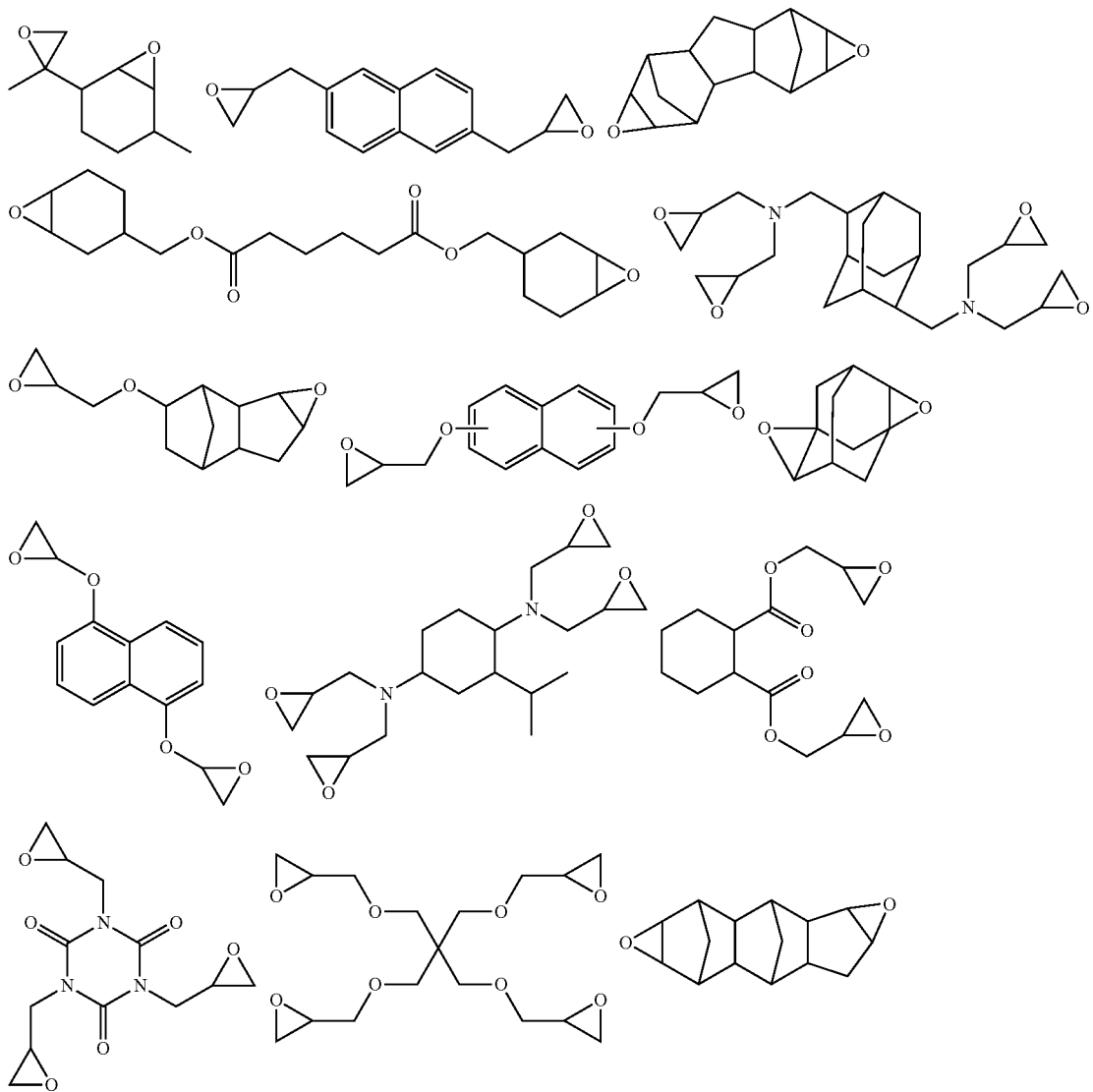

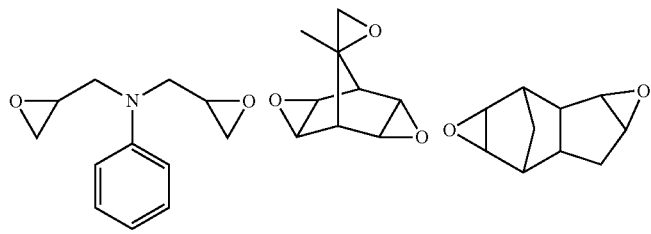
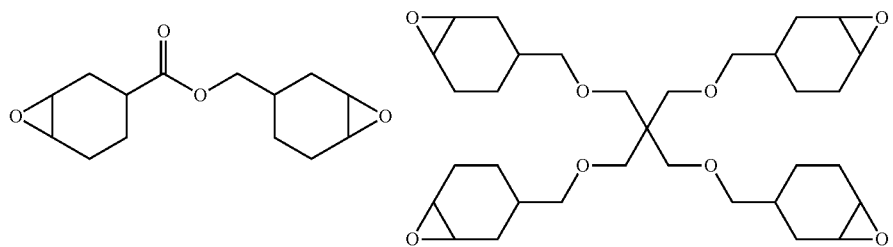
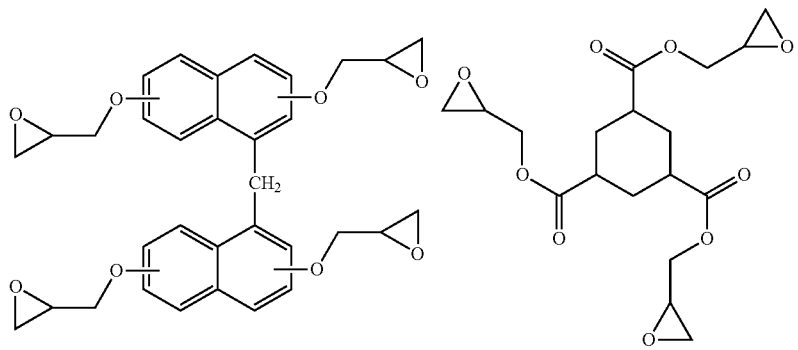
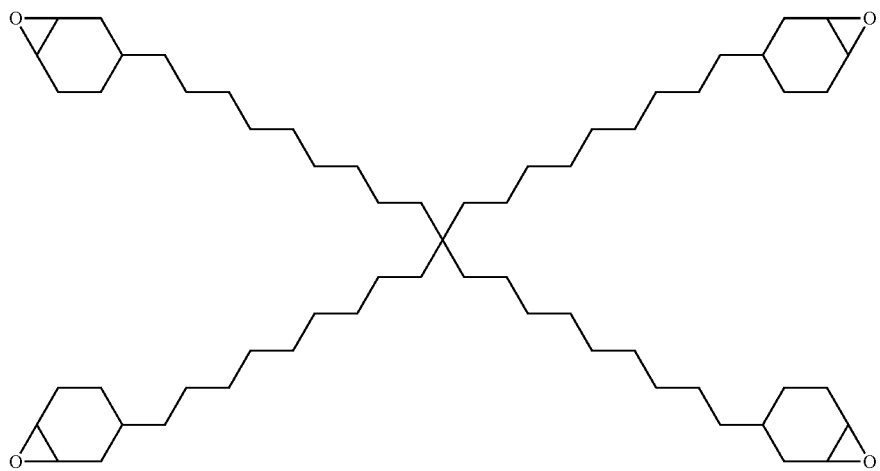

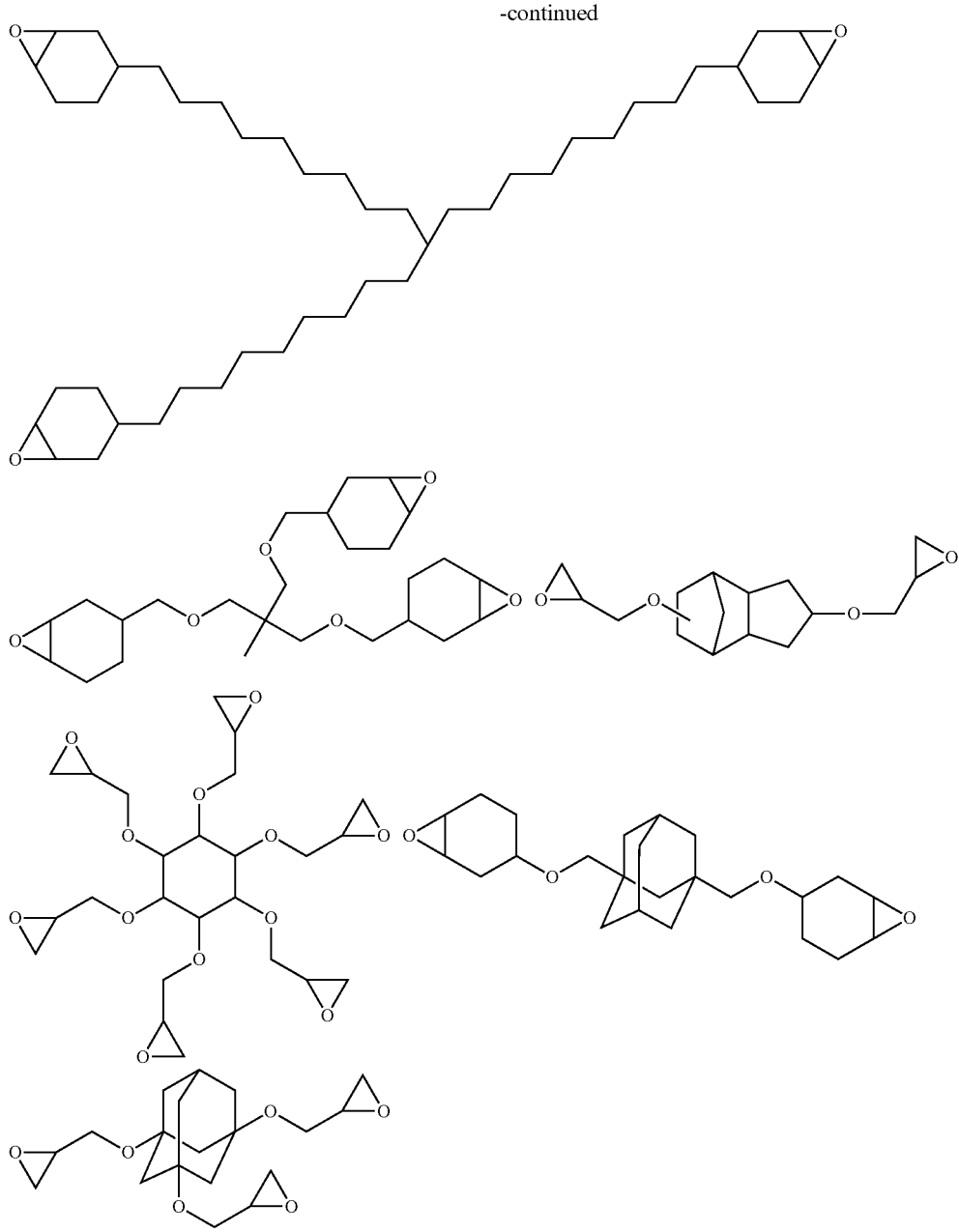

In the present invention, the curable compound may be used either alone or in combination of two or more thereof.

The total content of the curable compound in the coloring composition may vary depending on the material, but is preferably 0.1% by mass to 30% by mass, more preferably 0.2% by mass to 20% by mass, and particularly preferably 1% by mass to 10% by mass, based on the total solids (mass) of the coloring composition.

Meanwhile, when the curable compound is a polymer compound (that is, a resin), the solid acid number of the polymer compound is 80 mg KOH/g or less.

[4] Pigment Derivative

When the colored composition of the present invention contains a pigment as a colorant, it is preferred to further contain a pigment derivative in order to enhance the adsorptive properties of the dispersion resin to the pigment.

The pigment derivative refers to a compound having a structure in which a part of an organic pigment is substituted with an acidic group, a basic group or a phthalimidemethyl group. The pigment derivative preferably contains a pigment derivative having an acidic group or a basic group from the viewpoint of dispersibility and dispersion stability.

Examples of the organic pigments for constituting a pigment derivative include diketopyrrolpyrrole-based pigments, azo-based pigments, phthalocyanine-based pigments, anthraquinone-based pigments, quinacridone-based pigments, dioxazine-based pigments, perinone-based pigments, perylene-based pigments, thioindigo-based pigments, isoindoline-based pigments, isoindolinone-based pigments, quinophthalone-based pigments, threne-based pigments, metal complex-based pigments and the like.

Further, as an acidic group which the pigment derivative has, sulfonic acid, carboxylic acid and quaternary ammonium salt thereof are preferred, a carboxylic acid group and a sulfone acid group are more preferred, and a sulfone acid group is particularly preferred. As a basic group which the pigment derivative has, an amino group is preferred and a tertiary amino group is preferred.

As the pigment derivative, quinoline-based, benzimidazolone-based and isoindoline-based pigment derivatives are particularly preferred and quinoline-based and benzimidazolone-based pigment derivatives are more preferred. In particularly, a pigment derivative having the following structure is preferred.

A-B-(-C-D-E-)-$_t$  (P)

In Formula (P), A represents a partial structure selected from the following Formula (PA-1) to Formula (PA-3). B represents a single bond or a (t+1)-valent linking group. C represents a single bond, —NH—, —CONH—, —CO$_2$—, —SO$_2$NH—, —O—, —S— or —SO$_2$—. D represents a single bond, an alkylene group, a cycloalkylene group or an arylene group. E represents —SO$_3$H, —SO$_3$M (M represents an alkali metal atom), —CO$_2$H or —N(Rpa)(Rpb). Each of Rpa and Rpb independently represents an alkyl group, a cycloalkyl group or an aryl group, and Rpa and Rpb may combine with each other to form a ring. t represents an integer of 1 to 5.

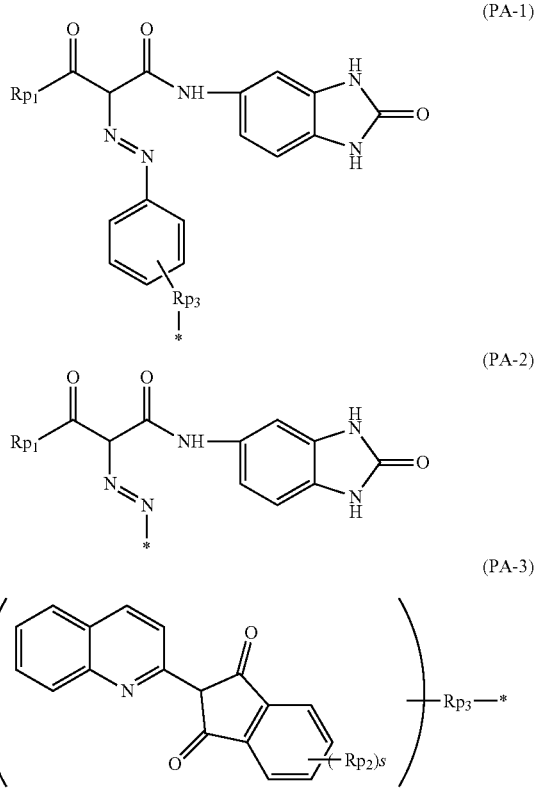

In Formula (PA-1) and Formula (PA-2), Rp1 represents an alkyl group or an aryl group having 1 to 5 carbon atoms. In Formula (PA-3), Rp2 represents a halogen atom, an alkyl group or a hydroxyl group. s represents an integer of 0 to 4. When s is 2 or higher, each Rp2 may be the same as or different from every other Rp2. In Formula (PA-1) and Formula (PA-3), Rp3 represents a single bond, —NH—, —CONH—, —CO$_2$—, —SO$_2$NH—, —O—, —S— or —SO$_2$—. * represents a linking portion with B.

In Formula (P), Rp1 is particularly preferably a methyl group or a phenyl group and most preferably a methyl group. In Formula (PA-3), Rp2 is preferably a hydrogen atom, and most preferably a chlorine atom.

In Formula (P), examples of the (t+1)-valent linking group represented by B include an alkylene group, a cycloalkylene group, an arylene group and a hetero arylene group. Among them, a linking group represented by the following structural formulas (PA-4) to (PA-9) is particularly preferred.

(PA-4)

(PA-5)

(PA-6)

(PA-7)

(PA-8)

(PA-9)

Among the structural formulas (PA-4) to (PA-9), particularly a pigment derivative having a linking group represented by structural formula (PA-5) or (PA-8) as B is preferred due to excellent dispersibility.

In Formula (P), examples of the alkylene group, cycloalkylene group and arylene group represented by D include methylene, ethylene, propylene, butylene, pentylene, hexylene, decylene, cyclopropylene, cyclobutylene, cyclopentylene, cyclohexylene, cyclooctylene, cyclodecylene, phenylene, naphthylene, and the like. Among them, an alkylene group is particularly preferred as D, and alkylene having 1 to 5 carbon atoms is most preferred.

In Formula (P), when E represents —N(Rpa)(Rpb), examples of the alkyl group, cycloalkyl group and aryl group in the Rpa and Rpb include methyl, ethyl, propyl, isopropyl, butyl, sec-butyl, tert-butyl, pentyl, isopentyl, neopentyl, hexyl, octyl, decyl, cyclopropyl, cyclobutyl, cyclopentyl, cyclohexyl, cyclooctyl, cyclodecyl, phenyl, naphthyl and the like. As the Rpa and Rpb, an alkyl group is particularly preferred, and an alkyl group having 1 to 5 carbon atoms is most preferred. The t is preferably 1 or 2.

Hereinafter, specific examples of the pigment derivatives will be shown, but the present invention is not limited thereto. Meanwhile, in the following specific examples, M represents an alkali metal (Na, K and the like).
(A-1)
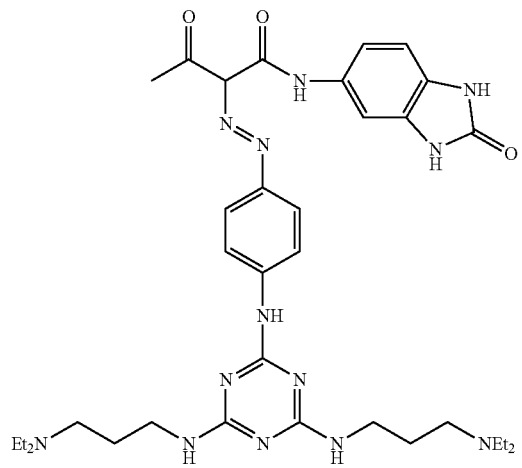
(A-2)
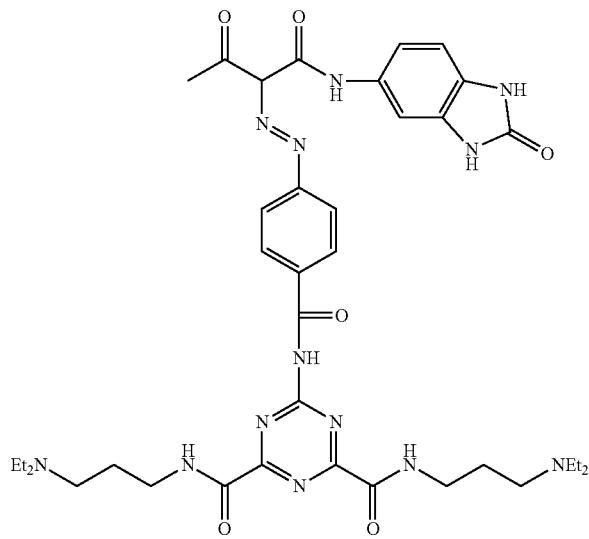
(A-3)
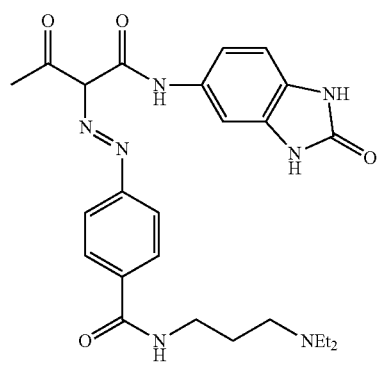
(A-4)
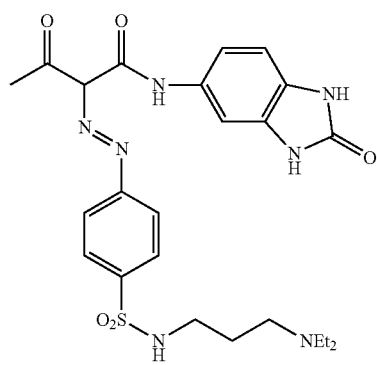
(A-5)
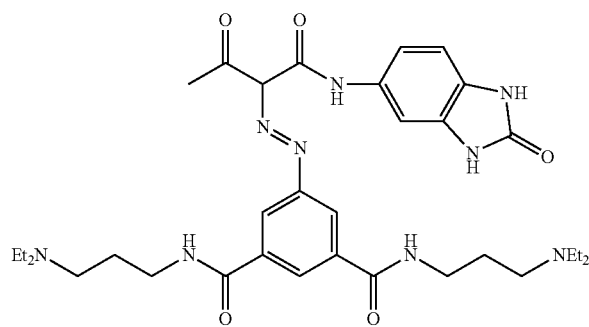
(A-6)
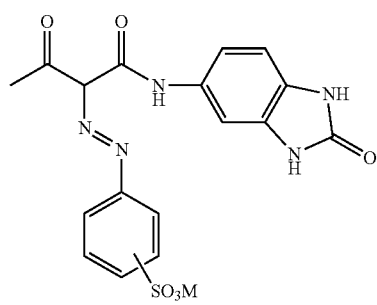
(A-7)
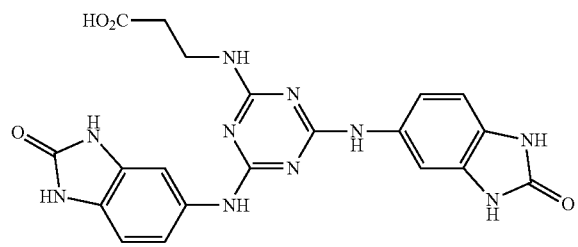

-continued
(A-8)
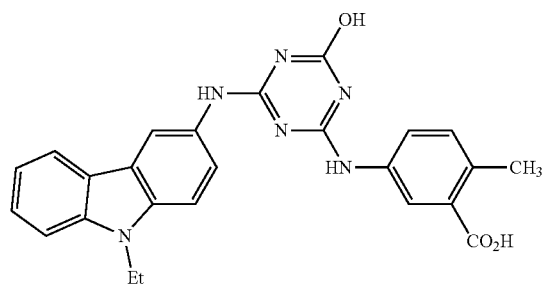
(A-9)
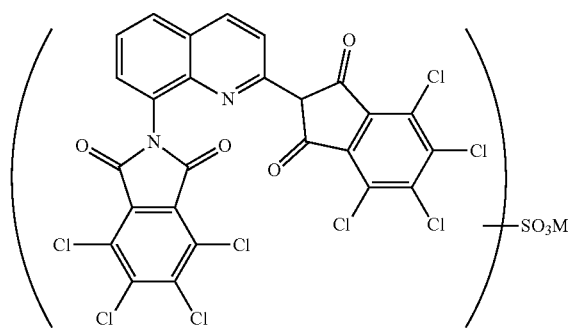
(A-10)
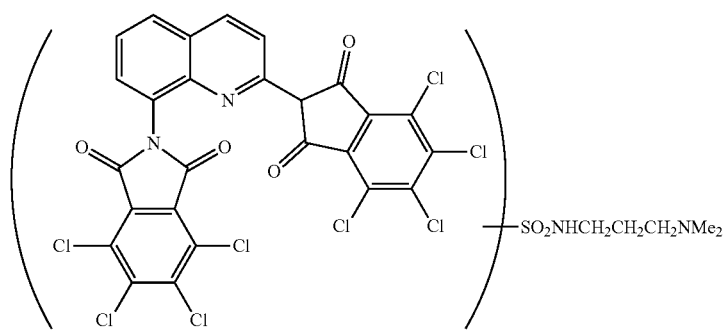
(A-11)
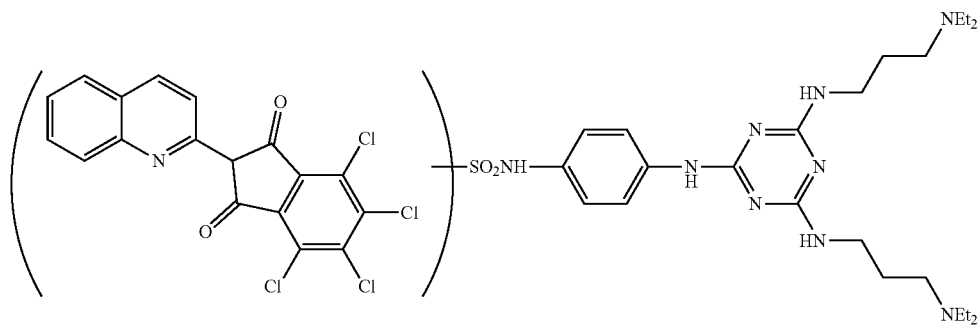
(A-12)
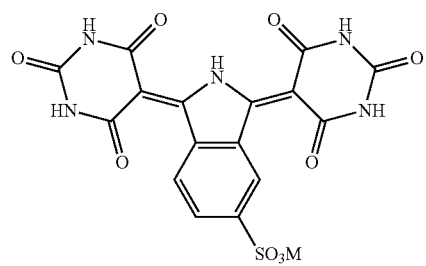
(A-13)
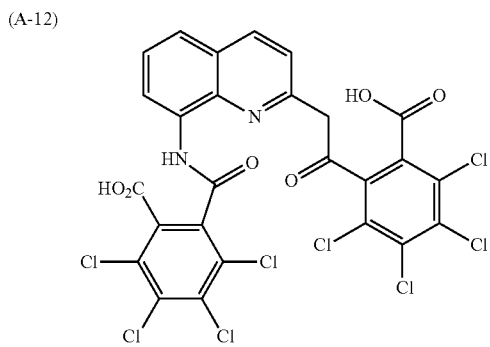
(A-14)
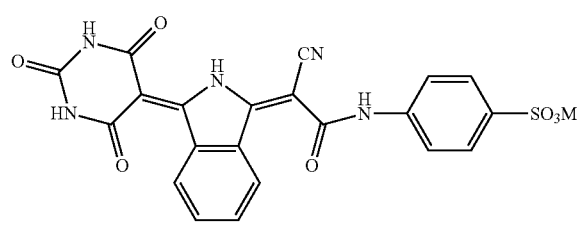

-continued
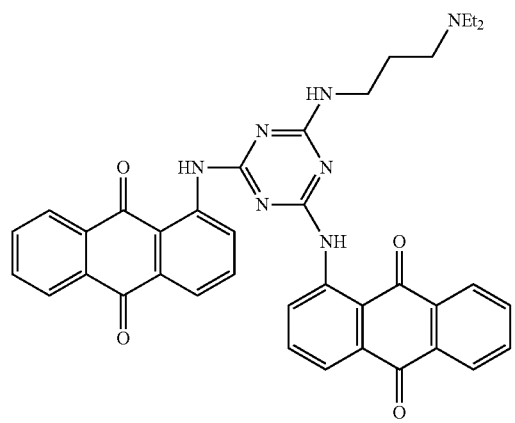
(A-15)
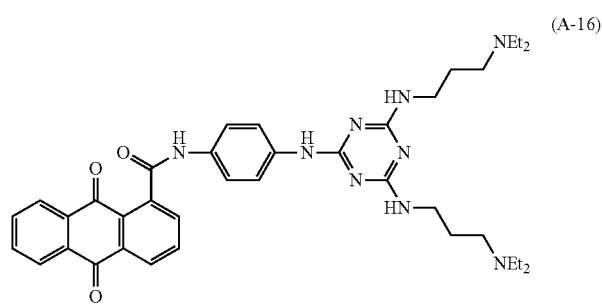
(A-16)
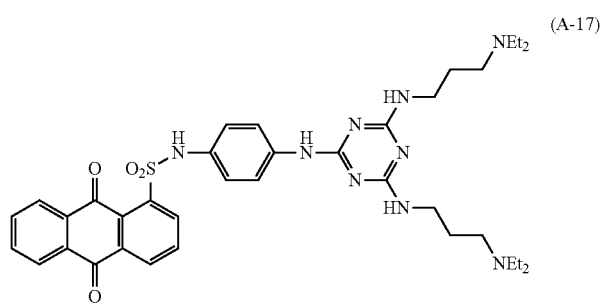
(A-17)
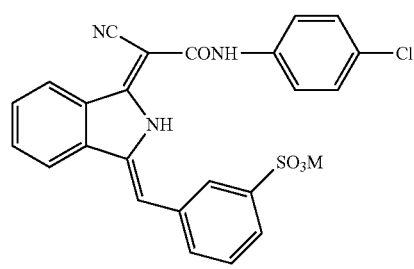
(A-18)
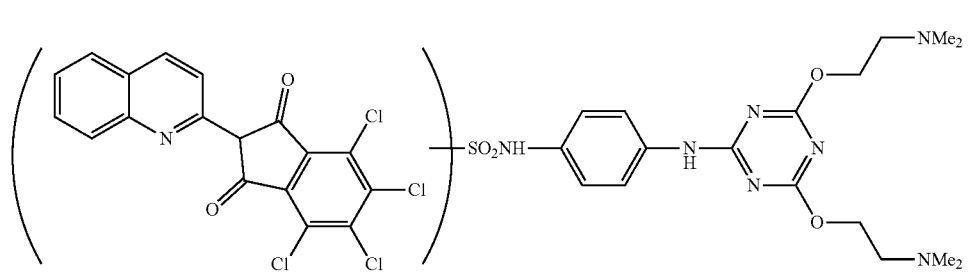
(A-19)
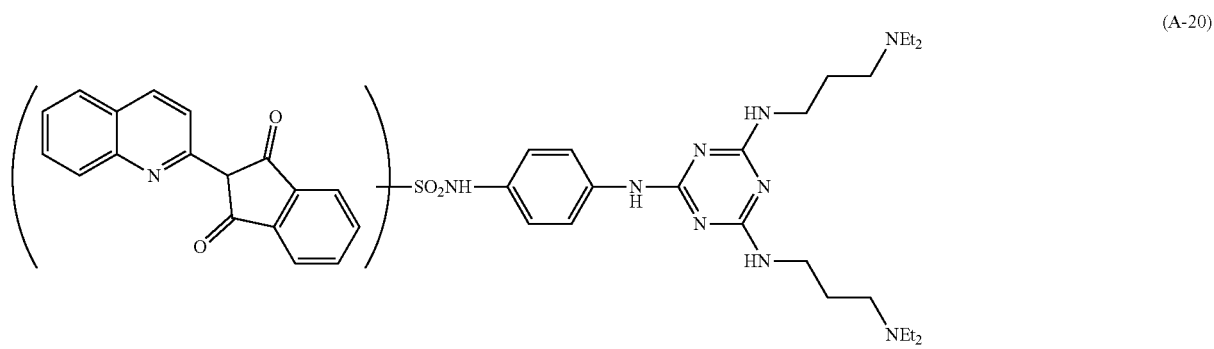
(A-20)

(A-21)
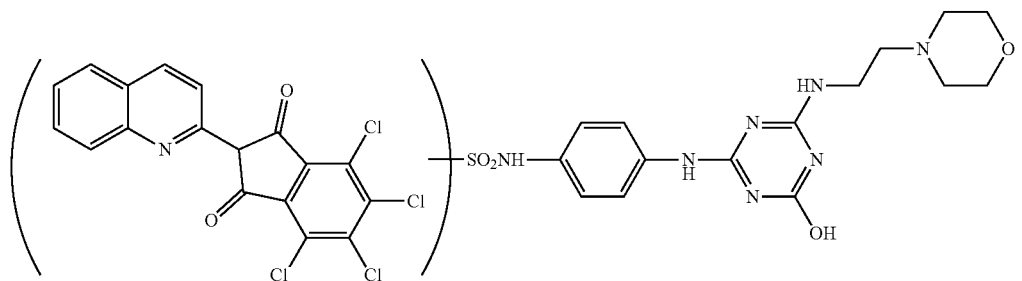
(A-22)
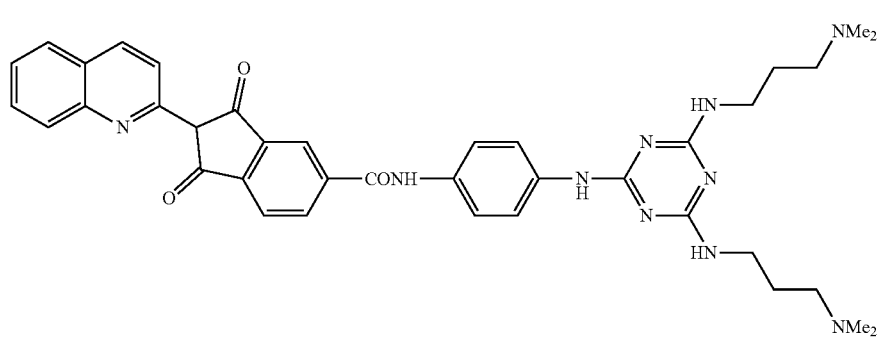
(A-23)
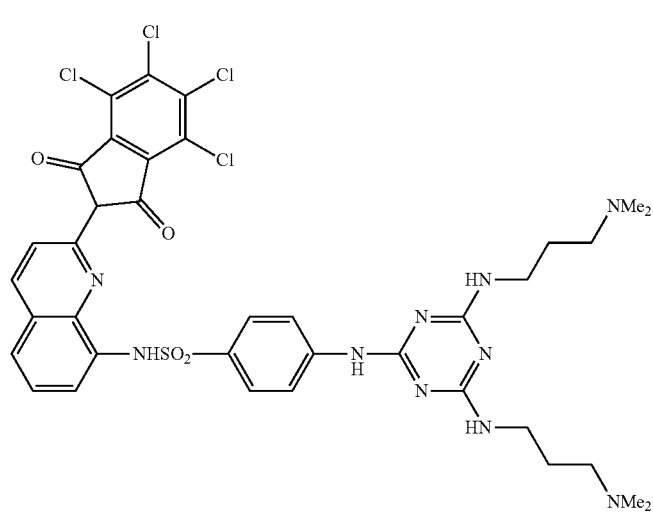
(A-24)
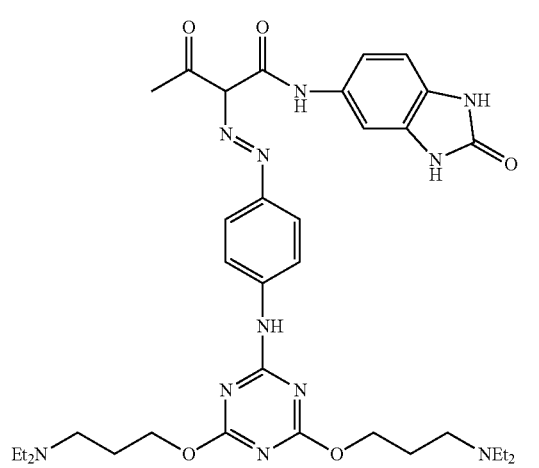

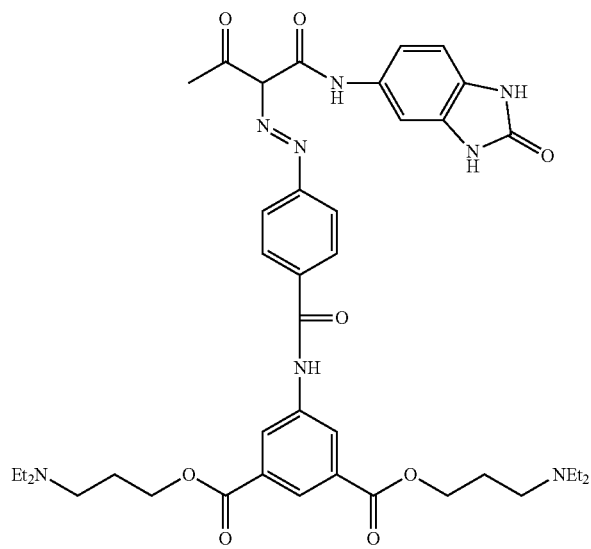
(A-25)
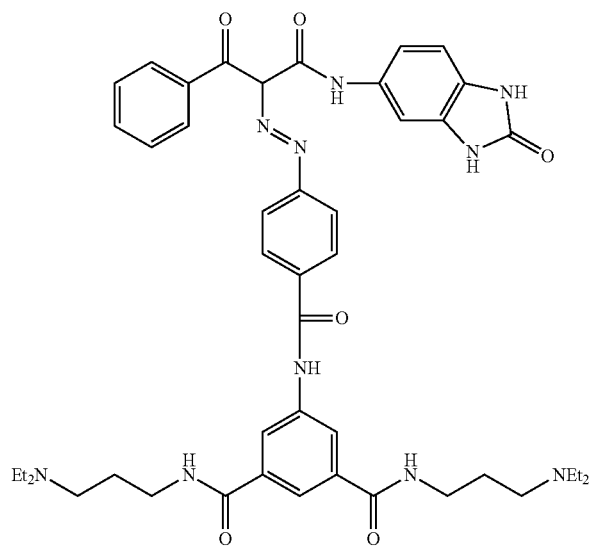
(A-26)
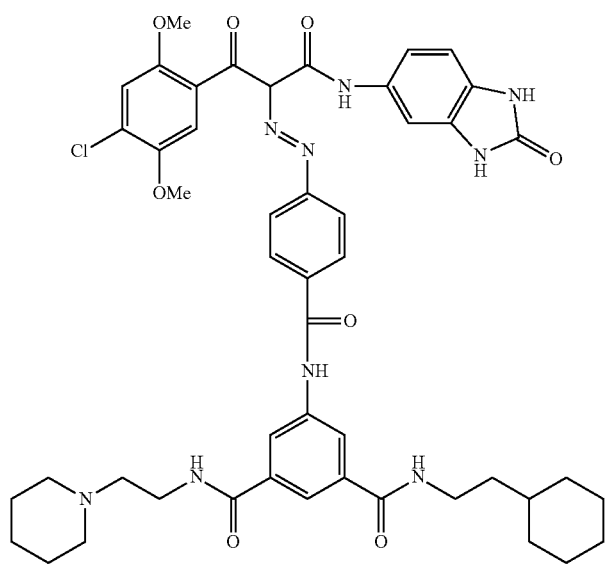
(A-27)

-continued (A-28)
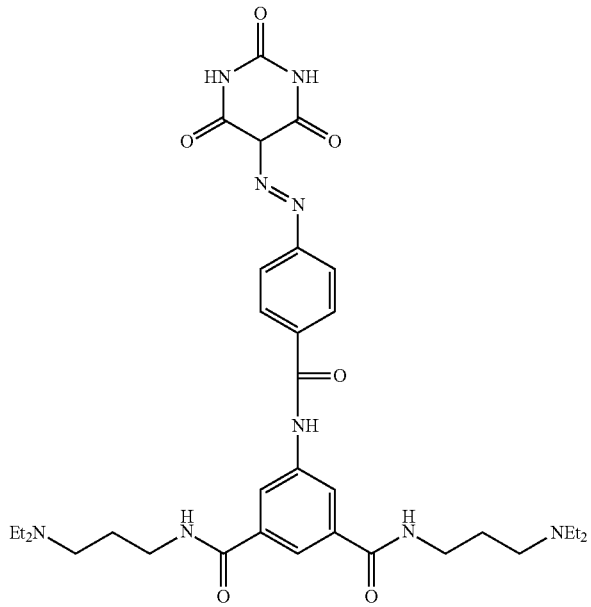

(A-29)
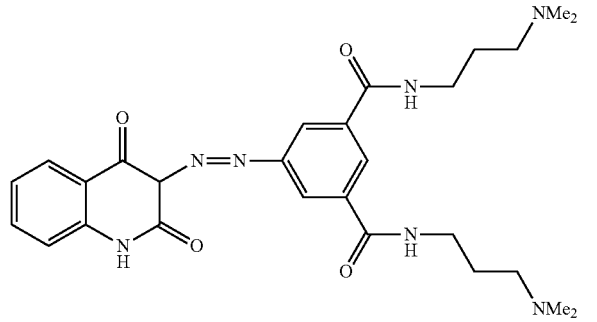

Among the pigment derivatives, preferred are (A-1), (A-2), (A-5), (A-9), (A-10), (A-11), (A-19), (A-20), (A-21), (A-22), (A-23), (A-24) and (A-25), and more preferred are (A-1), (A-2), (A-9), (A-10) and (A-23).

The content of the pigment derivative in the coloring composition of the present invention is preferably 1% by mass to 30% by mass, and more preferably 3% by mass to 20% by mass, based on the total mass of the pigment. Pigment derivatives may be used either alone or in combination of two or more thereof.

[5] Acid Anhydride

The coloring composition of the present invention may contain an acid anhydride. The crosslinking properties by heat curing of a curable compound, particularly, an epoxy compound may be improved by containing an acid anhydride.

Examples of the acid anhydride include phthalic anhydride, nadic anhydride, maleic anhydride, succinic anhydride and the like. Among them, phthalic anhydride is preferred in that the acid anhydride has a little effect on pigment dispersion.

Amine-based compounds are also commonly used as an epoxy curing agent, but are advantageous in a relatively long pot life and the like.

The content of an acid anhydride in the coloring composition is preferably 10% by mass to 40% by mass, and more preferably 15% by mass to 30% by mass, based on the content of the curable compound (particularly, epoxy compound). When the content of the acid anhydride is 10% by mass or more, the crosslinking density of a curable compound, particularly, epoxy is improved, and thus mechanical strength may be increased. When the content is 40% by mass or less, heat curing components in the coating film are suppressed, which is advantageous in increasing the concentration of a color material.

[6] Solvent

The coloring composition of the present invention may be generally composed by using a solvent (usually, organic solvent). The solvent is not basically particularly limited, as long as the solubility of each component or the coatability of the coloring curable composition is satisfied.

Examples of the organic solvent suitably include esters, for example, ethyl acetate, n-butyl acetate, isobutyl acetate, amyl formate, isoamyl acetate, isobutyl acetate, butyl propionate, isopropyl butyrate, ethyl butyrate, butyl butyrate, methyl lactate, ethyl lactate, alkyl oxyacetate (for example: methyl oxyacetate, ethyl oxyacetate, butyl oxyacetate (for example, methyl methoxyacetate, ethyl methoxyacetate, butyl methoxyacetate, methyl ethoxyacetate, ethyl ethoxyacetate and the like)), 3-oxypropionic acid alkyl esters (for example: methyl 3-oxypropionate, ethyl 3-oxypropionate and the like (for example, methyl 3-methoxypropionate, ethyl 3-methoxypropionate, methyl 3-ethoxypropionate, ethyl 3-ethoxypropionate and the like)), 2-oxypropionic acid alkyl esters (for example: methyl 2-oxypropionate, ethyl 2-oxypropionate, propyl 2-oxypropionate and the like (for example, methyl 2-methoxypropionate, ethyl 2-methoxypropionate, propyl 2-methoxypropionate, methyl 2-ethoxypropionate and ethyl 2-ethoxypropionate)), methyl 2-oxy-2-methylpropionate and ethyl 2-oxy-2-methylpropionate (for example, methyl 2-methoxy-2-methylpropionate, ethyl 2-ethoxy-2-methylpropionate and the like), methyl pyruvate, ethyl pyruvate, propyl pyruvate, methyl acetoacetate, ethyl acetoacetate, methyl 2-oxobutanoate, ethyl 2-oxobutanoate and the like, ethers, for example, diethylene glycol dimethyl ether, tetrahydrofuran, ethylene glycol monomethyl ether, ethylene glycol monoethyl ether, methyl cellosolve acetate, ethyl cellosolve acetate, diethylene glycol monomethyl ether, diethylene glycol monoethyl ether, diethylene glycol monobutyl ether, propylene glycol monomethyl ether, propylene glycol monomethyl ether acetate, propylene glycol monoethyl ether acetate, propylene glycol monopropyl ether acetate and the like, ketones, for example, methyl ethyl ketone, cyclohexanone, 2-heptanone, 3-heptanone and the like, and aromatic hydrocarbons, for example, toluene, xylene and the like.

For these solvents, a form of mixing two or more thereof is also preferred from the viewpoint of improving the coated surface shape and the like. In this case, particularly preferred is a mixed solution consisting of two or more selected from methyl 3-ethoxypropionate, ethyl 3-ethoxypropionate, ethyl cellosolve acetate, ethyl lactate, diethylene glycol dimethyl ether, butyl acetate, methyl 3-methoxypropionate, 2-heptanone, cyclohexanone, ethyl carbitol acetate, butyl carbitol acetate, propylene glycol methyl ether and propylene glycol methyl ether acetate, as described above.

From the viewpoint of coatability, the content of the solvent in the coloring composition is preferably set such that the total solids concentration of the composition becomes 5% by mass to 80% by mass, more preferably 5% by mass to 60% by mass, and particularly preferably 10% by mass to 50% by mass.

[7] Various Additives

In the coloring composition of the present invention, various additives, for example, a polymerization initiator, a polymerizable compound, a surfactant, a curing agent, a curing catalyst, a polymerization inhibitor, a silane coupling agent, a filler, an adhesion promoter, an antioxidant, a UV absorbent, an aggregation inhibitor may be blended, if necessary, in a range where the effect of the present invention is not impaired.

(Polymerization Initiator)

The coloring composition of the present invention may also contain a polymerization initiator.

As the polymerization initiator in the present invention, a polymerization initiator known as the polymerization initiators to be described below may be used.

The polymerization initiator is not particularly limited as long as the polymerization initiator has an ability to initiate the polymerization of a polymerizable compound to be described below in detail, and may be suitably selected from known polymerization initiators. For example, a polymerization initiator having photosensitivity to visible light in the ultraviolet ray region is preferred. In addition, the polymerization initiator may be an activator which causes any action with a photo-excited sensitizer to produce an active radical and may be an initiator which initiates the cationic polymerization according to the kind of the monomer.

Furthermore, it is preferred that the polymerization initiator contains at least one compound having a molecular absorption coefficient of at least about 50 within the range of about 300 nm to 800 nm (more preferably from 330 nm to 500 nm).

Examples of the polymerization initiator include a halogenated hydrocarbon derivative (for example, a compound having a triazine structure), a compound having an oxadiazole structure and the like), an acylphosphine compound such as acylphosphine oxide, hexaarylbiimidazole, an oxime compound such as oxime derivative, an organic peroxide, a thio compound, a ketone compound, an aromatic onium salt, a ketoxime ether, an aminoacetophenone compound, hydroxyacetophenone and the like.

Examples of the halogenated hydrocarbon compound having a triazine structure include the compounds as described in Wakabayashi et al., Bull. Chem. Soc. Japan, 42, 2924 (1969), the compounds as described in GB Patent No. 1388492, the compounds as described in Japanese Patent Application Laid-Open No. S53-133428, the compounds as described in German Patent No. 3337024, the compounds as described in F. C. Schaefer et al., J. Org. Chem.; 29, 1527 (1964), the compounds as described in Japanese Patent Application Laid-Open No. S62-58241, the compounds as described in Japanese Patent Application Laid-Open No. H5-281728, the compounds as described in Japanese Patent Application Laid-Open No. H5-34920, the compounds as described in U.S. Pat. No. 4,212,976 and the like.

Examples of the compounds as described in U.S. Pat. No. 4,212,976 include a compound having an oxadiazole structure (for example, 2-trichloromethyl-5-phenyl-1,3,4-oxadiazole, 2-trichloromethyl-5-(4-chlorophenyl)-1,3,4-oxadiazole, 2-trichloromethyl-5-(1-naphthyl)-1,3,4-oxadiazole, 2-trichloromethyl-5-(2-naphthyl)-1,3,4-oxadiazole, 2-tribromomethyl-5-phenyl-1,3,4-oxadiazole, 2-tribromomethyl-5-(2-naphthyl)-1,3,4-oxadiazole; 2-trichloromethyl-5-styryl-1,3,4-oxadiazole, 2-trichloromethyl-5-(4-chlorostyryl)-1,3,4-oxadiazole, 2-trichloromethyl-5-(4-methoxystyryl)-1,3,4-oxadiazole, 2-trichloromethyl-5-(1-naphthyl)-1,3,4-oxadiazole, 2-trichloromethyl-5-(4-n-buthoxystyryl)-1,3,4-oxadiazole, 2-tribromomethyl-5-styryl-1,3,4-oxadiazole and the like) and the like.

Further, examples of the polymerization initiator other than the polymerization initiators described above include an acridine derivative (for example, 9-phenylacridine, 1,7-bis(9,9'-acridinyl)heptane and the like), N-phenylglycine and the like, a polyhalogen compound (for example, carbon tetrabromide, phenyl tribromomethyl sulfone, phenyl trichloromethyl ketone and the like), coumarins (for example, 3-(2-benzofuranoyl)-7-diethylaminocoumarin, 3-(2-benzofuroyl)-7-(1-pyrrolidinyl)coumarin, 3-benzoyl-7-diethylaminocoumarin, 3-(2-methoxybenzoyl)-7-diethylaminocoumarin, 3-(4-dimethylaminobenzoyl)-7-diethylaminocoumarin, 3,3'-carbonylbis(5,7-di-n-propoxycoumarin), 3,3'-carbonylbis(7-diethylaminocoumarin), 3-benzoyl-7-methoxycoumarin, 3-(2-furoyl)-7-diethylaminocoumarin, 3-(4-diethylaminocinnamoyl)-7-diethylaminocoumarin, 7-methoxy-3-(3-pyridylcarbonyl)coumarin, 3-benzoyl-5,7-dipropoxycoumarin, 7-benzotriazol-2-ylcoumarin, coumarin compounds as described in Japanese Patent Application Laid-Open Nos. H5-19475, H7-271028, 2002-363206, 2002-363207, 2002-363208 and 2002-363209, and the like), acylphosphine oxides (for example, bis(2,4,6-trimethylbenzoyl)-phenylphosphine oxide, bis(2,6-dimethoxybenzoyl)-2,4,4-trimethyl-pentylphenylphosphine oxide, LucirinTPO and the like), metallocenes (for example, bis(η5-2,4-cyclopentadien-1-yl)-bis(2,6-difluoro-3-(1H-pyrrol-1-yl)-phenyl)titanium, η5-cyclopentadienyl-η6-cumenyl-iron(1+)-hexafluorophosphate (1−) and the like), the compounds as described in Japanese Patent Application Laid-Open No. S53-133428, Japanese Patent Publication Nos. S57-1819 and S57-6096 and U.S. Pat. No. 3,615,455, and the like.

Examples of the ketone compound include benzophenone, 2-methylbenzophenone, 3-methylbenzophenone, 4-methylbenzophenone, 4-methoxybenzophenone, 2-chlorobenzophenone, 4-chlorobenzophenone, 4-bromobenzophenone, 2-carboxybenzophenone, 2-ethoxycarbonylbenzophenone, benzophenone tetracarboxylic acid or a tetramethyl ester thereof, 4,4'-bis(dialkylamino)benzophenones (for example, 4,4'-bis(dimethylamino)benzophenone, 4,4'-bisdicyclohexylamino)benzophenone, 4,4'-bis(diethylamino)benzophenone, 4,4'-bis(dihydroxyethylamino)benzophenone, 4-methoxy-4'-dimethylaminobenzophenone, 4,4'-dimethoxybenzophenone, 4-dimethylaminobenzophenone, 4-dimethylaminoacetophenone, benzyl, anthraquinone, 2-t-butylanthraquinone, 2-methylanthraquinone, phenanthraquinone, xanthone, thioxanthone, 2-chloro-thioxanthone, 2,4-diethylthioxanthone, fluorenone, 2-benzyl-dimethylamino-1-(4-morpholinophenyl)-1-butanone, 2-methyl-1-[4-(methylthio)phenyl]-2-morpholino-1-propanone, 2-hydroxy-2-methyl-[4-(1-methylvinyl)phenyl]propanol oligomer, benzoin, benzoin ethers (for example, benzoin methyl ether, benzoin ethyl ether, benzoin propyl ether, benzoin isopropyl ether, benzoin phenyl ether, benzyl dimethyl ketal), acridone, chloroacridone, N-methylacridone, N-butylacridone, N-butyl-chloroacridone and the like.

As the polymerization initiator, a hydroxyacetophenone compound, an aminoacetophenone compound and an acylphosphine compound may also be suitably used. More specifically, for example, an aminoacetophenone-based initiator as described in Japanese Patent Application Laid-Open No. F110-291969 and an acylphosphine oxide-based initiator as described in Japanese Patent No. 4225898 may also be used.

As the hydroxyacetophenone-based initiator, IRGACURE-184, DAROCUR-1173, IRGACURE-500, IRGACURE-2959 and IRGACURE-127 (trade names: all manufactured by BASF Corp.) may be used. As the aminoacetophenone-based initiator, commercially available products IRGACURE-907, IRGACURE-369 and IRGACURE-379 (trade names: all manufactured by BASF Corp.) may be used. As the aminoacetophenone-based initiator, the compounds as described in Japanese Patent Application Laid-Open No. 2009-191179, where the absorption wavelength matches the light source having a long wavelength such as 365 nm or 405 nm, may also be used. In addition, as the acylphosphine-based initiator, commercially available products IRGACURE-819 or DAROCUR-TPO (trade names: all manufactured by BASF Corp.) may be used.

The polymerization initiator more preferably includes an oxime-based compound. As specific examples of the oxime-based initiator, the compounds as described in Japanese Patent Application Laid-Open No. 2001-233842, the compounds as describe in Japanese Patent Application Laid-Open No. 2000-80068 and the compounds as described in Japanese Patent Application Laid-Open No. 2006-342166 may be used.

Examples of the oxime compound such as oxime derivative, which is suitably used as the polymerization initiator in the present invention, include 3-benzoyloxyiminobutan-2-one, 3-acetoxyiminobutan-2-one, 3-propionyloxyiminobutan-2-one, 2-acetoxyiminopentan-3-one, 2-acetoxyimino-1-phenylpropan-1-one, 2-benzoyloxyimino-1-phenylpropan-1-one, 3-(4-toluenesulfonyloxy)iminobutan-2-one, 2-ethoxycarbonyloxyimino-1-phenylpropan-1-one and the like.

Examples of the oxime compounds include the compounds as described in J. C. S. Perkin II (1979) pp. 1653-1660, J. C. S. Perkin II (1979) pp. 156-162, Journal of Photopolymer Science and Technology (1995) pp 202-232, Japanese Patent Application Laid-Open Nos. 2000-66385 and 2000-80068, Japanese Patent Application Laid-Open No. 2004-534797, Japanese Patent Application Laid-Open No. 2006-342166, and the like.

As the commercially available product, IRGACURE-OXE01 (manufactured by BASF Corp.) and IRGACURE-OXE02 (manufactured by BASF Corp.) may also be suitably used.

In addition, as the oxime compound other than oxime compounds described above, the compounds as described in Japanese Patent Application Laid-Open No. 2009-519904, where oxime is linked to the N-position of carbazole, the compounds as described in U.S. Pat. No. 7,626,957, where a hetero-substituent is introduced into the benzophenone moiety, the compounds as described in Japanese Patent Application Laid-Open No. 2010-15025 and U.S. Patent Application Publication No. 2009-292039, where a nitro group is introduced into the dye moiety, the ketoxime-based compounds as described in International Publication No. 2009-131189, the compounds as described in U.S. Pat. No. 7,556,910, containing a triazine structure and an oxime structure within the same molecule, the compounds as described in Japanese Patent Application Laid-Open No. 2009-221114, having an absorption maximum at 405 nm and exhibiting good sensitivity for a g-ray light source, and the like may also be used.

Preferably, furthermore, cyclic oxime compounds as described in Japanese Patent Application Laid-Open No. 2007-231000 and Japanese Patent Application Laid-Open No. 2007-322744 may also be suitably used. Among cyclic oxime compounds, the cyclic oxime compounds condensed to a carbazole dye, as described in Japanese Patent Application Laid-Open No. 2010-32985 and Japanese Patent Application Laid-Open No. 2010-185072, have high light absorptivity and thus are particularly preferred from the viewpoint of high sensitivity.

Further, in the compounds as described in Japanese Patent Application Laid-Open No. 2009-242469, having an unsaturated bond at a specific site of an oxime compound, high sensitivity may also be achieved by regenerating an active radical from a polymerization inactive radical, and thus the compounds may be suitably used.

Most preferred is the oxime compound having a specific substituent as described in Japanese Patent Application Laid-Open No. 2007-269779 or the oxime compound having a thioaryl group as described in Japanese Patent Application Laid-Open No. 2009-191061.

Specifically, the oxime-based polymerization initiator compound is preferably a compound represented by the following formula (OX-1). In addition, the N—O bond of the oxime bond may be an oxime compound of (E) form, an oxime compound of (Z) form, or a mixture of (E) form and (Z) form.

(OX-1)

(in Formula (OX-1), each of R and B independently represents a monovalent substituent, A represents a divalent organic group, and Ar represents an aryl group).

In Formula (OX-1), the monovalent substituent represented by R is preferably a monovalent nonmetallic atom group.

Examples of the monovalent nonmetallic atom group include an alkyl group, an aryl group, an acyl group, an alkoxycarbonyl group, an aryloxycarbonyl group, a heterocyclic group, an alkylthiocarbonyl group, an arylthiocarbonyl group and the like. Further, these groups may have one or more substituents. In addition, the above-described substituent may be substituted with another substituent.

Examples of the substituent include a halogen atom, an aryloxy group, an alkoxycarbonyl group, or an aryloxycarbonyl group, an acyloxy group, an acyl group, an alkyl group, an aryl group and the like.

As the alkyl group which may have a substituent, an alkyl group having 1 to 30 carbon atoms is preferred, and specific examples thereof include a methyl group, an ethyl group, a propyl group, a butyl group, a hexyl group, an octyl group, a decyl group, a dodecyl group, an octadecyl group, an isopropyl group, an isobutyl group, a sec-butyl group, a t-butyl group, a 1-ethylpentyl group, a cyclopentyl group, a cyclohexyl group, a trifluoromethyl group, a 2-ethylhexyl group, a phenacyl group, a 1-naphthoylmethyl group, a 2-naphthoylmethyl group, a 4-methylsulfanylphenacyl group, a 4-phenylsulfanylphenacyl group, a 4-dimethylaminophenacyl group, a 4-cyanophenacyl group, a 4-methylphenacyl group, a 2-methylphenacyl group, a 3-fluorophenacyl group, a 3-trifluoromethylphenacyl group and a 3-nitrophenacyl group.

As the aryl group which may have a substituent, an aryl group having 6 to 30 carbon atoms is preferred, and specific examples thereof include a phenyl group, a biphenyl group, a 1-naphthyl group, a 2-naphthyl group, a 9-anthryl group, a 9-phenanthryl group, a 1-pyrenyl group, a 5-naphthacenyl group, a 1-indenyl group, a 2-azulenyl group, a 9-fluorenyl group, a terphenyl group, a quarter phenyl group, an o-tolyl group, a m-tolyl group, p-tolyl group, a xylyl group, an o-cumenyl group, a m-cumenyl group, a p-cumenyl group, a mesityl group, a pentalenyl group, a binaphthalenyl group, a ternaphthalenyl group, a quarter naththalenyl group, a heptalenyl group, a biphenylenyl group, an indacenyl group, a fluoranthenyl group, an acenaphthylenyl group, an aceanthrylenyl group, a phenalenyl group, a fluorenyl group, an anthryl group, a bianthracenyl group, a teranthracenyl group, a quarter anthracenyl group, an anthraquinolyl group, a phenanthryl group, a triphenylenyl group, a pyrenyl group, a chrysenyl group, a naphthacenyl group, a pleiadenyl group, a picenyl group, a perylenyl group, a pentaphenyl group, a pentacenyl group, a tetraphenylenyl group, a hexaphenyl group, a hexacenyl group, a rubicenyl group, a coronenyl group, a trinaphthylenyl group, a heptaphenyl group, a heptacenyl group, a pyranthrenyl group and an ovalenyl group.

As the acyl group which may have a substituent, an acyl group having 2 to 20 carbon atoms is preferred, and specific examples thereof include an acetyl group, a propanoyl group, a butanoyl group, a trifluoroacetyl group, a pentanoyl group, a benzoyl group, a 1-naphthoyl group, a 2-naphthoyl group, a 4-methylsulfanylbenzoyl group, a 4-phenylsulfanylbenzoyl group, a 4-dimethylaminobenzoyl group, a 4-diethylaminobenzoyl group, a 2-chlorobenzoyl group, a 2-methylbenzoyl group, a 2-methoxybenzoyl group, a 2-butoxybenzoyl group, a 3-chlorobenzoyl group, a 3-trifluoromethylbenzoyl group, a 3-cyanobenzoyl group, a 3-nitrobenzoyl group, a 4-fluorobenzoyl group, a 4-cyanobenzoyl group and a 4-methoxybenzoyl group.

As the alkoxycarbonyl group which may have a substituent, an alkoxycarbonyl group having 2 to 20 carbon atoms is preferred, and specific examples thereof include a methoxycarbonyl group, an ethoxycarbonyl group, a propoxycarbonyl group, a butoxycarbonyl group, a hexyloxycarbonyl group, an octyloxycarbonyl group, a decyloxycarbonyl group, an octadecyloxycarbonyl group and a trifluoromethyloxycarbonyl group.

Specific examples of the aryloxycarbonyl group which may have a substituent include a phenoxycarbonyl group, a 1-naphthyloxycarbonyl group, a 2-naphthyloxycarbonyl group, a 4-methylsulfanylphenyloxycarbonyl group, a 4-phenylsulfanylphenyloxycarbonyl group, a 4-dimethylaminophenyloxycarbonyl group, a 4-diethylaminophenyloxycarbonyl group, a 2-chlorophenyloxycarbonyl group, a 2-methylphenyloxycarbonyl group, a 2-methoxyphenyloxycarbonyl group, a 2-butoxyphenyloxycarbonyl group, a 3-chlorophenyloxycarbonyl group, a 3-trifluoromethylphenyloxycarbonyl group, a 3-cyanophenyloxycarbonyl group, a 3-nitrophenyloxycarbonyl group, a 4-fluorophenyloxycarbonyl group, a 4-cyanophenyloxycarbonyl group and a 4-methoxyphenyloxycarbonyl group.

As the heterocyclic group which may have a substituent, an aromatic or aliphatic heterocycle including a nitrogen atom, an oxygen atom, a sulfur atom or a phosphorus atom is preferred.

Specific examples thereof include a thienyl group, a benzo[b]thienyl group, a naphtho[2,3-b]thienyl group, a thianthrenyl group, a furyl group, a pyranyl group, an isobenzofuranyl group, a chromenyl group, a xanthenyl group, a phenoxathiinyl group, a 2H-pyrrolyl group, a pyrrolyl group, an imidazolyl group, a pyrazolyl group, a pyridyl group, a pyrazinyl group, a pyrimidinyl group, a pyridazinyl group, an indolizinyl group, an isoindolyl group, a 3H-indolyl group, an indolyl group, a 1H-indazolyl group, a purinyl group, a 4H-quinolizinyl group, an isoquinolyl group, a quinolyl group, a phthalazinyl group, a naphthyridinyl group, a quinoxalinyl group, a quinazolinyl group, a cinnolinyl group, a pteridinyl group, a 4aH-carbazolyl group, a carbazolyl group, a β-carbolinyl group, a phenanthridinyl group, an acridinyl group, a perimidinyl group, a phenanthrolinyl group, a phenazinyl group, a phenarsazinyl group, an isothiazolyl group, a phenothiazinyl group, an isoxazolyl group, a furazanyl group, a phenoxazinyl group, an isochromanyl group, a chromanyl group, a pyrrolidinyl group, a pyrrolinyl group, an imidazolidinyl group, an imidazolinyl group, a pyrazolidinyl group, a pyrazolinyl group, a piperidyl group, a piperazinyl group, an indolinyl group, an isoindolinyl group, a quinuclidinyl group, a morpholinyl group and a thioxantholyl group.

Specific examples of the alkylthiocarbonyl group which may have a substituent include a methylthiocarbonyl group, a propylthiocarbonyl group, a butylthiocarbonyl group, a hexylthiocarbonyl group, an octylthiocarbonyl group, a decylthiocarbonyl group, an octadecylthiocarbonyl group and a trifluoromethyl thiocarbonyl group.

Specific examples of the arylthiocarbonyl group which may have a substituent include a 1-naphthylthiocarbonyl group, a 2-naphthylthiocarbonyl group, a 4-methylsulfanylphenylthiocarbonyl group, a 4-phenylsulfanylphenylthiocarbonyl group, a 4-dimethylaminophenylthiocarbonyl group, a 4-diethylaminophenylthiocarbonyl group, a 2-chlorophenylthiocarbonyl group, a 2-methylphenylthiocarbonyl group, a 2-methoxyphenylthiocarbonyl group, a 2-butoxyphenylthiocarbonyl group, a 3-chlorophenylthiocarbonyl group, a 3-trifluoromethylphenylthiocarbonyl group, a 3-cyanophenylthiocarbonyl group, a 3-nitrophenylthiocarbonyl group, a 4-fluorophenylthiocarbonyl group, a 4-cyanophenylthiocarbonyl group and a 4-methoxyphenylthiocarbonyl group.

In the Formula (OX-1), the monovalent substituent represented by B represents an aryl group, a heterocyclic group, an arylcarbonyl group or a heterocyclic carbonyl group. In addition, these groups may have one or more substituents. As the substituent, the above-described substituents may be exemplified. Further, the above-described substituent may be substituted with another substituent.

Among them, structures shown below are particularly preferred.

In the structures, Y, X and n have the same meanings as Y, X and n in Formula (OX-2) described below, and preferred examples thereof are also the same.

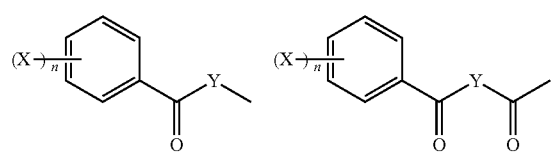

In the Formula (OX-1), examples of the divalent organic group represented by A include an alkylene group having 1 to 12 carbon atoms, a cycloalkylene group having 6 to 12 carbon atoms and an alkynylene group having 2 to 12 carbon atoms. Further, these groups may have one or more substituents. As the substituent, the above-described substituents may be exemplified. In addition, the above-described substituent may be substituted with another substituent.

Among them, from the viewpoint of increasing the sensitivity to suppress the coloration as the heating time passes, A in Formula (OX-1) is preferably an unsubstituted alkylene group, an alkylene group substituted with an alkyl group (for example, a methyl group, an ethyl group, a tert-butyl group and a dodecyl group), an alkylene group substituted with an alkenyl group (for example, a vinyl group and an allyl group), and an alkylene group substituted with an aryl group (for example, a phenyl group, a p-tolyl group, a xylyl group, a cumenyl group, a naphthyl group, an anthryl group, a phenanthryl group and a styryl group).

In Formula (OX-1), the aryl group represented by Ar is preferably an aryl group having from 6 to 30 carbon atoms, and may have a substituent. As the substituent, the substituents introduced into the substituted aryl group exemplified above as a specific example of the aryl group which may have a substituent may be exemplified.

Among them, from the viewpoint of increasing the sensitivity to suppress the coloration as the heating time passes, a substituted or unsubstituted phenyl group is preferred.

In Formula (OX-1), from the viewpoint of the sensitivity, the structure of "SAr" formed by Ar in Formula (OX-1) and S adjacent thereto is preferably the structure shown below. Further, Me represents a methyl group, and Et represents an ethyl group.

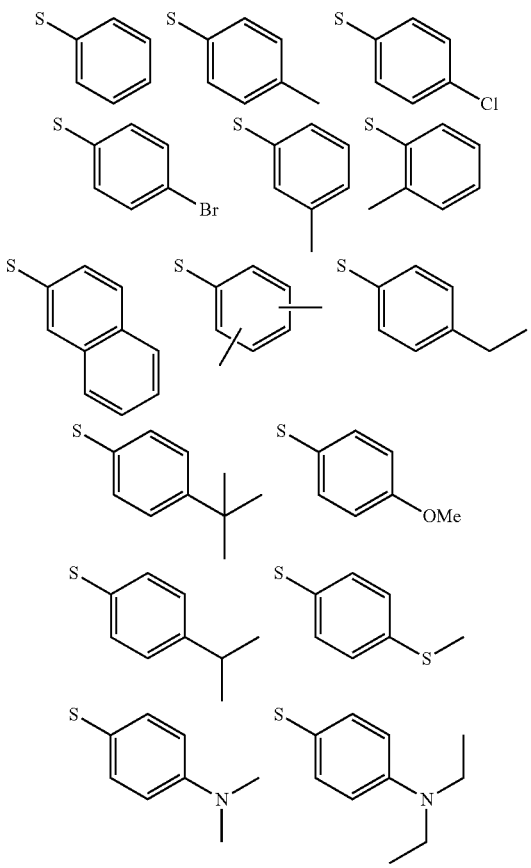

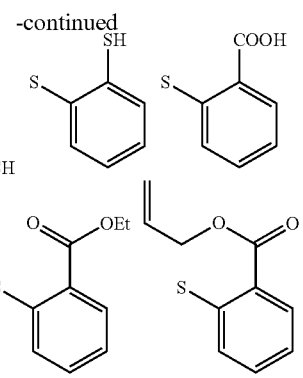

The oxime compound is preferably a compound represented by the following formula (OX-2).

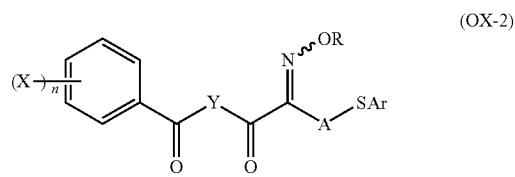

(OX-2)

(In Formula (OX-2), each of R and X independently represents a monovalent substituent, each of A and Y independently represents a divalent organic group, Ar represents an aryl group, and n is an integer of 0 to 5.)

In Formula (OX-2), R, A and Ar have the same meanings as R, A and Ar in Formula (OX-1), and preferred examples thereof are also the same.

In Formula (OX-2), examples of the monovalent substituent represented by X include an alkyl group, an aryl group, an alkoxy group, an aryloxy group, an acyloxy group, an acyl group, an alkoxycarbonyl group, an amino group, a heterocyclic group, and a halogen atom. Further, these groups may have one or more substituents. As the substituent, the above-described substituents may be exemplified. Further, the above-described substituent may be substituted with another substituent.

Among them, from the viewpoint of solvent solubility and enhancement of absorption efficiency in the long wavelength region, X in Formula (OX-2) is preferably an alkyl group.

In addition, In Formula (OX-2), n represents an integer of 0 to 5, and preferably an integer of 0 to 2.

In Formula (OX-2), examples of the divalent organic group represented by Y include structures shown below. Meanwhile, in the groups shown below, "*" represents a bonding position to the carbon atom adjacent to Y in Formula (OX-2).

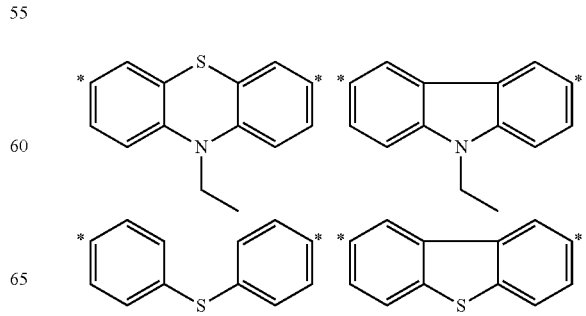

-continued

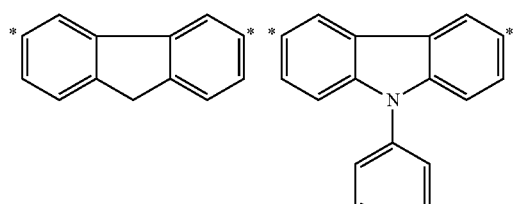

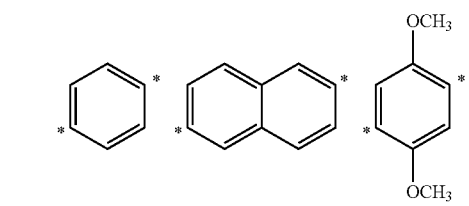

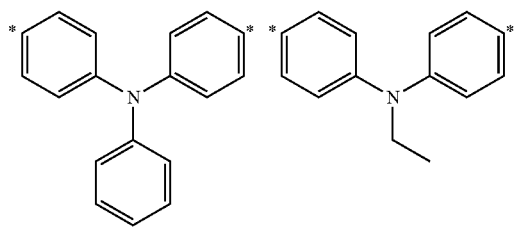

Among them, from the viewpoint of high sensitivity, structures shown below are preferred.

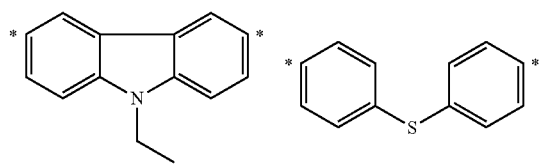

Further, the oxime compound is preferably a compound represented by the following formula (OX-3).

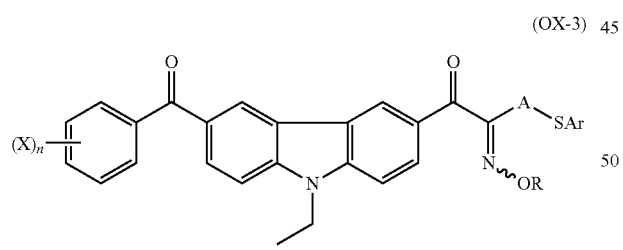

(OX-3)

(In Formula (OX-3), each of R and X independently represents a monovalent substituent, A represents a divalent organic group, Ar represents an aryl group, and n is an integer of from 0 to 5.)

In Formula (OX-3), R, X, A, Ar and n have the same meanings as R, X, A, Ar and n in Formula (OX-2), and preferred examples thereof are also the same.

Hereinafter, specific examples (B-1) to (B-10) of oxime compounds which are suitably used will be shown, but the present invention is not limited thereto.

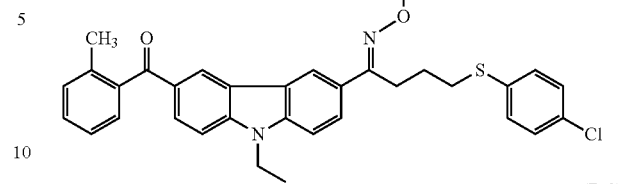
(B-1)

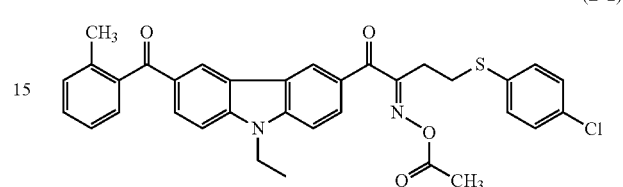
(B-2)

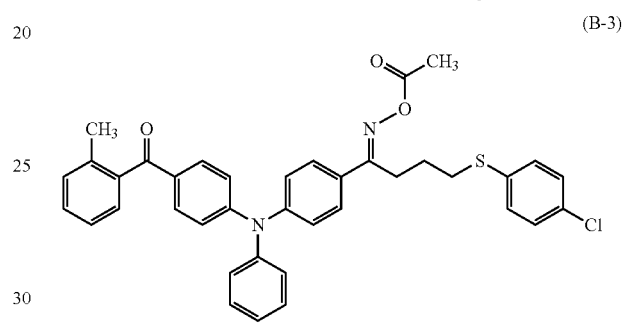
(B-3)

(B-4)

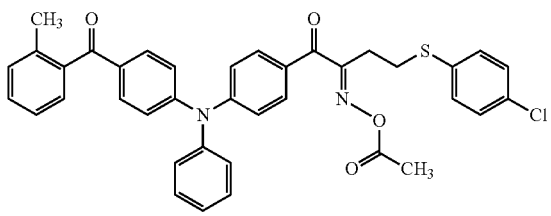
(B-5)

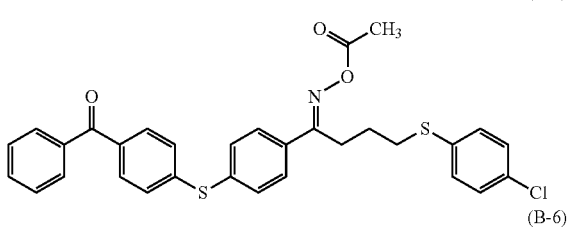
(B-6)

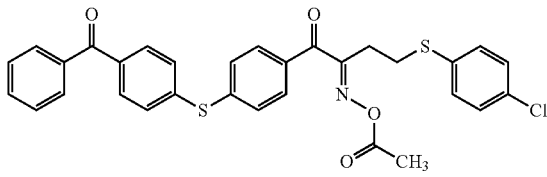
(B-7)

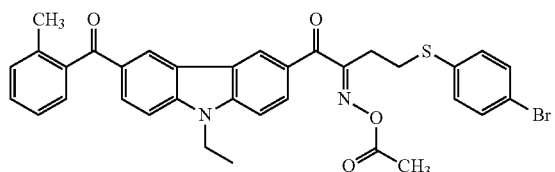

(B-8)

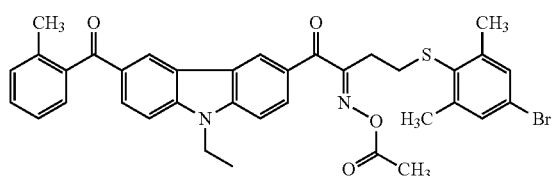

(B-9)

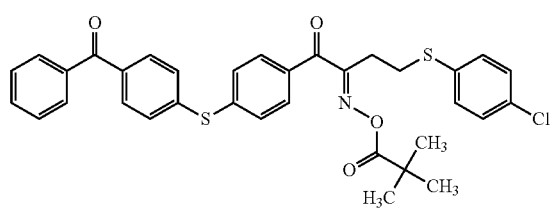

(B-10)

The oxime compound has a maximum absorption wavelength in the wavelength region of 350 nm to 500 nm, preferably an absorption wavelength in the wavelength region of 360 nm to 480 nm and particularly preferably a high absorbance of 365 nm to 455 nm.

The oxime compound has a molar absorption coefficient of preferably 1,000 to 300,000, more preferably 2,000 to 300,000, and particularly preferably 5,000 to 200,000 in 365 nm or 405 nm, from the viewpoint of sensitivity.

The molar absorption coefficient of the compound may be measured by using a known method, but specifically, it is preferred that the coefficient is measured, for example, by an ultraviolet and visible spectrophotometer (Carry-5 spectrophotometer, manufactured by Varian Inc.) at a concentration of 0.01 g/L using an ethyl acetate solvent.

As the polymerization initiator used in the present invention, two or more thereof may be used in combination, if necessary.

From the viewpoint of exposure sensitivity, the polymerization initiator used in the coloring composition of the present invention is preferably a compound selected from the group consisting of a trihalomethyl triazine compound, a benzyl dimethyl ketal compound, an α-hydroxyketone compound, an α-aminoketone compound, an acyl phosphine compound, a phosphine oxide compound, a metallocene compound, an oxime compound, a triallylimidazole dimer, an onium compound, a benzothiazole compound, a benzophenone compound, an acetophenone compound and the derivatives thereof, a cyclopentadiene-benzene-iron complex and the salts thereof, a halomethyl oxadiazole compound and a 3-aryl-substituted coumarin compound.

A trihalomethyl triazine compound, an α-aminoketone compound, an acyl phosphine compound, a phosphine oxide compound, an oxime compound, a triallyl imidazole dimer, an onium compound, a benzophenone compound and an acetophenone compound are more preferred, and at least one compound selected from the group consisting of a trihalomethyl triazine compound, an α-aminoketone compound, an oxime compound, a triallyl imidazole dimer, and a benzophenone compound is most preferred.

The content of the polymerization initiator contained in the coloring composition of the present invention (total content in the case of two or more kinds) is preferably 0.1% by mass to 50% by mass, more preferably 0.5% by mass to 30% by mass, and still more preferably 1% by mass to 20% by mass, based on the total solids of the coloring composition.

(Polymerizable Compound)

Specifically, the polymerizable compound is selected from compounds having at least one terminal ethylenically unsaturated bond and preferably two or more terminal ethylenically unsaturated bonds. The group of these compounds is widely known in the relevant industrial field, and such compounds may be used in the present invention without particular limitations. These compounds may be any of chemical forms such as, for example, a monomer, a prepolymer, that is, a dimer, a trimer, and an oligomer, or a mixture thereof, and a multimer thereof. The polymerizable compounds in the present invention may be either alone or in combination of two or more thereof.

More specifically, examples of monomers and prepolymers thereof include an unsaturated carboxylic acid (for example, acrylic acid, methacrylic acid, itaconic acid, crotonic acid, isocrotonic acid, maleic acid and the like), esters and amides thereof and multimers thereof, and esters of an unsaturated carboxylic acid and an aliphatic polyhydric alcohol compound, amides of an unsaturated carboxylic acid and an aliphatic polyvalent amine compound, and multimers thereof. Further, an addition reaction product of unsaturated carboxylic acid esters or unsaturated carboxylic acid amides, which have a nucleophilic substituent such as a hydroxyl group, an amino group and a mercapto group, with monofunctional or polyfunctional isocyanates or epoxies, a dehydration condensation reaction product of the unsaturated carboxylic acid esters or unsaturated carboxylic acid amides with a monofunctional or polyfunctional carboxylic acid, and the like are also suitably used. In addition, an addition reaction product of unsaturated carboxylic acid esters or unsaturated carboxylic acid amides, which have an electrophilic substituent such as an isocyanate group and an epoxy group, with monofunctional or polyfunctional alcohols, amines or thiols; and furthermore, a substitution reaction product of unsaturated carboxylic acid esters or unsaturated carboxylic acid amides, which have a releasable substituent such as a halogen group and a tosyloxy group; with monofunctional or polyfunctional alcohols, amines or thiols, are also suitably used. Furthermore, as another example, it is also possible to use the group of compounds obtained by replacing the above-described unsaturated carboxylic acid with a vinyl benzene derivative such as an unsaturated phosphonic acid and styrene, vinyl ether, allyl ether and the like.

As the specific compounds thereof, the compounds as described in paragraph Nos. [0095] to [0108] of Japanese Patent Application Laid-Open No. 2009-288705 may be suitably used even in the present invention.

Further, as the polymerizable compound, a compound having an ethylenically unsaturated group with a boiling temperature of 100° C. or more under normal pressure, which has at least one addition polymerizable ethylene group, is also preferred. Examples thereof include monofunctional acrylates or methacrylates such as polyethylene glycol mono(meth)acrylate, polypropylene glycol mono(meth)acrylate, phenoxyethyl(meth)acrylate and the like; compounds obtained by adding ethylene oxide or propylene oxide to polyfunctional alcohols such as polyethylene glycol di(meth)acrylate, trimethylolethane tri(meth)acrylate, neopentyl glycol di(meth)acrylate, pentaerythritol tri(meth)acrylate, pentaerytritol tetra(meth)acrylate, dipentaerythritol penta(meth)acrylate, dipentaerythritol hexa(meth)acrylate, hexanediol (meth)acrylate, trimethylolpropane tri(acryloyloxyethyl)ether, tri(acryloyloxyethyl) isocyanurate, glycerine or trimethylolethane, followed by (meth)acrylation, urethane (meth)acrylates as described in Japanese Patent Publication Nos. S48-41708 and S50-6034 and Japanese Patent Application Laid-Open No. 51-37193, polyester acrylates as described in Japanese Patent Application Laid-Open No. S48-64183 and Japanese Patent Publication Nos. S49-43191 and S52-30490, polyfunctionalacrylates or methacrylates such as epoxy acrylates as a reaction product obtained by reacting epoxy resins with (meth)acrylic acid, and mixtures thereof.

Examples thereof include polyfunctional (meth)acrylates obtained by reacting a cyclic ether group such as glycidyl (meth)acrylate with a compound having an ethylenically unsaturated group in a polyfunctional carboxylic acid, and the like.

In addition, as the other preferred polymerizable compound, it is also possible to use a compound having a fluorene ring and having two or more ethylenically unsaturated functional groups, as described in Japanese Patent Application Laid-Open Nos. 2010-160418 and 2010-129825 and Japan Patent No. 4364216, and cardo resins.

Furthermore, as the compound having at least one ethylenically unsaturated group, which is addition polymerizable, and having a boiling point of 100° C. or more under normal pressure, the compounds as described in paragraph Nos. [0254] to [0257] of Japanese Patent Application Laid Open No. 2008-292970 are also suitable.

In addition to the compounds described above, radical polymerizable monomers represented by the following Formulas (MO-1) to (MO-5) may also be suitably used. Meanwhile, in the formulas, when T is an oxyalkylene group, R is bonded to the terminal end of the carbon atom side thereof.

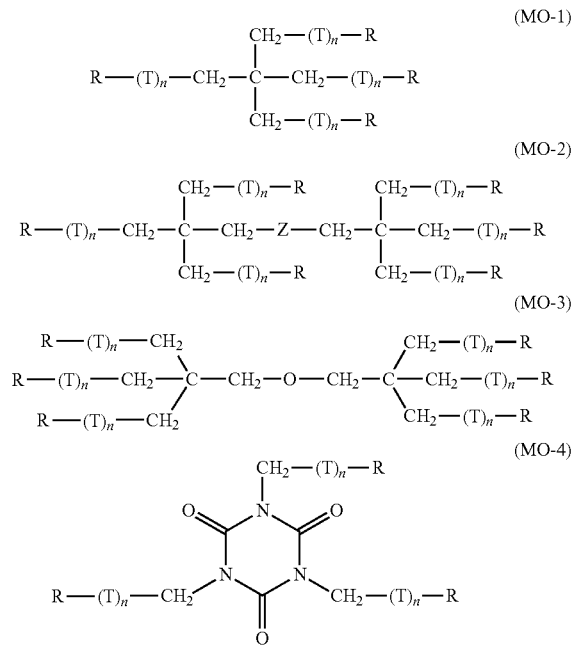

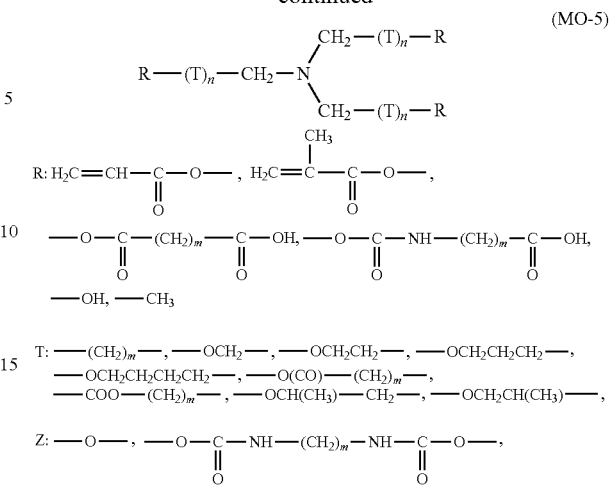

In the Formulas, n is 0 to 14, and m is 1 to 8. Each of R and T that are present in plurality in a molecule may be the same as or different from every other R and T.

In each of the polymerizable monomers represented by Formulas (MO-1) to (MO-5), at least one of a plurality of R's represents a group represented by —OC(=O)CH=CH$_2$ or —OC(=O)C(CH$_3$)=CH$_2$.

As specific examples of the polymerizable compounds represented by Formulas (MO-1) to (MO-5), the compounds as disclosed in paragraph Nos. [0248] to [0251] of Japanese Patent Application Laid-Open No. 2007-269779 may be suitably used even in the present invention.

Further, the compounds, described as a compound of Formula (1) and (2) together with specific examples thereof in Japanese Patent Application Laid-Open No. H10-62986, which are obtained by adding ethylene oxide or propylene oxide to the polyfunctional alcohol followed by (meth)acrylation may be also used as the polymerizable compound.

Among them, dipentaerythritol triacrylate (as a commercially available product thereof, KAYARAD D-330; manufactured by NIPPON KAYAKU Co., Ltd.), dipentaerythritol tetraacrylate (as a commercially available product thereof, KAYARAD D-320; manufactured by NIPPON KAYAKU Co., Ltd.), dipentaerythritol penta(meth)acrylate (as a commercially available product thereof, KAYARAD D-310; manufactured by NIPPON KAYAKU Co., Ltd.), dipentaerythritol hexa(meth)acrylate (as a commercially available product thereof, KAYARAD DPHA; manufactured by NIPPON KAYAKU Co., Ltd.), polyfunctional acrylate (as a commercially available product thereof, KAYARAD RP-1040; manufactured by NIPPON KAYAKU Co., Ltd.) and a structure in which the (meth)acryloyl group thereof has an ethylene glycol or propylene glycol reside therethrough are preferred as the polymerizable compound. The oligomer types thereof may also be used. Hereinafter, aspects of preferred polymerizable compounds will be shown.

The polymerizable compound is a polyfunctional monomer, and may have an acid group such as a carboxyl group, a sulfonic acid group and a phosphoric acid group. The ethylenic compound may be used as it is as long as the ethylenic compound has an unreacted carboxyl group, but if necessary, an acid group may be introduced by reacting a non-aromatic carboxylic anhydride with a hydroxyl group of the above-described ethylenic compound. In this case, specific examples of the non-aromatic carboxylic anhydride to be used include tetrahydrophthalic anhydride, alkylated tetrahydrophthalic anhydride, hexahydrophthalic anhydride, alkylated hexahydrophthalic anhydride, succinic anhydride and maleic anhydride.

In the present invention, a monomer having an acid group is an ester of an aliphatic polyhydroxy compound with an unsaturated carboxylic acid and is preferably a polyfunctional monomer which is allowed to have an acid group by reacting a non-aromatic carboxylic anhydride with an unreacted hydroxyl group of an aliphatic polyhydroxy compound, and the aliphatic polyhydroxy compound is particularly preferably pentaerythritol and/or dipentaerythritol in the ester. Examples of the commercially available product include polybasic acid modified-acrylic oligomers manufactured by TOAGOSEI CO., LTD., such as M-510 and M-520.

These monomers may be used alone, but may be used in mixture of two or more thereof because it is difficult to use a single compound in the preparation. Further, if necessary, a polyfunctional monomer which has no acid group as a monomer may be used in combination with a polyfunctional monomer which has an acid group.

The polyfunctional monomer which has an acid group preferably has an acid number of 0.1 to 40 mg KOH/g, and particularly preferably 5 to 30 mg KOH/g. When the polyfunctional monomers having another acid group are used in combination of two or more thereof, or the polyfunctional monomers which have no acid group are used in combination, it is preferred to adjust the acid number such that the acid group as the total polyfunctional monomer falls within the above-described range.

In addition, it is a preferred aspect that a polyfunctional monomer having a caprolactone structure is also contained as a polymerizable monomer.

The polyfunctional monomer having a caprolactone structure is not particularly limited as long as the monomer has a caprolactone structure in the molecule thereof, but, for example, is obtained by esterification of a polyhydric alcohol such as trimethylolethane, ditrimethylolethane, trimethylolpropane, ditrimethylolpropane, pentaerythritol, dipentaerythritol, tripentaerythritol, glycerine, diglycerol, trimethylolmelamine and the like, (meth)acrylic acid and ε-caprolactone, and examples thereof include ε-caprolactone modified polyfunctional (meth)acrylates. Among them, a polyfunctional monomer having a caprolactone structure represented by the following Formula (Z-1) is preferred.

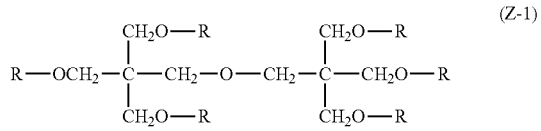
(Z-1)

In Formula (Z-1), all of six R's are a group represented by the following Formula (Z-2), or 1 to 5 of six R's are a group represented by the following Formula (Z-2) and the remainder thereof is a group represented by the following Formula (Z-3).

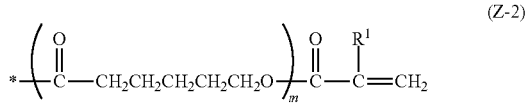
(Z-2)

In Formula (Z-2), $R^1$ represents a hydrogen atom or a methyl group, m represents a number of 1 or 2, and "*" represents a bonding hand.

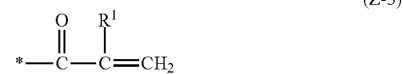
(Z-3)

In Formula (Z-3), $R^1$ represents a hydrogen atom or a methyl group, and "*" represents a bonding hand.)

The polyfunctional monomer having such a caprolactone structure is commercially available, for example, as KAYARAD DPCA series from NIPPON KAYAKU Co., Ltd., and examples thereof include DPCA-20 (in Formulas (Z-1) to (Z-3), a compound in which m=1, the number of groups represented by Formula (Z-2)=2, and all of $R^1$ are a hydrogen atom), DPCA-30 (in the same formulas, a compound in which m=1, the number of groups represented by Formula (Z-2)=3, and all of $R^1$ are a hydrogen atom), DPCA-60 (in the same formulas, a compound in which m=1, the number of groups represented by Formula (Z-2)=6, and all of $R^1$ are a hydrogen atom), DPCA-120 (in the same formula, a compound in which m=2, the number of groups represented by Formula (Z-2)=6, and all of $R^1$ are a hydrogen atom) and the like.

In the present invention, a polyfunctional monomer having a caprolactone structure may be used either alone or in combination of two or more thereof.

Further, as the curable compound in the present invention, at least one selected from the group of the compound represented by the following Formula (Z-4) or Formula (Z-5) is also preferred.

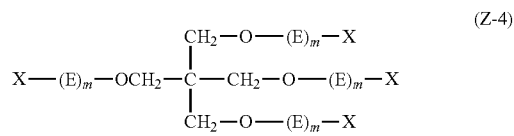
(Z-4)

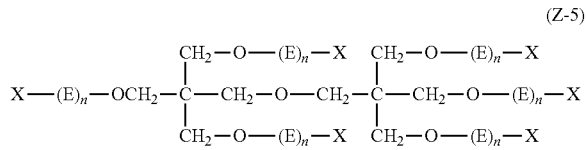
(Z-5)

In Formula (Z-4) and Formula (Z-5), each of E independently represents —(($CH_2$)$_y$$CH_2$O)— or —(($CH_2$)$_y$CH($CH_3$)O)—, each of y independently represents an integer of 0 to 10, each of X independently represents an acryloyl group, a methacryloyl group, a hydrogen atom or a carboxyl group.

In Formula (Z-4), the sum of an acryloyl group and a methacryloyl group is 3 or 4, each of m independently represents an integer of 0 to 10, and the sum of each m is an integer of 0 to 40. However, when the sum of each m is 0, any one of X is a carboxyl group.

In Formula (Z-5), the sum of an acryloyl group and a methacryloyl group is 5 or 6, each of n independently represents an integer of 0 to 10, and the sum of each n is an integer of 0 to 60. However, when the sum of each n is 0, any one of X is a carboxyl group.

In Formula (Z-4), m is preferably an integer of 0 to 6, and more preferably an integer of 0 to 4.

Further, the sum of each m is preferably an integer of 2 to 40, more preferably an integer of 2 to 16, and particularly preferably an integer of 4 to 8.

In Formula (Z-5), n is preferably an integer of 0 to 6, and more preferably an integer of 0 to 4.

In addition, the sum of each n is preferably an integer of 3 to 60, more preferably an integer of 3 to 24, and particularly preferably an integer of 6 to 12.

Furthermore, —((CH$_2$)$_y$CH$_2$O)— or —((CH$_2$)$_y$CH(CH$_3$)O)— in Formula (Z-4) or Formula (Z-5) is preferably a form in which X is bonded to the terminal end of the oxygen atom side.

The compound represented by Formula (Z-4) or Formula (Z-5) may be used either alone or in combination of two or more thereof. In particular, in Formula (Z-5), a form in which all of the six X's are an acryloyl group is preferred.

In addition, the total content of the compound represented by Formula (Z-4) or Formula (Z-5) in the polymerizable compound is preferably 20% by mass or more, and more preferably 50% by mass or more.

The compound represented by Formula (Z-4) or Formula (Z-5) may be synthesized by a process of bonding a ring-opening structure of ethylene oxide or propylene oxide to pentaerythritol or dipentaerythritol by means of a ring-opening addition reaction and a process of reacting, for example, (meth)acryloylchloride with a terminal hydroxyl group of the ring-opening structure to introduce a (meth)acryloyl group, which are processes known in the related art. Each process is a well known process, and the compound represented by Formula (i) or Formula (ii) may be readily synthesized by those skilled in the art.

Even among the compositions represented by Formula (Z-4) or Formula (Z-5), pentaerythrol derivatives and dipentaerythritol derivatives are more preferred.

Specifically, examples thereof include compounds (hereinafter, also referred to as "exemplary compounds (a) to (f)") represented by the following formulas (a) to (f) and among them, exemplary compounds (a), (b), (e) and (f) are preferred.

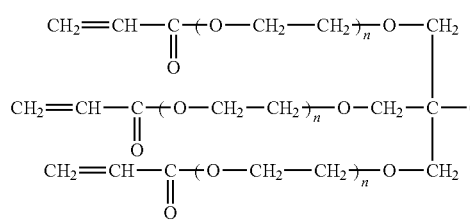
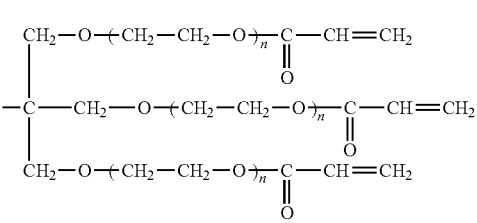

(a)

(The sum of each of n is 6)

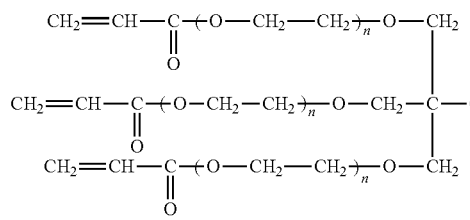
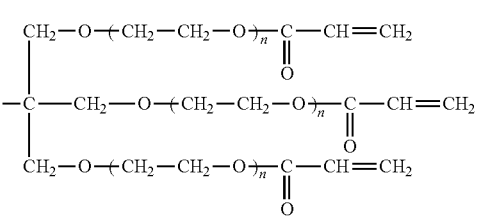

(b)

(The sum of each of n is 12)

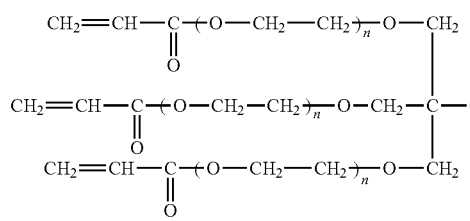
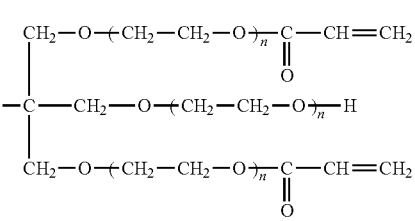

(c)

(The sum of each of n is 12)

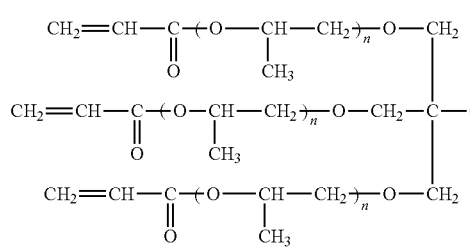
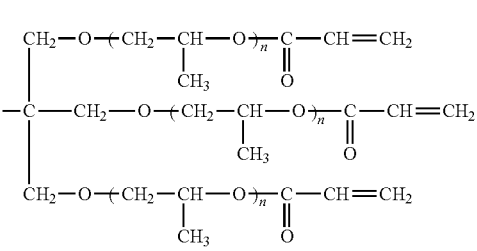

(d)

(The sum of each of n is 6)

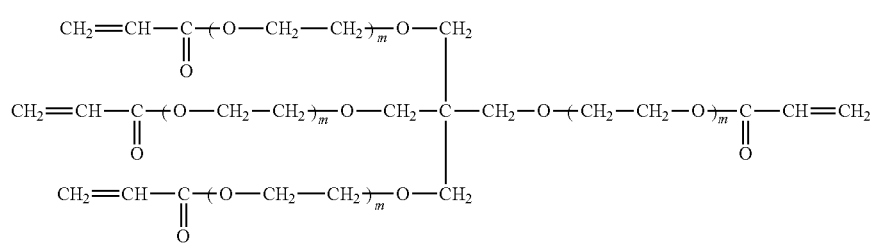

(e)

(The sum of each of m is 4)

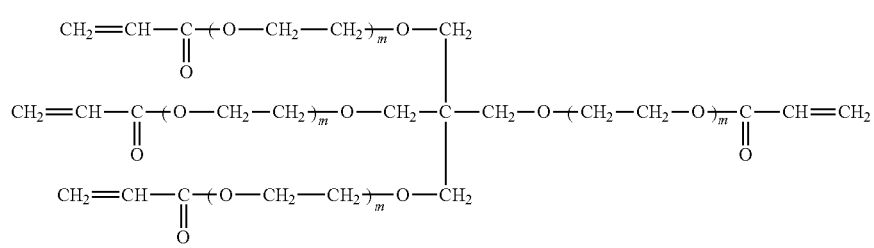

(f)

(The sum of each of m is 12)

Examples of the commercially available product of the polymerizable compounds represented by Formula (Z-4) and Formula (Z-5) include a tetrafunctional acrylate having four ethyleneoxy chains, SR-494, manufactured by Sartomer Company, Inc., and a hexafunctional acrylate having six pentyleneoxy chains, DPCA-60 and a trifunctional acrylate having three isobutyleneoxy chains, TPA-330, which are both manufactured by Nippon Kayaku Co., Ltd.

Further, as a polymerizable compound, urethane acrylates as described in Japanese Patent Publication Nos. S48-41708, S51-37193, H2-32293 and H2-16765, or urethane compounds having an ethyleneoxide-based structure, as described in Japanese Patent Publication Nos. S58-49860, S56-17654, S62-39417 and S62-39418 are also suitable. Further, a curable composition having excellent photosensitive speed may be obtained by using addition polymerizable compounds having an amino structure or a sulfide structure in a molecule, as described in Japanese Patent Application Laid-Open Publication Nos. S63-277653, S63-260909, and H1-105238, as a polymerizable compound.

Examples of the commercially available product of the polymerizable compound include urethane oligomers UAS-10, UAB-140 (manufactured by Sanyo-Kokusaku Pulp Co., Ltd.), UA-7200 (manufactured by SHIN-NAKAMURA CHEMICAL CO., LTD.) DPHA-40H (manufactured by NIPPON KAYAKU Co., Ltd.), UA-306H, UA-306T, UA-306I, AH-600, T-600, AI-600 (manufactured by KYOEISHA CHEMICAL CO., LTD.), and the like.

For these polymerizable compounds, details of the methods of use thereof, such as the structure of the compounds, single use or use of a combination and the amount to be added, may be arbitrarily determined in accordance with the final performance design of the coloring composition. For example, from the viewpoint of sensitivity, a structure having a high content of unsaturated groups per one molecule is preferred, and in many cases, bifunctional or higher functionality is preferred. Further, from the viewpoint of increasing the strength of the colored cured film, a trifunctional or higher functionality is suitable, a tetrafunctional or higher functionality is preferred, and pentafunctional or higher functionality is preferred. In addition, a method of controlling both the sensitivity and the strength by using in combination compounds which are different in functional number and different in polymerizable group (for example, an acrylic acid ester, a methacrylic acid ester, a styrene-based compound and a vinyl ether-based compound), is also effective. Furthermore, it is preferred to use in combination trifunctional or higher polymerizable compounds which are different in ethylene oxide chain length.

Further, the selection and the method of use of the polymerizable compounds are also important factors for compatibility with other components (for example, a photopolymerization initiator, a colorant (pigment), a binder polymer and the like) contained in the coloring composition and for dispersibility, and for example, the compatibility may be increased by the use of a compound with low purity, or by the combination use of two or more of other components in some cases. In addition, in some cases, a specific structure may be selected from the viewpoint of improving the adhesion to a hard surface such as a support.

The content of the polymerizable compound in the coloring composition of the present invention is preferably 0.1% by mass to 90% by mass, more preferably 1.0% by mass to 80% by mass, and particularly preferably 2.0% by mass to 70% by mass, based on the solid content in the coloring composition.

(Surfactant)

Various surfactants may be added to the coloring composition of the present invention from the viewpoint of further improving the coatability thereof. Various surfactants such as fluorine-based surfactants, nonionic surfactants, cationic surfactants, anionic surfactants and silicone-based surfactants may be used as the surfactant.

In particular, the coloring composition of the present invention contains a fluorine-based surfactant, and thus when the composition is prepared into a coating solution, liquid characteristics (particularly, fluidity) may be further improved, thus resulting in further improvements in uniformity of a coating thickness or saving of liquid.

That is, when a film is formed by using a coating solution in which a coloring composition containing a fluorine-based surfactant is coated, wettability into a surface to be coated is improved by reducing the interfacial tension between the surface to be coated and the coating solution, thereby improving the coatability into the surface to be coated. For this reason, it is effective in that the formation of a uniform-thickness film with a slight thickness unevenness may be more suitably carried out, even when a thin film of approximately several µm is formed with a small amount of the liquid.

The fluorine content by percentage in the fluorine-based surfactant is suitably 3% by mass to 40% by mass, more preferably 5% by mass to 30% by mass, and particularly preferably 7% by mass to 25% by mass. The fluorine-based surfactant having a fluorine content, which falls within the this range, is effective from the viewpoint of thickness uniformity of the coating film and saving of liquid, and also exhibits good solubility in the coloring composition.

Examples of the fluorine-based surfactant include MEGAFACE F781 (manufactured by DIC Corporation) and the like.

The surfactants may be used either alone or in combination of two or more thereof.

The coloring composition may or may not contain a surfactant, but when the composition contains a surfactant, the amount of the surfactant added is preferably 0.001% by mass to 2.0% by mass, and more preferably 0.005% by mass to 1.0% by mass, based on the total mass of the coloring composition.

Meanwhile, when the surfactant is a polymer compound (that is, a resin), the solid acid number of the polymer compound is 80 mg KOH/g or less.

(Curing Agent)

When an epoxy resin is used as a curable compound, a curing agent is preferably added. A curing agent for an epoxy resin has a very wide variety, and property, a working life for a mixture of the resin and the curing agent, viscosity, a curing temperature, a curing time, heat generation and the like vary so greatly according to the kind of the curing agent to be used, and thus it is required to select an appropriate curing agent depending on application purpose, service conditions, working conditions of the curing agent and the like. The curing agent is explained in detail in "Epoxy Resin (SHOKODO)" edited by Kakiuchi Hiroshi, Chapter 5. Hereinafter, examples of the curing agent will be shown.

Examples of a curing agent acting catalytically include tertiary amines and boron trifluoride-amine complex, and examples of a curing agent reacting stoichiometrically with a functional group of the epoxy resin include polyamine, acid anhydride and the like; further, examples of a curing agent performing curing at normal temperature include diethylenetriamine and polyamide resin, and examples of a curing agent performing curing at medium temperature include diethylaminopropylamine and tris(dimethylaminomethyl)phenol; and examples of a curing agent performing curing at high temperature include anhydrous phthalic acid, meta-phenylenediamine and the like. In addition, in terms of chemical structure, for amines, examples of aliphatic polyamine include diethylenetriamine; examples of aromatic polyamine include meta-phenylenediamine; examples of tertiary amine include tris(dimethylaminomethyl)phenol; examples of acid anhydride include anhydrous phthalic acid, a polyamide resin, a polysulfide resin and a boron trifluoride-monoethylamine complex; and examples of a synthetic resin initial condensate include a phenolic resin, dicyandiamide and the like.

These curing agents react and polymerize with an epoxy group by heating, and thus the crosslink density is increased to achieve curing. Both the binder and the curing agent are preferably as small in amount as possible for achieving a thin film, and particularly, the curing agent is 35% by mass or less, preferably 30% by mass or less, and more preferably 25% by mass or less based on the heat curable compound.

(Curing Catalyst)

Curing by reaction of epoxy mainly with each other in addition to curing by reaction with the curing agent is effective for realizing high concentration of the coloring agent. For this reason, a curing catalyst may also be used without using the curing agent. The curing may be performed by as slight an amount as the added amount of the curing catalyst approximately $\frac{1}{10}$ to $\frac{1}{1000}$, preferably approximately $\frac{1}{20}$ to $\frac{1}{500}$, and more preferably approximately $\frac{1}{30}$ to $\frac{1}{250}$ on the basis of mass based on an epoxy resin with an epoxy equivalent weight of approximately 150 to 200.

(Polymerization Inhibitor)

In the coloring composition of the present invention, it is preferred to add a small amount of polymerization inhibitor for inhibiting unnecessary thermal polymerization of the polymerizable compound during the preparation or the storage of the above-described coloring composition.

Examples of the polymerization inhibitor which may be used in the present invention include hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis(4-methyl-6-t-butylphenol), N-nitrosophenylhydroxyamine primary cerium salt and the like.

The amount of the polymerization inhibitor added is preferably about 0.01% by mass to about 5% by mass based on a mass of the total composition.

(Silane Coupling Agent)

In the coloring composition of the present invention, a silane coupling agent may be used from the viewpoint of further improving the adhesion to a substrate.

The silane coupling agent preferably has an alkoxysilyl group as a hydrolyzable group capable of chemically bonding with an inorganic material. Further, it is preferred to have a group which interacts with or form a bond with an organic resin to show affinity, and it is preferred to have, as such a group, a (meth)acryloyl group, a phenyl group, a mercapto group, a glycidyl group and an oxetanyl group, among them, it is preferred to have a (meth)acryloyl group or a glycidyl group.

That is, as a silane coupling agent used in the present invention, a compound having an alkoxysilyl group, a (meth)acryloyl group or an epoxy group is preferred, and specific example thereof include a (meth)acryloyl-trimethoxy silane compound having the following structure, a glycidyl-trimethoxysilane compound and the like.

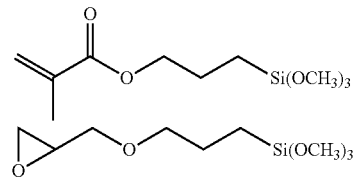

Further, as the silane coupling agent in the present invention, a silane compound having at least two functional groups with different reactivity in one molecule is preferred, and particularly, it is preferred to have, as the functional group, an amino group and an alkoxy group. Examples of the silane coupling agent include N-β-aminoethyl-γ-aminopropyl-methyldimethoxysilane (trade name KBM-602, manufactured by SHIN-ETSU CHEMICAL CO., LTD.), N-β-aminoethyl-γ-aminopropyl-trimethoxysilane (trade name KBM-603, manufactured by SHIN-ETSU CHEMICAL CO., LTD.), N-β-aminoethyl-γ-aminopropyl-triethoxysilane (trade name KBE-602, manufactured by SHIN-ETSU CHEMICAL CO., LTD.), γ-aminopropyl-trimethoxysilane (trade name KBM-903, manufactured by SHIN-ETSU CHEMICAL CO. LTD.), γ-aminopropyl-triethoxysilane (trade name KBE-903, manufactured by SHIN-ETSU CHEMICAL CO., LTD.) and the like.

When the silane coupling agent is used, the amount of the silane coupling agent added is preferably 0.1% by mass to 5.0% by mass and more preferably 0.2% by mass to 3.0% by mass, based on the total solids of the coloring composition used in the present invention.

<Method for Preparing Coloring Composition>

A preferred preparation method of the coloring composition in the present invention will be described. However, the present invention is not limited thereto.

When the coloring composition in the present invention contains a pigment as a colorant, a method for pulverizing pigment particles into finer particles and using a pigment having a sharp particle size distribution is suitable. Specifically, a method for using a pigment which has an average particle diameter of approximately 0.01 μm and contains pigment particles having a particle diameter in a range of 0.01±0.005 μm in an amount of 75% by mass or more is preferred. In order to adjust the particle size distribution of a pigment in the above-described range, a method the dispersing the pigment is particularly important. Examples of the dispersion method include a dispersion method in which dry dispersion (kneading dispersion treatment) of performing dispersion in the high viscosity state by using a kneader or a roll mill such as two-roll mill and wet dispersion (fine dispersion treatment) of performing dispersion in the relatively low viscosity state by using a three-roll mill, a bead mill or the like are combined. Further, in the dispersion method, it is also preferred to disperse two or more pigments together, to use no or a minimal amount of solvent during kneading dispersion treatment, or to use various dispersants. In addition, it is preferred to add the resin component in two portions during the kneading dispersion treatment and during the fine dispersion treatment (two-portion use) in order to alleviate the solvent shock, and it is also preferred to use a resin component which is excellent in solubility, in order to prevent the reaggregation of the pigment particles when the processing is changed from kneading dispersion treatment to fine dispersion treatment. Further, means of using high-rigidity ceramics or smaller particle diameter beads as the beads of the bead mill used during fine dispersion treatment are also effective.

In the present invention, it is preferred to use a colorant obtained by using two or more pigments, and dispersing the two or more pigments in a high viscosity state of 50,000 mPa·s or more and then dispersing the pigments in a low viscosity state of 1,000 mPa·s or less.

Generally, these pigments are supplied after the pigments are dried by various methods after synthesis. The pigment is usually supplied as powder by drying the pigment from an aqueous medium, but drying for powder demands a lot of heat energy because a great latent vaporization heat is required for water to be dried. As a result, the pigment normally forms an aggregate (secondary particles) in which primary particles are collected.

When the colorant in the preparation method of the coloring composition is a pigment, it is preferred to first knead and disperse the above-described binder in the colorant (pigment) such that the viscosity after kneading dispersion treatment is a relatively high viscosity of 50,000 mPa·s or more (preferably 50,000 mPa·s to 100,000 mPa·s). Herein, the kneading dispersion treatment may be high viscosity dispersion or dry dispersion. Subsequently, it is preferred to further add the above-described binder as needed to a dispersoid after the kneading dispersion treatment and perform a fine dispersion treatment such that the viscosity after the fine dispersion treatment is a relatively low viscosity of 1000 mPa·s or less (preferably 100 mPa·s or less). In addition, the fine dispersion treatment may be low viscosity dispersion or wet dispersion.

In the kneading dispersion treatment, the ratio of the solvent to a material to be dispersed is preferably 0% by mass to 20% by mass. Thus, it is possible to promote the wetting degree of a constituting component mainly including a vehicle resin component on the pigment particle surface by dispersing the mixture without using much solvent, and thus it is possible to convert an interface formed by the pigment particle surface from the solid/gas interface between the pigment particle and air to the solid/solution interface between the pigment particle and vehicle solution. It is possible to disperse the pigment into the micro state close to the primary particle thereof, by converting the interface formed by the pigment particle surface from air to the solution and performing mixing/stirring.

In this way, it is effective to convert the interface formed by the pigment particle surface from air to the solution, in order to disperse the pigment more highly. Strong shearing force or compressive force is required for the conversion. For this reason, it is preferable to use a kneader that may exhibit strong shearing force or compressive force in the kneading dispersion treatment, and to use high viscosity pigment particles as a material to be kneaded.

Further, it is preferred to mix and agitate the mixture together with a dispersion medium in a fine particle state, such as glass or ceramic in the fine dispersion treatment. In addition, the ratio of the solvent in the fine dispersion treatment is preferably 20% by mass to 90% by mass based on the material to be dispersed. Because it is necessary to uniformly and stably distribute the pigment particles into the micro state during the fine dispersion treatment, it is preferable to use a dispersing machine that may impart impact and shearing forces to the aggregated pigment particles and to use low viscosity pigment particles as a material to be dispersed.

When the colorant is a dye, the dispersion process is not needed as described above, and the dye may only be dissolved in a suitable solvent together with a binder.

In particular, it is preferred to prepare the coloring composition in the present invention by adding the heat curable compound and a curing catalyst or a curing agent to the pigment dispersoid or dye solution thus obtained when the heat curable compound is an epoxy compound, or adding a curing catalyst or a curing agent thereto to impart the heat curing function and adding a solvent thereto if necessary when the binder is already a heat-curable compound.

<Filter Filtration>

It is preferred that the coloring curable composition of the present invention is filtered by a filter, for the purpose of removing impurities or reducing defects.

As a filter for filter filtration, filters that have been used in the related art for filtration use and the like may be used without any particular limitation.

Examples of a material for the filter include a fluorine resin such as polytetrafluoroethylene (PTFE), a polyamide-based resin such as Nylon-6 and Nylon-6,6; a polyolefin resin (including a high density and an ultrahigh molecular weight) such as polyethylene and polypropylene (PP); and the like. Among these materials, polypropylene (including high density polypropylene) is preferred.

The pore diameter of the filter is not particularly limited, but is, for example, approximately 0.01 µm to 20.0 µm, preferably approximately 0.01 µm to 5 µm, and still more preferably approximately 0.01 µm to 2.0 µm.

Fine particles may be more effectively removed by adjusting the pore diameter of the filter within the above-described range, thereby reducing the turbidity more.

As the pore diameter of the filter herein, a reference may be made to nominal values of a filter maker. A commercially available filter may be selected from various filters provided by, for example, Pall Corporation, Toyo Roshi Kaisha, Ltd., Entegris, Inc. (formerly Mykrolis Corporation), KITZ MICRO FILTER CORPORATION or the like.

In the filter filtration, a combination of two or more filters may be used.

For example, filtration is first performed by using a first filter, and subsequently, filtration may be performed by using a second filter with a pore diameter different from the pore diameter of the first filter.

At that time, filtering at the first filter and filtering at the second filter may be performed once or two or more times.

As the second filter, a filter formed of a material which is the same as the material for the above-described first filter and the like may be used.

<Color Filter and Method for Manufacturing the Same>

The color filter of the present invention is a colored pattern in which at least one pattern of the patterns constituting the filter is formed from the coloring composition of the present invention as described above. The color filter of the present invention is not particularly limited so long as at least one pattern is a colored pattern formed from the colored composition of the present invention as described above, but the color filter is preferably manufactured by the method for manufacturing a color filter of the present invention as described below.

In the method for manufacturing a color filter of the present invention, a first colored layer is formed using the coloring composition (also referred as to a first coloring composition) of the present invention as described above.

Here, since the first colored layer is formed by the coloring composition of the present invention, the solvent resistance and the alkaline developing solution resistance are excellent.

For this reason, as described below in detail, when dissolving the first colored layer in a developing solution used in forming a resist pattern (patterned photoresist layer) as an etching mask on the first colored layer, or dissolving in an organic solvent of a second or third coloring radiation sensitive composition in the process of forming a second colored radiation sensitive layer with the second coloring radiation sensitive composition on the first colored layer and the process of forming a third colored radiation sensitive layer with the third coloring radiation sensitive composition on the first colored layer, or dissolving a developing solution used in exposing and developing the second or third colored radiation sensitive layer formed with the second or third coloring radiation sensitive composition, it is possible to suppress a concern that color components of the first colored layer are eluted to the solvent or developing solutions, or a concern that color components of the second or third coloring radiation sensitive composition are mixed into the first colored layer. As a result, it is possible to suppress the occurrence of color loss in the colored layer or the occurrence of overlap region in which a plurality of colors are overlapped with each other, thereby improving in the performance of the color filter finally obtained.

In particular, the method is effective to manufacture a color filter for solid-state imaging devices, requiring micro-size such as a thickness of 0.7 µm or less and/or a pixel pattern size (one side in a square pattern) of 2 µm or less (for example, 0.5 to 2.0 µm).

Herein, the solid-state imaging device will be briefly described as an example with reference to FIG. 1.

As illustrated in FIG. 1, a solid-state imaging device 10 is composed of a light receiving device (photodiode) 42 installed on a silicon substrate, a color filter 13, a planarization film 14, a microlens 15 and the like. In the present invention, it is not always necessary to install the planarization film 14. Meanwhile, in FIG. 1, for clarifying each member, the ratio of each thickness or width is ignored and each member is represented in a partially exaggerated manner.

A support is not particularly limited as long as the support is used in a color filter such as a silicon substrate, and examples thereof include soda-lime glass, borosilicate glass, quartz glass, which are used in a liquid crystal display device, and the like and a product obtained by attaching a transparent conductive film thereto, or a photoelectric conversion device substrate used in a solid-state imaging device and the like, for example, an oxide film, silicon nitride and the like. Further, an intermediate layer and the like may be installed between the support and the color filter 13 as long as the present invention is not impaired.

A P well 41 is formed on the silicon substrate, and the photodiode 42 is formed on a part of the surface of the P well. The photodiode 42 is formed by ion-injecting N-type impurities such as P and As into a part of the surface of the P well and then performing heat treatment. In addition, a region which is on the surface of the P well 41 of the silicon substrate and is different from the part has an impurity diffusion layer 43 which has a higher concentration of N-type impurities than that of the photodiode 42. The impurity diffusion layer 43 is formed by ion-injecting N-type impurities such as P and As and then performing heat treatment, and the photodiode 42 serves as a floating diffusion layer that transfers charges generated by receiving incident light. Besides using the well 41 as a P-type impurity layer, and the photodiode 42 and the impurity diffusion layer 43 as an N-type impurity layer, the well 41 may be used as an N-type impurity layer, and the photodiode 42 and the impurity diffusion layer 43 may be used as a P-type impurity layer.

An insulation film 47 such as $SiO_2$ or $SiO_2/SiN/SiO_2$ is formed on the P well 41, the photodiode 42 and the impurity diffusion layer 43, and an electrode 44 including poly-Si, tungsten, tungsten silicide, Al, Cu and the like is installed on the insulation film 47. The electrode 44 serves as a gate of a gate MOS transistor and may serve as a transfer gate for transferring charges generated in the photodiode 42 to the impurity diffusion layer 43. Further, a wiring layer 45 is formed on the electrode 44. A BPSG film 46 and a P—SiN film 48 are further formed at an upper side of wiring layer 45. The interface of the BPSG film 46 and the P—SiN film 48 is formed in a shape that is curved from the top to the bottom of the photodiode 42, and thus, serves as an inlayer lens for efficiently inducing incident light into the photodiode 42. A planarization film layer 49 is formed on the BPSG film 46 for the purpose of planarizing an unevenness portions other than the surface of the P—SiN film 48 or the pixel region.

The color filter 13 is formed on the planarization film layer 49. Meanwhile, in the following description, a colored film (so-called solid film) which is formed on the silicon substrate without dividing the region refers to "a colored (colored radiation sensitive) layer" and a colored layer which is formed to divide the region in a pattern shape (for example, a film patterned in a stripe shape and the like) refers to "a colored pattern". In addition, in the colored pattern, a colored pattern (for example, a colored pattern patterned in a square or rectangular shape, and the like) composed of an element which constitutes the color filter 13 refers to "a colored (red, green and blue) pixel".

The color filter 13 is composed of a plurality of green pixels (first pixel) 20G, red pixels (second pixel) 20R and blue pixels (third pixel) 20B, which are two-dimensionally arranged. Each of the colored pixels 20R, 20G and 20B is formed above the photodiode 42, respectively. The green pixels 20G are formed in a check pattern, and blue pixels 20B and red pixels 20R are formed between each of the green pixels 20G. Meanwhile, in FIG. 1, in order to explain that the color filter 13 is composed of three-colored pixels, each of the colored pixels 20R, 20G and 20B is illustrated as being parallelly arranged in a row.

The planarization film 14 is formed to cover the top surface of the color filter 13, and planarizes the surface of the color filter.

The microlens 15 is a condenser lens, in which the convex side is disposed upwardly, and are provided in the upper side of the planarized film 14 (a color filter when not having a planarized film), and also in the upper side of the light receiving device 42. Each microlens 15 efficiently guides light from a subject to each light receiving device 42.

Next, the method for manufacturing the color filter with respect to the exemplary embodiment of the present invention will be described.

Figure 2:
FIG. 2 is a schematic cross-sectional view of a first colored layer.

In the method for manufacturing the color filter with respect to the exemplary embodiment of the present invention, the colored layer 11 is first formed with the first coloring composition (Process (a)), as illustrated in the schematic cross-sectional view of FIG. 2. Here, the first coloring composition is the coloring composition as already described above.

The preferred form of the first colored layer 11 is a green transmitting layer, and thus the colorant in the first coloring composition is preferably one or more selected from C.I. Pigment Green 7, 10, 36, 37 and 58, and C.I. Pigment Yellow 1, 2, 3, 4, 5, 6, 10, 11, 12, 13, 14, 15, 16, 17, 18, 20, 24, 31, 32, 34, 35, 35:1, 36, 36:1, 37, 37:1, 40, 42, 43, 53, 55, 60, 61, 62, 63, 65, 73, 74, 77, 81, 83, 86, 93, 94, 95, 97, 98, 100, 101, 104, 106, 108, 109, 110, 113, 114, 115, 116, 117, 118, 119, 120, 123, 125, 126, 127, 128, 129, 137, 138, 139, 147, 148, 150, 151, 152, 153, 154, 155, 156, 161, 162, 164, 166, 167, 168, 169, 170, 171, 172, 173, 174, 175, 176, 177, 179, 180, 181, 182, 185, 187, 188, 193, 194, 199, 213 and 214.

The first colored layer 11 may be formed by coating the coloring composition on the support by a coating method such as a spin coating, a slit coating and a spray coating, and drying.

Herein, the thickness of the first colored layer 11 is preferably 0.3 μm to 1 μm, more preferably 0.35 μm to 0.8 μm, and still more preferably 0.35 μm to 0.7 μm.

When the first coloring composition contains a curable compound, it is preferred to cure the first colored layer 11 by heating with a heater such as a hot plate and an oven. The heating temperature is preferably 120° C. to 250° C., and more preferably 160° C. to 230° C. Although the heating time varies depending on the heating means, the heating time is generally 3 minutes to 30 minutes when heating on a hot plate, and generally 30 minutes to 90 minutes when heating in an oven.

Subsequently, patterning is performed by dry etching to form a group of through-holes in the first colored layer (Process (b)). Accordingly, a first colored pattern is formed. By this technique, it is possible to more reliably provide a group of through-holes having a desired shape, as compared with the case of providing a group of through-holes by forming a first colored layer with a coloring radiation sensitive composition, and exposing and developing the first colored layer. The reason is that, in a coloring radiation sensitive composition having the content of a colorant of 50% by mass or more based on the total solids of the composition, there is a limited choice to add components capable of contributing to developing performances in the composition, and thus, it becomes difficult to ensure reliable patterning.

The first colored pattern may be a colored pattern formed as a first tint on a support, and if necessary, may be a colored pattern provided as a pattern, for example, after a second tint or a third tint on a support having a pattern previously formed.

Dry etching may be performed on the first colored layer 11 using a patterned photoresist layer as a mask, and an etching gas. For example, as illustrated in the schematic cross-sectional view of FIG. 3, a photoresist layer 51 is first formed on the first colored layer 11.

Specifically, a positive or negative type radiation sensitive composition is coated on the colored layer, and dried to form a photoresist layer. In forming the photoresist layer 51, it is preferred to perform a pre-baking again. Especially, as a process of forming a photoresist, post-exposure baking (PEB) and post-development baking (post-baking) may preferably preferred.

As a photoresist, for example, a positive type radiation sensitive composition is used. Examples of the positive type radiation sensitive composition include a positive type radiation sensitive composition sensitive to radiations such as far-ultraviolet rays including ultraviolet rays (g-rays, h-rays and i-rays), excimer laser and the like, electron beam and X-rays. Of radiations, g-rays, h-rays and i-rays are preferred, and among them, i-rays are more preferred.

Specifically, as the positive type radiation sensitive composition, a composition containing a quinonediazide compound and an alkali soluble resin is preferred. In the positive type radiation sensitive composition containing a quinonediazide compound and an alkali soluble resin, a quinonediazide group is decomposed by irradiating light having a wavelength of 500 nm or less to produce a carboxyl group, and as a result, the composition is converted from the alkali insoluble state to the alkali soluble state. The positive type photoresist has significantly excellent resolution, and thus, is used in the manufacture of an integrated circuit such as IC or LSI. Examples of the quinonediazide compound include naphthoquinonediazide compounds.

The thickness of the photoresist layer 51 is preferably 0.1 μm to 3 μm, more preferably 0.2 μm to 2.5 μm, and still more preferably 0.3 μm to 2 μm. Meanwhile, the coating of the photoresist layer 51 may be suitably performed by using the coating method in the first colored layer 11 as described above.

Figure 3:
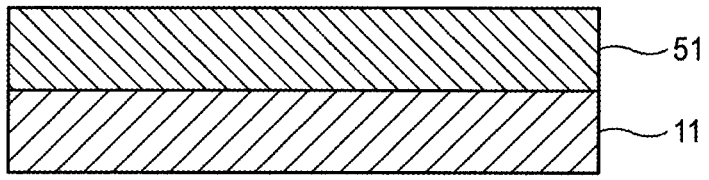
FIG. 3 is a schematic cross-sectional view illustrating a state where a photoresist layer is formed on the first layer.
Figure 4:
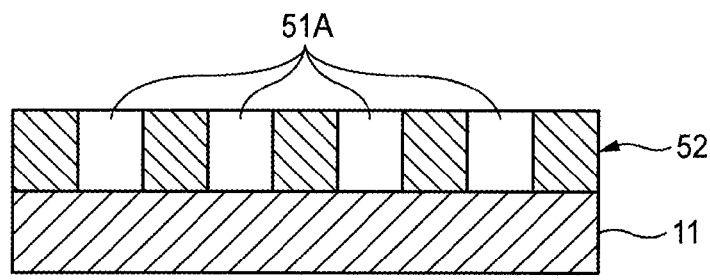
FIG. 4 is a schematic cross-sectional view illustrating a state where a resist pattern is formed on the first layer.

Subsequently, as illustrated in the schematic cross-sectional view of FIG. 3, a resist pattern (patterned photoresist layer) 52 having a plurality of resist through-holes 51A formed is formed by exposing and developing the photoresist layer 51.

The formation of the resist pattern 52 is not particularly limited, and may be performed by suitably optimizing a photolithography technology known in the related art. A plurality of resist through-holes 51A is formed in the photoresist layer 51 by exposure and development, and thus a resist pattern 52 as an etching mask used in the next etching is formed on the first colored layer 11.

The exposing of the photoresist layer 51 may be performed by exposing a positive type or negative type radiation sensitive composition to g-rays, h-rays, i-rays and the like, and preferably i-rays, through a predetermined mask pattern. After the exposure, the photoresist is removed in accordance with a region on which a colored pattern is to be formed, by developing with a developer.

As the developer, any developer may be used as long as the developer does not affect a first colored layer including a colorant and dissolves an exposed portion of the positive resist and an uncured portion of the negative resist, and for example, a combination of various organic solvents or an alkaline aqueous solution may be used. As the alkaline aqueous solution, an alkali aqueous solution prepared by dissolving the alkaline compound so as to have a concentration of 0.001% by mass to 10% by mass and preferably 0.01% by mass to 5% by mass is suitable. Examples of the alkaline compound include sodium hydroxide, potassium hydroxide, sodium carbonate, sodium silicate, sodium metasilicate, aqueous ammonia, ethylamine, diethylamine, dimethylethanolamine, tetramethylammonium hydroxide, tetraethylammonium hydroxide, choline, pyrrole, piperidine, 1,8-diazabicyclo-[5.4.0]-7-undecene and the like. Meanwhile, when the alkaline aqueous solution is used as a developer, a washing treatment is generally performed with water after the development.

Figure 5:
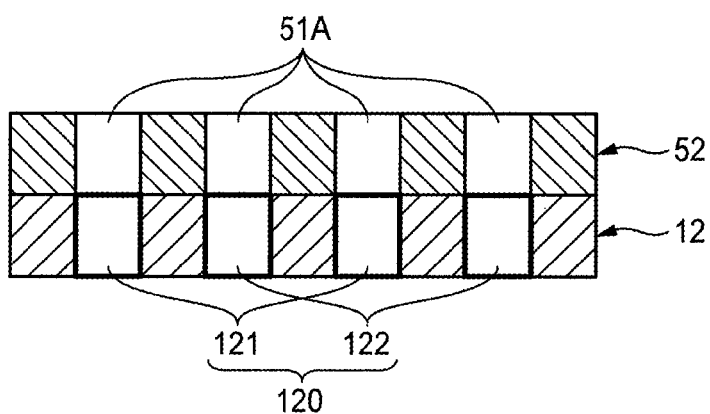
FIG. 5 is a schematic cross-sectional view illustrating a state where a first colored pattern is formed by providing a group of through-holes in the first layer by etching.

Next, as illustrated in the schematic cross-sectional view of FIG. 5, patterning is performed using the resist pattern 52 as an etching mask by dry etching to form a group of through-holes 120 in the first colored layer 11. Accordingly, the first colored pattern 12 is formed. Here, the group of through-holes 120 includes a first partial group of through-holes 121 and a second partial group of through-holes 122.

The group of through-holes 120 is provided as a checker shape in the first colored layer. Therefore, the first colored patter 12, which is made by providing the group of through-holes 120 in the first colored layer 11, is provided with a plurality of square-shaped first colored pixels as a checker shape.

Specifically, dry etching is performed by dry etching the first colored layer 11 using the resist pattern 52 as an etching mask. Representative examples of the dry etching include methods as described in Japanese Patent Application Laid-Open Nos. S59-126506, 59-46628, 58-9108, 58-2809, 57-148706, 61-41102 and the like.

From the viewpoint of forming the pattern cross-section in a shape closer to a rectangular shape or from the viewpoint of reducing the damage to the support more than ever, it is preferred that dry etching is performed in the following form.

A preferred aspect includes a first step etching which uses a mixed gas of a fluorine-based gas and an oxygen gas ($O_2$) to perform an etching up to a region (depth) in which the support is not exposed, a second step etching which uses a mixed gas of a nitrogen gas ($N_2$) and an oxygen gas ($O_2$) to perform an etching preferably to the vicinity of a region (depth) in which the support is exposed, after the first step etching, and an overetching performed after the support is exposed. Hereinafter, a specific technique of dry etching, the first step etching, the second step etching and the overetching will be described.

The dry etching is performed under the etching conditions previously obtained by the following technique.

(1) Each of an etching rate (nm/min) in the first step etching and an etching rate (nm/min) in the second step etching is calculated.

(2) Each of a time for etching a desired thickness in the first step etching and a time for etching a desired thickness in the second step etching is calculated.

(3) The first step etching is performed according to the etching time calculated in (2).

(4) The second step etching is performed according to the etching time calculated in (2). Otherwise, the etching time may be determined from the detection of an end point to perform the second step etching according to the etching time determined.

(5) An overetching time is calculated for the total time of (3) and (4) to perform the overetching.

From the viewpoint of processing an organic material, which is a film to be etched, into a rectangular shape, the mixed gas used in the first step etching process preferably includes a fluorine-based gas and an oxygen gas ($O_2$). Further, in the first step etching process, the damage to the support may be avoided by performing etching up to a region in which the support is not exposed.

In addition, in the second step etching process and the overetching process, from the viewpoint of avoiding the damage to the support after etching is performed up to a region in which the support is not exposed, by a mixed gas of a fluorine-based gas and an oxygen gas in the first step etching process, the etching treatment is preferably performed by using the mixed gas of the nitrogen gas and the oxygen gas.

It is important to determine a ratio of an etching amount in the first step etching process and an etching amount in the second step etching process such that the rectangularity is not impaired by the etching treatment in the first step etching process. Meanwhile, in the total etching amount (the sum of the etching amount in the first step etching process and the etching amount in the second step etching process), the ratio of the latter is preferably more than 0% and 50% or less, and more preferably 10% to 20%. The etching amount refers to an amount calculated from a difference between a film thickness remaining in the film to be etched and a film thickness before being etched.

Further, the etching preferably includes the overetching treatment. The overetching treatment is preferably performed by setting an overetching ratio. In addition, the overetching ratio is preferably calculated from a treatment time of etching which is initially performed. The overetching ratio may be arbitrarily set, but is preferably 30% or less of the etching treatment time in the etching process, more preferably 5% to 25% and particularly preferably 10% to 15% from the viewpoint of maintaining the etching resistance of the photoresist and the rectangularity of a pattern to be etched.

Figure 6:
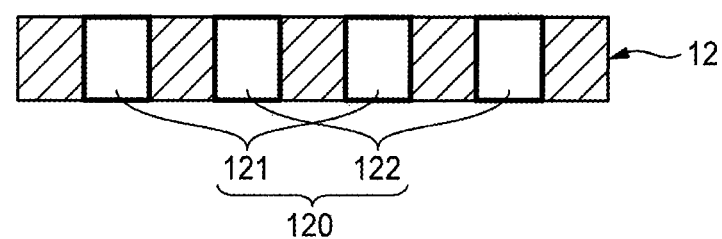
FIG. 6 is a schematic cross-sectional view illustrating a state where the resist pattern is removed.

Subsequently, as illustrated in the schematic cross-sectional view of FIG. 6, the resist pattern (that is, etching mask) 52 remaining after the etching is preferably removed. The removing of the resist pattern 52 preferably includes a process of imparting a stripping solution or a solvent on the resist pattern 52 to make a state capable of removing the resist pattern 52, and a process of removing the resist pattern 52 using a washing water.

Examples of the process of imparting a stripping solution or a solvent on the resist pattern 52 to make a state of capable of removing the resist pattern 52 include a process of imparting a stripping solution or a solvent at least on the resist pattern 52 and allowing the stripping solution or the solvent to stand for a predetermined time to perform a puddle development. A time for allowing the stripping solution or the solvent to stand is not particularly limited, but is preferably several dozen seconds to several minutes.

Further, examples of the process of removing the resist pattern 52 using a washing water include a process of spraying a washing water on the resist pattern 52 from a spray type or shower type spray nozzle to remove the resist pattern 52. As the washing water, pure water may be preferably used. In addition, examples of the spray nozzle include a spray nozzle allowing the entire support to be included in the spray range, or a movable spray nozzle in which the movable range thereof include the entire support. When the spray nozzle is movable, the resist pattern 52 may be more effectively removed by moving the spray nozzle from the central portion of the support to the end portion of the support twice or more during the process of removing the resist pattern 52 to spray the washing water.

The stripping solution generally contains an organic solvent, but may further contain an inorganic solvent. Examples of the organic solvent include 1) hydrocarbon-based compounds, 2) halogenated hydrocarbon-based compounds, 3) alcohol-based compounds, 4) ether- or acetal-based compounds, 5) ketone- or aldehyde-based compounds, 6) ester-based compounds, 7) polyhydric alcohol-based compounds, 8) carboxylic acid or carboxylic anhydride-based compounds, 9) phenolic compounds, 10) nitrogen-containing compounds, 11) sulfur-containing compounds and 12) fluorine-containing compounds. The stripping solution preferably contains a nitrogen-containing compound and more preferably includes an acyclic nitrogen-containing compound and a cyclic nitrogen-containing compound.

The acyclic nitrogen-containing compound is preferably an acyclic nitrogen-containing compound having a hydroxyl group. Specific examples thereof include monoisopropanolamine, diisopropanolamine, triisopropanolamine, N-ethylethanolamine, N,N-dibutylethanolamine, N-butylethanolamine, monoethanolamine, diethanolamine, triethanolamine and the like, monoethanolamine, diethanolamine and triethanolamine are preferred and monoethanolamine ($H_2NCH_2CH_2OH$) is more preferred. Further, examples of the cyclic nitrogen-containing compound include isoquinoline, imidazole, N-ethylmorpholine, $\epsilon$-caprolactam, quinoline, 1,3-dimethyl-2-imidazolidinone, $\alpha$-picoline, $\beta$-picoline, $\gamma$-picoline, 2-pipecholine, 3-pipecholine, 4-pipecholine, piperazine, piperidine, pyrazine, pyridine, pyrrolidine, N-methyl-2-pyrrolidone, N-phenylmorpholine, 2,4-lutidine, 2,6-lutidine and the like, preferably N-methyl-2-pyrrolidone and N-ethylmorpholine, and more preferably N-methyl-2-pyrrolidone (NMP).

The stripping solution preferably contains an acyclic nitrogen-containing compound and a cyclic nitrogen-containing compound, and among them, more preferably contains at least one selected from monoethanolamine, diethanolamine and triethanolamine as the acyclic nitrogen-containing compound and at least one selected from N-methyl-2-pyrrolidone and N-ethylmorpholine as the cyclic nitrogen-containing compound, and still more preferably contains monoethanolamine and N-methyl-2-pyrrolidone.

When removing with a stripping solution, the resist pattern 52 formed on the first colored pattern 12 may be removed, and even when a deposited material which is an etching product is attached on the sidewall of the first colored pattern 12, the deposited material may not be completely removed. The deposited material refers to an etching product attached and accumulated on the sidewall of the colored layer.

As the stripping solution, it is preferred that the content of the acyclic nitrogen-containing compound is 9 parts by mass to 11 parts by mass based on 100 parts by mass of the stripping solution and the content of the cyclic nitrogen-containing compound is 65 parts by mass to 70 parts by mass based on 100 parts by mass thereof. In addition, the stripping solution is preferably a mixture of an acyclic nitrogen-containing compound and a cyclic nitrogen-containing compound diluted with pure water.

Figure 7:
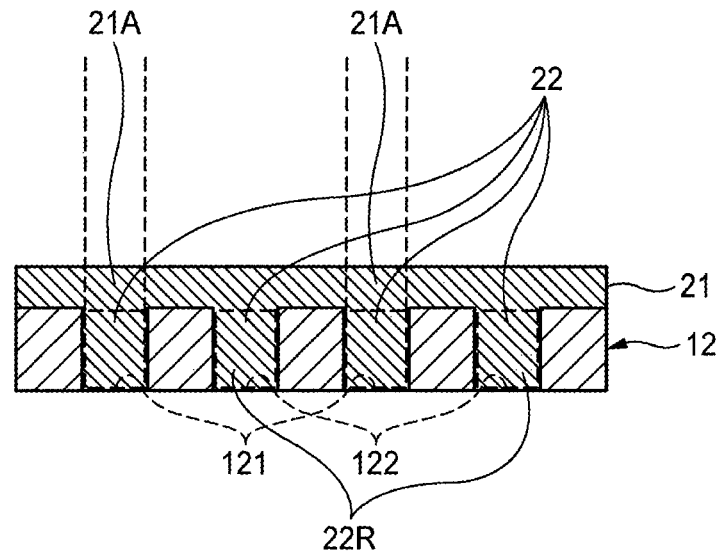
FIG. 7 is a schematic cross-sectional view illustrating a state where a second colored pattern and a second colored radiation sensitive layer are formed.

Sequently, as illustrated in the schematic cross-sectional view of FIG. 7, a second colored radiation sensitive layer 21 is stacked with a second coloring radiation sensitive composition on the first colored layer (that is, the first colored pattern 12 which is made by forming the group of through-holes 120 in the first colored layer 11) such that the second coloring radiation sensitive composition is embedded inside each of the through-holes in the first through-holes 121 and the second through-holes 122 so as to form a plurality of third colored pixels (Process (c)). Accordingly, a second colored pattern 22 is formed, which has a plurality of the second colored pixels in the through-holes 120 of the first colored layer 11. Here, the second colored pixels are made up of square shaped Pixels. The formation of the second colored radiation sensitive layer 21 may be conducted in the same manner as the method for forming the first colored layer 11 as described above.

Herein, the thickness of the second colored radiation sensitive layer 21 is preferably 0.3 µm to 1 µm, more preferably 0.35 µm to 0.8 µm, and still more preferably 0.35 µm to 0.7 µm.

Figure 8:
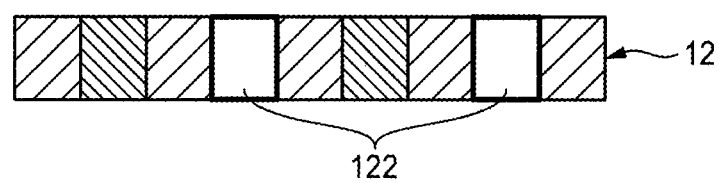
FIG. 8 is a schematic cross-sectional view illustrating a state where the second colored radiation sensitive layer and a part of second colored pixels constituting the second colored pattern of FIG. 7 are removed.

And, the second colored radiation sensitive layer 21, and a plurality of the second colored pixels 22R formed inside each of the through-holes in the second partial group of through-holes 122 are removed by exposing and developing the position 21A of the second colored radiation sensitive layer 21 which corresponds to the first partial group of through-holes 121 formed in the first colored layer 11 (Process (d)) (see the schematic cross-sectional view of FIG. 8).

Subsequently, as illustrated in the schematic cross-sectional view of FIG. 9, a third colored radiation sensitive layer 31 is formed with a third coloring radiation sensitive composition on the first colored layer (that is, the first colored pattern 12 which is made by forming the through-holes 120 in the first colored layer 11) such that the third coloring radiation sensitive composition is embedded inside each of the through-holes in the second through-holes 122 so as to form a plurality of third colored pixels (Process (e)). Accordingly, a third colored pattern 32 is formed, which has a plurality of the third colored pixels in the second through-holes 122 of the first colored layer 11. Here, the third colored pixels are made up of square shapedpixels. The formation of the third colored radiation sensitive layer 31 may be done in the same manner as the method for forming the first colored layer 11 as described above.

Herein, the thickness of the third colored radiation sensitive layer 31 is preferably 0.3 µm to 1 µm, more preferably 0.35 µm to 0.8 µm, and still more preferably 0.35 µm to 0.7 µm.

Figure 10:
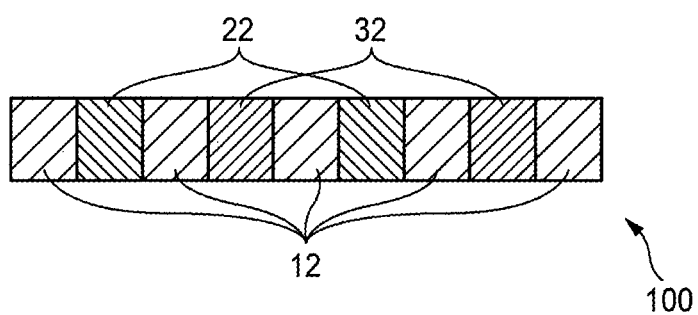
FIG. 10 is a schematic cross-sectional view illustrating a state where the third colored radiation sensitive layer of FIG. 9 is removed.

And, a color filter 100 having the first colored patterns 12, the second colored patterns 22 and the third colored patterns, as illustrated in the schematic cross-sectional view of FIG. 10, is manufactured by removing the third colored radiation sensitive layer 31 by exposing and developing the position 31A of the third colored radiation sensitive layer 31 which corresponds to the second through-holes 122 formed in the first colored layer 11 (Process (f)).

Each of the above-described second coloring composition and third coloring radiation sensitive composition contains a colorant. The colorant may be exemplified as described above in the coloring composition of the present invention, but is preferably a red transmitting portion or a blue transmitting portion, respectively because it is preferred that one of the second colored pixel and the third colored pixel is a red transmitting portion and the other is a blue transporting portion. A colorant to be contained in a coloring composition for forming a red transmitting portion is preferably one or more selected from C.I. Pigment Orange 2, 5, 13, 16, 17:1, 31, 34, 36, 38, 43, 46, 48, 49, 51, 52, 55, 59, 60, 61, 62, 64, 71 and 73, and C.I. Pigment Red 1, 2, 3, 4, 5, 6, 7, 9, 10, 14, 17, 22, 23, 31, 38, 41, 48:1, 48:2, 48:3, 48:4, 49, 49:1, 49:2, 52:1, 52:2, 53:1, 57:1, 60:1, 63:1, 66, 67, 81:1, 81:2, 81:3, 83, 88, 90, 105, 112, 119, 122, 123, 144, 146, 149, 150, 155, 166, 168, 169, 170, 171, 172, 175, 176, 177, 178, 179, 184, 185, 187, 188, 190, 200, 202, 206, 207, 208, 209, 210, 216, 220, 224, 226, 242, 246, 254, 255, 264, 270, 272 and 279, and a colorant to be contained in a coloring composition for forming a blue transmitting portion is preferably one or more selected from C.I. Pigment Violet 1, 19, 23, 27, 32, 37 and 42, and C.I. Pigment Blue 1, 2, 15, 15:1, 15:2, 15:3, 15:4, 15:6, 16, 22, 60, 64, 66, 79 and 80.

In each of the second coloring radiation sensitive composition and the third coloring radiation sensitive composition, the content of the colorant is preferably 30% by mass or more, more preferably 35% by mass or more, and still more preferably 40% by mass or more based on the total solids of the composition. In addition, the content of the colorant is generally 90% by mass or less, and preferably 80% by mass or less.

Further, for each of the second coloring radiation sensitive composition and the third coloring radiation sensitive composition, a negative type radiation sensitive composition is preferably used. Examples of the negative type radiation sensitive composition include a negative type radiation sensitive composition sensitive to radiations such as far-ultraviolet rays including ultraviolet rays (g-rays, h-rays and i-rays), excimer laser and the like, electron beam and X-rays. Of radiations, g-rays, h-rays and i-rays are preferred, and among them, i-rays are more preferred.

Specifically, as the negative type radiation sensitive composition, a composition containing a photopolymerization initiator, a polymerization component (polymerizable compound), a binder resin (alkali soluble resin and the like) and the like is preferred, and examples thereof include compositions as described, for example, in paragraph Nos. [0017] to [0064] of Japanese Patent Application Laid-Open No. 2005-326453. These negative type radiation sensitive compositions allow a photopolymerization initiator to initiate the polymerization reaction of a polymerizable compound by irradiation of radiation, and as a result, the composition is converted from an alkali soluble state to an alkali insoluble state.

The exposure of the second colored radiation sensitive layer 21 and the third colored radiation sensitive layer 31 may be performed by exposing with g-rays, h-rays, i-rays and the like.

In addition, the development performed after exposure is performed by developing with a developing solution.

The developing solution may be exemplified by the same developing solution as described in exposure and development of photoresist layer 51.

Further, when an alkaline aqueous solution is used as a developing solution, washing with water is generally performed after developing.

In the first colored pixels, the second colored pixels and the third colored pixels, the length of one side (it indicates a length of a shorter side when the pixel is rectangular, or a length of one side when the pixel is square) is preferably 0.5 μm to 1.7 μm, more preferably 0.6 μm to 1.5 μm from the viewpoint of image resolution.

According to the method for manufacturing a color filter of the present invention as described above, since the first colored layer, that is, the first colored pixel is formed with a coloring composition having high concentration of a colorant, the thickness of the first pixel can be made very thin (for example, 0.7 μm or less). Accordingly, a color filter in which crosstalk (color mixing of light) is suppressed can be manufactured with the method.

Further, the first pixel formed with the coloring composition of the present invention has excellent solvent resistance and alkaline developing solution resistance, as described above. Accordingly, the occurrence of overlap region overlapped with colors in other colored layers and other colored patterns may be reduced, and as a result, a high performance color filter may be prepared.

A color filter obtained from the coloring composition of the present invention may be suitably used for a liquid crystal display device (LCD) or a solid-state imaging device (for example, CCD, CMOS and the like). Further, the color filter may also be suitably used for an image display device such as electronic paper or organic EL. In particular, the color filter of the present invention may be suitably used for a solid-state imaging device such as a CCD and a CMOS.

The color filter of the present invention is appropriate as a color filter for a liquid crystal display device. A liquid crystal display device equipped with the color filter may display high-quality images having good tint of the display image and excellent display characteristics.

Definitions of the display device or details of each display device are described in, for example, "Electronic Display Device" (written by Sasaki Akio, Kogyo Chosakai Publishing Co., Ltd., published in 1990), "Display Device" (written by Ibuki Sumiaki, Sangyo Tosho Publishing Co., Ltd., published in 1989) and the like. Further, liquid crystal display devices are described in, for example, "Next Generation Liquid Crystal Display Techniques" (edited by Uchida Tatsuo, Kogyo Chosakai Publishing Co., Ltd., published in 1994). The liquid crystal display device to which the present invention may be applied is not particularly limited, and the present invention may be applied to, for example, liquid crystal display devices of various modes, as described in the above-described "Next Generation Liquid Crystal Display Techniques".

A color filter of the present invention is useful for liquid crystal display devices in a color TFT system. Details of liquid crystal display devices of color TFT system are described in, for example, "Color TFT Liquid Crystal Display (published by Kyoritsu Shuppan Co., Ltd. in 1996)". Further, the present invention may be applied to liquid crystal display devices having an enlarged view angle such as a transversal electric field driving system such as IPS, a pixel division system such as MVA, or also to STN, TN, VA, OCS, FFS, R-OCB and the like.

Further, the color filter of the present invention may also be provided to a color-filter on array (COA) system with brightness and high definition.

In a colored layer formed by the COA system, it is necessary to form a conduit such as a rectangular through-hole or a U-shaped concave portion having a side length of approximately 1 μm to 15 μm in order to establish electrical communication between an ITO electrode disposed on a colored layer and a terminal of a driving substrate below the colored layer, and the size (that is, the side length) of the conduit is particularly preferably 5 μm or less, but it is also possible to form a conduit of 5 μm or less by using the present invention. These image display systems are described in, for example, "EL, PDP, LCD Displays—Current Trend of Techniques and Markets—(Investigative Research Department, Toray Research Center, Inc., published in 2001)", page 43 and the like.

The liquid crystal display device of the present invention is composed of the color filter of the present invention and other various members such as an electrode substrate, a polarizing film, a phase difference film, a backlight, a spacer, a viewing angle securing film and the like. The color filter of the present invention may be applied to liquid crystal display devices composed of these known members. Details of these members are described in, for example, "'94 Markets of Peripheral Materials and Chemicals for Liquid Crystal Displays" (Shima Kentaro, published by CMC Publishing Co., Ltd. in 1994) and "2003 Current Status and Future Outlook of Liquid Crystal Related Market (Second Volume) (Omote Ryokichi, published by Fuji Chimera Research Institute Inc. in 2003).

Details about backlights are described in SID Meeting Digest 1380 (2005) (A. Konno et al.), Monthly Display, December issue, 2005, pages 18 to 24 (Shima Yasuhiro), pages 25 to 30 (Yagi Takaaki) and the like.

When the color filter of the present invention is used in a liquid crystal display device, a high contrast may be implemented when combined with a three-wavelength tube of a cold-cathode tube known in the related art. Furthermore, the use of LED light sources (RGB-LED) of red, green, and blue colors as backlights may provide a liquid crystal display device having high luminance intensity and good reproducibility of colors with high color purity.

EXAMPLE

Hereinafter, the present invention will be specifically described with reference to Examples, but the present invention is not limited to the Examples. Further, unless particularly specified, "parts" and "%" are by mass. In addition, when a commercially available treatment liquid is used to perform a treatment in each process, each treatment is performed by a method designated by a maker unless otherwise specified.

Examples 1 to 54, Comparative Examples 1 to 2

Example 19

Preparation of Pigment Dispersion Liquid

—Preparation of Green Pigment Dispersion Liquid—

A mixed solution including 8.6 parts of Pigment Green 36, which is a phthalocyanine pigment, and 5.7 parts of Pigment Yellow 185 as pigments, 1.4 parts of Derivative A as a pigment derivative, 4.3 parts of Dispersant A as a dispersion resin and 80 parts of propylene glycol monomethyl ether acetate (PGMEA) as a solvent, was mixed and dispersed for 15 hours with a bead mill to prepare a green pigment dispersion liquid.

Preparation of Green Pigment-Containing Composition (Coating Solution)

Using the green pigment dispersion liquid as described above, mixing and stirring was carried out so as to have the following composition to prepare a green curable composition.

Composition

| | |
|---|---|
| Pigment dispersion liquid: the green pigment dispersion liquid | 85.0 parts |
| Curable compound: Additive A | 3.24 parts |
| Solvent: PGMEA | 8.76 parts |
| Surfactant: F-781 (manufactured by DIC Corporation) (polymer-type surfactant: mass average molecular weight 30,000, solid acid nuber 0 mg KOH/g), 0.2% solution in PGMEA) | 3.0 parts |

Examples 1 to 18 and 20 to 54, Comparative Examples 1 to 2

Coloring curable compositions are prepared by changing the kinds of pigments, pigment derivatives, dispersion resins and curable compounds into the kinds thereof described in Table 1 and Table 2 in Examples and Comparative Examples which are all the same as Example 19 in terms of pigment concentrations (contents based on the total solids of the coloring curable composition) and D/P values (mass ratio of dispersion resin/pigment).

In Examples which are different from Example 19 in terms of D/P values, coloring curable compositions are prepared in the same manner as in Example 19, except that the kinds of pigments, pigment derivatives, dispersion resins and curable compounds are changed into the kinds thereof in Table 1 and Table 2, the amounts of the dispersion resins are changed so as to obtain D/P values described in Table 1 and Table 2, and the amounts of the curable compounds are adjusted to obtain values described in Table 1 and Table 2 as the concentrations of the pigments based on the total solids of the coloring curable compositions.

In Examples where D/P values are the same as those of Example 19 but the concentrations of the pigments are different, coloring curable compositions are prepared in the same manner as in Example 19, except that the kinds of pigments, pigment derivatives, dispersion resins and curable compounds are changed into the kinds thereof in Table 1 and Table 2 and the amounts of the curable compounds are adjusted to obtain values described in Table 1 and Table 2 as the concentrations of the pigments based on the total solids of the coloring curable compositions.

Further, in Examples and Comparative Examples, dispersants having a solid acid value described in the following Table were used.

Evaluation of Coloring Composition (1)

(Dispersion Stability)

Immediately after preparing each of the green coloring curable compositions of Examples and Comparative Examples in the manner as described above, the initial viscosity of the coloring curable composition at 25° C. was measured using a viscometer (RE85L, manufactured by TOKI SANGYO CO., LTD.). The coloring curable composition was stored at 45° C. for three days, and then, the viscosity at 25° C. was measured again using the same viscometer (hereinafter, referred as to "viscosity after elapsed time").

The dispersion stability was evaluated under the following evaluation criteria.

[Evaluation Criteria]

A: [Viscosity after elapsed time/Initial viscosity]=1.0 or more and less than 1.10

B: [Viscosity after elapsed time/Initial viscosity]=1.10 or more and less than 1.20

C: [Viscosity after elapsed time/Initial viscosity]=1.20 or more and less than 1.50

D: [Viscosity after elapsed time/Initial viscosity]=1.50 or more (Solvent Resistance and Alkaline Developing Solution Resistance)

Each of the green coloring curable compositions of Examples and Comparative Examples obtained above, was coated on a glass wafer to a dry film thickness of 0.55% n by using a spin coater, and heated on a hot plate at 200° C. for 300 seconds.

To the green color filter obtained above, propylene glycol monomethyl ether acetate (PGMEA), acetone, N-methyl-pyrrolidone (NMP), photoresist stripping solution MS230C (manufactured by FUJIFILM ELECTRONIC MATERIALS CO., LTD.) and alkaline developing solution FHD-5 (tetramethylammonium hydroxide (TMAH): 2.38% by mass, manufactured by FUJIFILM ELECTRONIC MATERIALS CO., LTD.) were added dropwise, respectively, followed by allowing to stand for 120 seconds and rinsing with running water for 10 seconds.

The spectral variance of the transmittance before and after adding dropwise various liquids was measured using MCPD-3000 (manufactured by OTSUKA ELECTRONICS CO., LTD.), and the color difference ΔEab was measured. The corresponding ΔEab with respect to the liquids having the largest ΔEab was shown in Tables 1 and 2.

As the ΔEab is lower, it means that the solvent resistance and the alkaline developing solution resistance are more excellent.

The result of the above evaluation is shown in the following tables.

TABLE 1

|  | Pigment | Mass ratio | Pigment concentration (% by mass) | D/P | Pigment derivative | Dispersion resin | Solid acid number (mg KOH/g) | Curable compound | Dispersion stability | Solvent resistance• alkaline developing solution resistance |
|---|---|---|---|---|---|---|---|---|---|---|
| Example 1 | G36/Y139 | 60/40 | 70 | 0.3 | Derivative A | Dispersant A | 30 | Additive A | A | 0.6 |
| Example 2 | G36/Y150 | 60/40 | 70 | 0.3 |  |  |  |  | A | 0.6 |
| Example 3 | G36/Y185 | 60/40 | 50 | 0.3 |  |  |  |  | A | 0.7 |
| Example 4 |  |  | 55 | 0.3 |  |  |  |  | A | 0.5 |
| Example 5 |  |  | 60 | 0.4 |  |  |  |  | A | 0.5 |
| Example 6 |  |  | 60 | 0.3 | Derivative B | Dispersant B | 0 |  | A | 1.5 |
| Example 7 |  |  |  |  |  | Dispersant D | 0 |  | A | 1.5 |
| Example 8 |  |  |  |  |  | Dispersant E | 10 |  | A | 1.5 |
| Example 9 |  |  |  |  |  |  | 30 |  | A | 1.5 |
| Example 10 |  |  |  |  |  |  | 60 |  | B | 2.0 |
| Example 11 |  |  |  |  |  | Dispersant F | 0 |  | A | 1.5 |
| Example 12 |  |  |  |  | Derivative A | Dispersant A | 10 | Additive A | A | 0.2 |
| Example 13 |  |  |  |  |  |  |  | Additive B | A | 0.3 |
| Example 14 |  |  |  |  |  |  |  | Additive C | A | 0.5 |
| Example 15 |  |  |  |  |  |  |  | Additive D | A | 0.5 |
| Example 16 |  |  |  |  |  |  |  | Additive E | A | 0.5 |
| Example 17 |  |  |  |  |  |  |  | Additive F | A | 0.5 |
| Example 18 | G36/Y185 | 60/40 | 60 | 0.3 | Derivative A | Dispersant A | 10 | Additive G | A | 0.5 |
| Example 19 |  |  |  |  |  |  | 30 | Additive A | A | 0.2 |
| Example 20 |  |  |  |  |  |  |  | Additive B | A | 0.3 |
| Example 21 |  |  |  |  |  |  |  | Additive C | A | 0.5 |
| Example 22 |  |  |  |  |  |  |  | Additive D | A | 0.5 |
| Example 23 |  |  |  |  |  |  |  | Additive E | A | 0.5 |
| Example 24 |  |  |  |  |  |  |  | Additive F | A | 0.5 |
| Example 25 |  |  |  |  |  |  |  | Additive G | A | 0.5 |
| Example 26 |  |  |  |  |  |  | 60 | Additive A | B | 0.2 |
| Example 27 |  |  |  |  |  |  |  | Additive B | B | 0.3 |
| Example 28 |  |  |  |  |  |  |  | Additive C | B | 0.6 |
| Example 29 |  |  |  |  |  |  |  | Additive D | B | 0.6 |
| Example 30 |  |  |  |  |  |  |  | Additive E | B | 0.6 |
| Example 31 |  |  |  |  |  |  |  | Additive F | B | 0.6 |
| Example 32 |  |  |  |  |  |  |  | Additive G | B | 0.6 |

TABLE 2

|  | Pigment | Mass ratio | Pigment concentration (% by mass) | D/P | Pigment derivative | Dispersion resin | Solid acid number (mg KOH/g) | Curable compound | Dispersion stability | Solvent resistance• alkaline developing solution resistance |
|---|---|---|---|---|---|---|---|---|---|---|
| Example 33 | G36/Y185 | 60/40 | 60 | 0.3 | Derivative A | Dispersant C | 10 | Additive A | A | 0.6 |
| Example 34 |  |  |  |  |  |  | 30 |  | A | 0.6 |
| Example 35 |  |  |  |  |  |  | 60 |  | B | 1.0 |

TABLE 2-continued

| | Pigment | Mass ratio | Pigment concentration (% by mass) | D/P | Pigment derivative | Dispersion resin | Solid acid number (mg KOH/g) | Curable compound | Dispersion stability | Solvent resistance• alkaline developing solution resistance |
|---|---|---|---|---|---|---|---|---|---|---|
| Example 36 | | | | | | Dispersant E | 10 | | A | 0.6 |
| Example 37 | | | | | | | 30 | | A | 0.6 |
| Example 38 | | | | | | | 60 | | B | 1.0 |
| Example 39 | | | | | Derivative C | Dispersant A | 30 | | B | 1.2 |
| Example 40 | | | | | | Dispersant C | 30 | | B | 1.2 |
| Example 41 | | | | | | Dispersant E | 30 | | B | 1.2 |
| Example 42 | | | 70 | 0.35 | Derivative A | Dispersant A | 30 | | A | 0.2 |
| Example 43 | | | 80 | 0.2 | | | | | A | 0.2 |
| Example 44 | G58/Y139 | 60/40 | 70 | 0.3 | | | | | A | 0.8 |
| Example 45 | G58/Y150 | 60/40 | 70 | 0.3 | | | | | A | 0.8 |
| Example 46 | G58/Y185 | 60/40 | 70 | 0.3 | | | | | A | 0.8 |
| Example 47 | G36/G7/Y139 | 80/10/10 | 70 | 0.3 | | | | | A | 0.8 |
| Example 48 | G36/G7/Y139/Y185 | 60/10/20/10 | 70 | 0.3 | | | | | A | 0.8 |
| Example 49 | G36/Y150/Y139 | 80/10/10 | 70 | 0.3 | | | | | A | 0.8 |
| Example 50 | G36/Y150/Y185 | 80/10/10 | 70 | 0.3 | Derivative A | Dispersant A | 30 | Additive A | A | 0.8 |
| Example 51 | G58/Y150/Y139 | 80/10/10 | 70 | 0.3 | | | | | A | 0.8 |
| Example 52 | G58/Y150/Y185 | 80/10/10 | 70 | 0.3 | | | | | A | 0.8 |
| Example 53 | G36 | 100 | 70 | 0.3 | | | | | A | 0.3 |
| Example 54 | G58 | 100 | 70 | 0.3 | | | | | A | 0.3 |
| Comparative Example 1 | G36/Y185 | 60/40 | 60 | 0.3 | Derivative A | Dispersant A | 90 | Additive A | D | 4.0 |
| Comparative Example 2 | | | | | | | 100 | | D | 4.0 |

The abbreviations and compounds listed in Tables 1 and 2 are as follows.
(Colorant)
G7: C.I. Pigment Green 7
G36: C.I. Pigment Green 36
G58: C.I. Pigment Green 58
Y139: C.I. Pigment Yellow 139
Y150: C.I. Pigment Yellow 150
Y185: C.I. Pigment Yellow 185
(Pigment Derivatives)

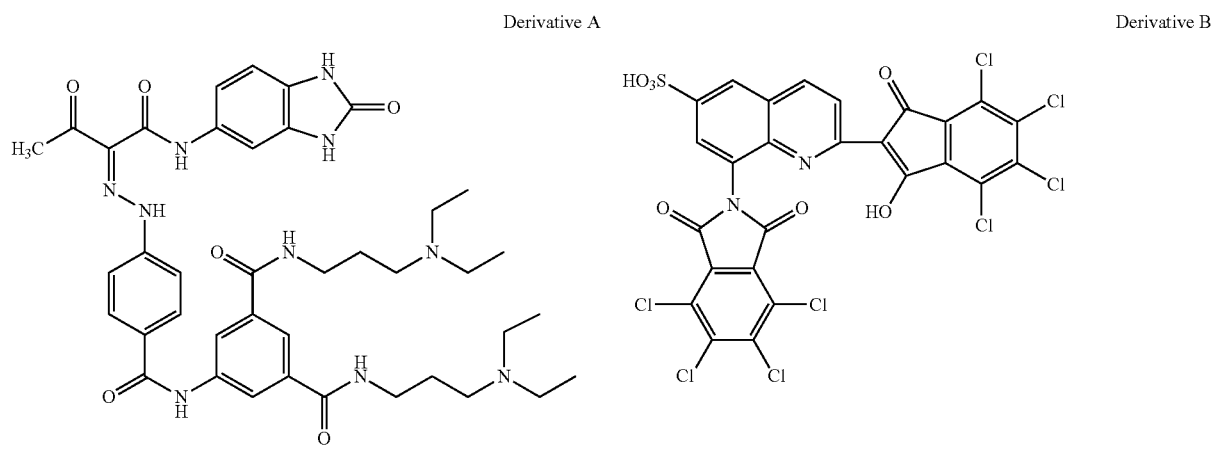

Derivative A

Derivative B

Derivative C

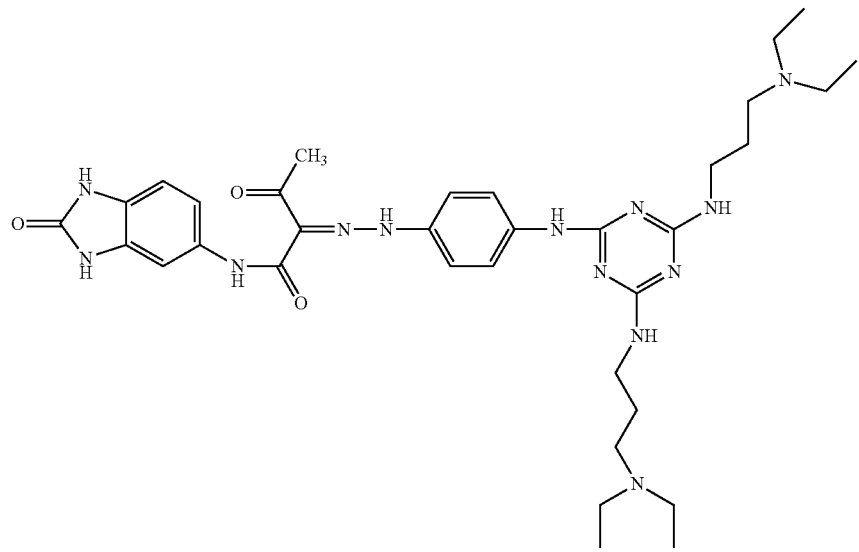

(Dispersant)

Among the following exemplary compounds (except Dispersant A), the numerical value written in each of the structural units (the numerical value written in the repeating units of the main chain) represents the content of the corresponding structural unit [in % by mass (wt %)]. The numerical value written in the repeating units of the side chains represents a repeating number of the corresponding repeating moiety. In addition, a and b in Dispersant A represent the number of partial structures in brackets, and satisfy a+b=6.

Dispersant A

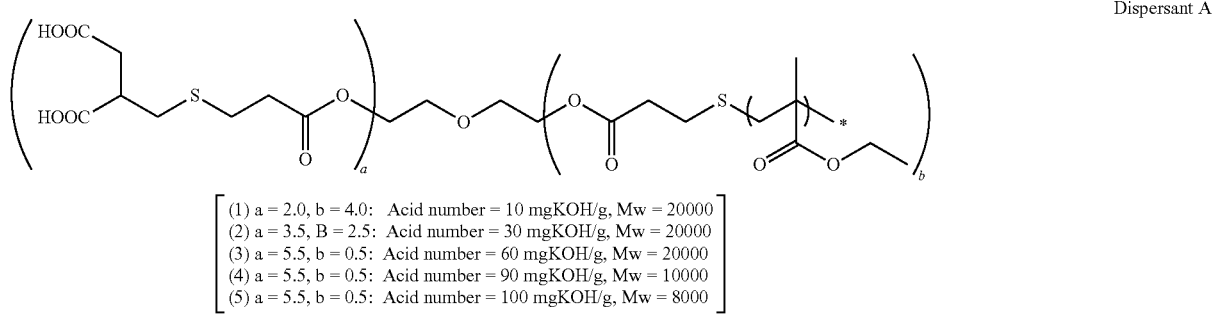

$$\begin{bmatrix} (1)\ a = 2.0,\ b = 4.0: & \text{Acid number} = 10\ \text{mgKOH/g},\ \text{Mw} = 20000 \\ (2)\ a = 3.5,\ B = 2.5: & \text{Acid number} = 30\ \text{mgKOH/g},\ \text{Mw} = 20000 \\ (3)\ a = 5.5,\ b = 0.5: & \text{Acid number} = 60\ \text{mgKOH/g},\ \text{Mw} = 20000 \\ (4)\ a = 5.5,\ b = 0.5: & \text{Acid number} = 90\ \text{mgKOH/g},\ \text{Mw} = 10000 \\ (5)\ a = 5.5,\ b = 0.5: & \text{Acid number} = 100\ \text{mgKOH/g},\ \text{Mw} = 8000 \end{bmatrix}$$

Dispersant B

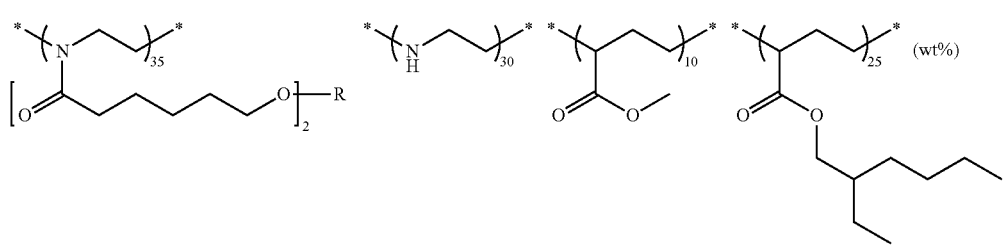

Acid number = 0 mgKOH/g, Mw = 43000

Dispersant C

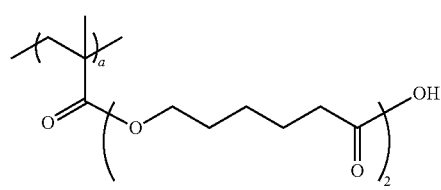

-continued
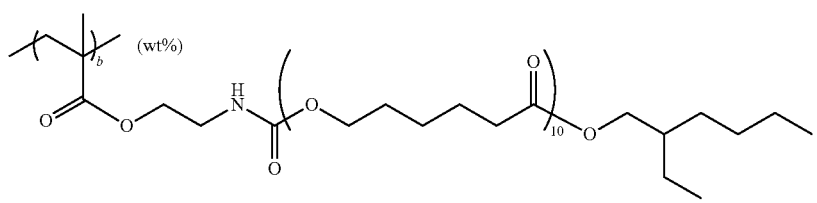
[ (1) a = 10, b = 90: Acid number = 10 mgKOH/g, Mw = 18000
  (2) a = 20, b = 80: Acid number = 30 mgKOH/g, Mw = 17000
  (3) a = 40, b = 60: Acid number = 60 mgKOH/g, Mw = 16000 ]
Dispersant D
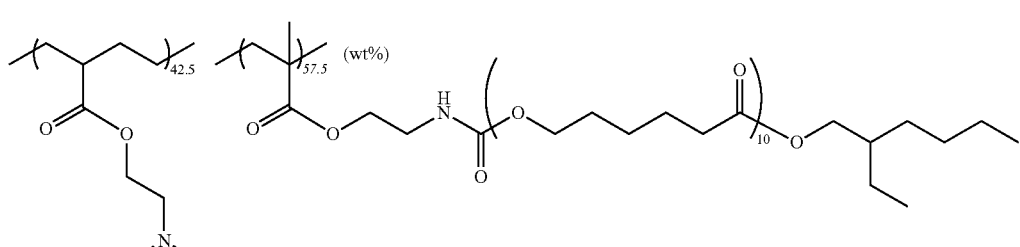
Acid number = 0 mgKOH/g, Mw = 20000
Dispersant E
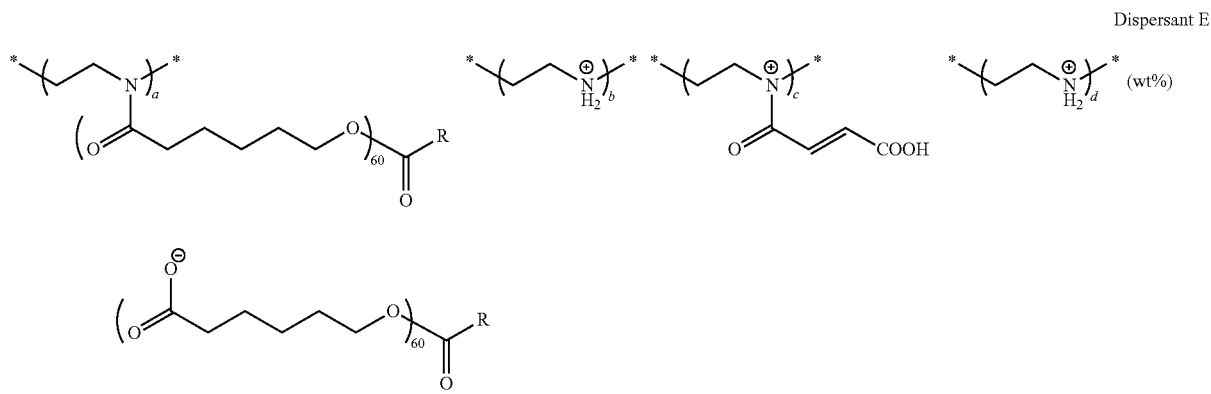
[ (1) a = 56, b = 4, c = 10, d = 30: Acid number = 10 mgKOH/g, Mw = 20000
  (2) a = 41, b = 4, c = 25, d = 30: Acid number = 30 mgKOH/g, Mw = 21000
  (3) a = 21, b = 4, c = 45, d = 30: Acid number = 60 mgKOH/g, Mw = 20000 ]
R = $C_7H_{15}$
Dispersant F
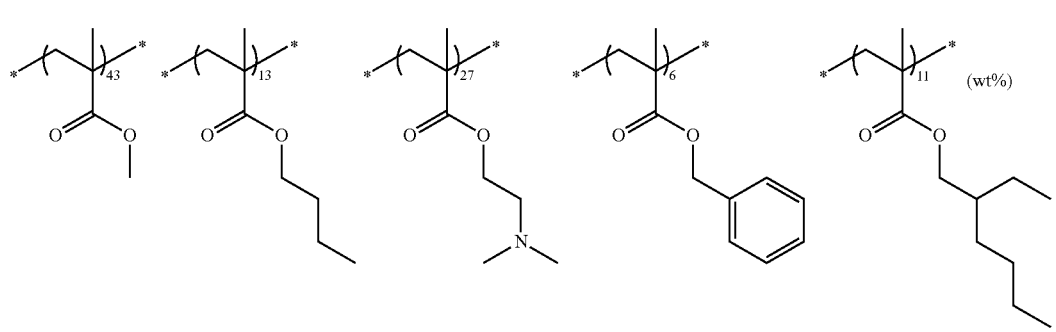
Acid number = 0 mgKOH/g, Mw = 4250

(Curable Compound)

Additive A
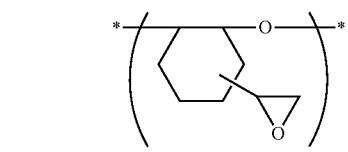

Additive B
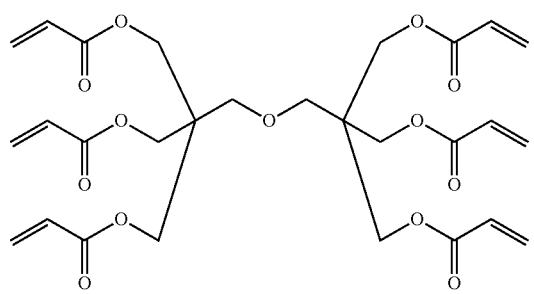

Additive C
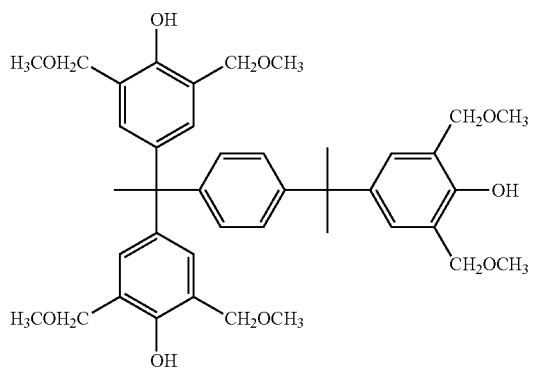

Additive D
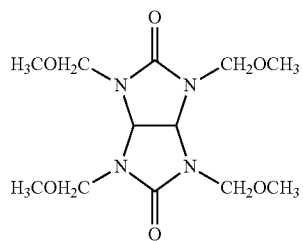

Additive E
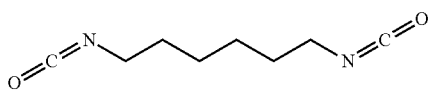

Additive F
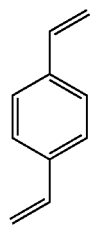

Additive G
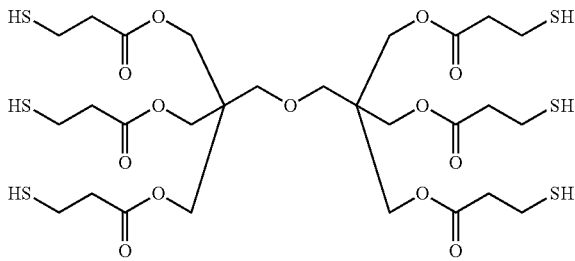

Mw = 2230

As shown in Tables 1 and 2, it is understood that the coloring compositions of Examples, in which the maximum solid acid number is 80 mg KOH/g or less, are excellent in dispersion stability, solvent resistance and alkaline developing solution resistance.

Further, in the above Examples, even when the pigment species is changed to a pigment mixture of C.I. Pigment Blue 15:6 and C.I. Pigment Violet 23 in a mass ratio of 80:20, and to a pigment mixture of C.I. Pigment Red 254 and C.I. Pigment Yellow 139 in a mass ratio of 75:25, the result was obtained that dispersion stability, solvent resistance and alkaline developing solution resistance are excellent.

Evaluation for Solvent Resistance Test

The coloring composition of Examples 39 and 40 was coated on a glass substrate to a film thickness of 0.6 μm by using a spin coater, and is subjected to heat treatment (pre-bake) with a hot plate at 100° C. for 120 seconds. Subsequently, heat treatment (post-bake) was performed with a hot plate at 200° C. for 300 seconds to prepare a hardened film.

The transmittance of the color filter thus obtained was measured at a wavelength region of 300 nm to 800 nm by a spectrophotometer (ref. glass substrate), which is a UV/VIS/NIR spectrophotometer, UV3600 (manufactured by SHIMADZU CORPORATION). In addition, differential interference images were observed through reflective observation (50× magnifications) by using an optical microscope, BX60 manufactured by OLYMPUS.

Subsequently, the filter was immersed in the following solvent for 5 minutes, dried and then, the film surface was observed again by spectrometry and an optical microscope, and the variance (a value represented by an equation $|T_0-T_1|$, wherein $T_0$ represents the transmittance before solvent immersion and $T_1$ represents the transmittance after solvent immersion) of the transmittance before and after solvent immersion and the film surface failure were evaluated.

(Solvent Used)
Propylene glycol monomethyl ether acetate,
Acetone,
Alkaline Developer FHD-5 (manufactured by FUJIFILM ELECTRONIC MATERIALS CO., LTD.),
N-methyl-2-pyrrolidone Evaluation (Spectral Variation Before and after Solvent Immersion)

Evaluation Criteria

AA: Good The variance of the transmittance at 300 nm to 800 nm before and after solvent immersion is less than 2%

A: Slightly good The variance of the transmittance at 300 nm to 800 nm before and after solvent immersion is 2% or more and less than 5%

B: Sufficient The variance of the transmittance at 300 nm to 800 nm before and after solvent immersion is 5% or more and less than 10%

C: Insufficient The variance of the transmittance at 300 nm to 800 nm before and after solvent immersion is more than 10%

Among the above four solvents, the worst evaluation is regarded as the evaluation of the corresponding example.

(Visual Evaluation Before and after Solvent Immersion)

Evaluation Criteria

AA: Good Not changed
A: Slightly good Almost not changed
B: Sufficient Surface roughness partially observed
C: Insufficient Surface roughness observed Among the above four solvents, the worst evaluation is regarded as the evaluation of the corresponding example.

The samples of Examples were evaluated relative to the solvent resistance as well as rectangularity and surface roughness.

TABLE 3

| Example | Spectral variance before and after solvent immersion | Visual evaluation before and after solvent immersion |
|---|---|---|
| 39 | A | A |
| 40 | AA | AA |

It can be seen from the results of Table 3, Example 40 using the dispersant C is more preferable in the viewpoints of "Spectral variance before and after solvent immersion" and "Visual evaluation before and after solvent immersion" which represent solvent resistance and alkaline developing solution resistance as compared to Example 39 using the dispersant A.

(Preparation of Red Pigment Dispersion)

A mixed solution composed of 8.3 parts by weight of C.I. Pigment Red 254 and 3.7 parts by weight of C.I. Pigment Yellow 139 as pigments, 4.8 parts by weight of BYK-161 (produced by BYK Chemie) as a pigment dispersing agent and 83.2 parts by weight of PGMEA was mixed and dispersed in a bead mill for 15 hours to prepare Red pigment dispersion R1.

(Preparation of Blue Pigment Dispersion)

A mixed solution composed of 9.5 parts by weight of C.I. Pigment Blue 15:6 and 2.4 parts by weight of C.I. Pigment Violet 23 as pigments, 5.6 parts by weight of BYK-161 (produced by BYK Chemie) as a pigment dispersing agent and 82.5 parts by weight of PGMEA was mixed and dispersed in a bead mill for 15 hours to prepare Blue pigment dispersion B1.

(Preparation of Colored Radiation-Sensitive Composition for Forming Red Filter)

| | |
|---|---|
| Pigment dispersion: Red pigment dispersion R1 described above | 51.2 parts |
| Photopolymerization initiator: IRGACURE OXE-01 (produced by BASF) | 0.87 parts |
| Polymerizable compound: KAYARAD RP-1040 (produced by Nippon Kayaku Co., Ltd.) | 4.7 parts |
| Binder: ACA230AA (produced by Daicel Corp.) | 7.4 parts |
| Polymerization inhibitor: p-Methoxyphenol | 0.002 parts |
| Additive: PIONIN D-6112-W (produced by Takemoto Oil & Fat Co., Ltd.) | 0.19 parts |
| Silane coupling agent: 0.9% Cyclohexanone solution of KBM-602 (produced by Shin-Etsu Chemical Co., Ltd.) | 10.8 parts |
| Organic solvent: PGMEA | 14.3 parts |
| Organic solvent: Cyclohexanone | 6.4 parts |
| Fluorine-based surfactant: 0.2% Cyclohexanone solution of F-781 (produced by DIC Corp.) | 4.2 parts |

(Preparation of Colored Radiation-Sensitive Composition for Forming Blue Filter)

| | |
|---|---|
| Pigment dispersion: Blue pigment dispersion B1 described above | 51.2 parts |
| Photopolymerization initiator: IRGACURE OXE-01 (produced by BASF) | 0.87 parts |
| Polymerizable compound: KAYARAD RP-1040 (produced by Nippon Kayaku Co., Ltd.) | 4.7 parts |
| Binder: ACA230AA (produced by Daicel Corp.) | 7.4 parts |
| Polymerization inhibitor: p-Methoxyphenol | 0.002 parts |
| Additive: PIONIN D-6112-W (produced by Takemoto Oil & Fat Co., Ltd.) | 0.19 parts |
| Silane coupling agent: 0.9% Cyclohexanone solution of KBM-602 (produced by Shin-Etsu Chemical Co., Ltd.) | 10.8 parts |
| Organic solvent: PGMEA | 14.3 parts |
| Organic solvent: Cyclohexanone | 6.4 parts |
| Fluorine-based surfactant: 0.2% Cyclohexanone solution of F-781 (produced by DIC Corp.) | 4.2 parts |

Process of Forming Green Color Pattern (Green Color Pixel) by Dry Etching (Formation of Green Color Layer)

The colored composition for forming green color filter for each of the examples and comparative examples was coated on a glass wafer by a spin coater so as to form a layer having a thickness of 0.6 μm, dried by a hot plate at 100° C. for 180 seconds and then subjected to a heat treatment (post bake) using a hot plate at 200° C. for 300 seconds to form a green color layer. The thickness of the green color layer was 0.6 μm.

(Coating of Resist for Mask)

Then, a positive resist (FHi622BC, produced by Fujifilm Electronic Materials Co., Ltd.) was coated on the green color layer and subjected to pre bake to form a photoresist layer having a thickness of 0.8 μm.

(Pattern Exposure and Development of Resist for Mask)

Then, the photoresist layer was subjected to pattern exposure using an i-ray stepper (produced by Canon Inc.) in an exposure amount of 350 mJ/cm$^2$ and then heat treatment for one minute at temperature at which the temperature of the photoresist layer or ambient temperature reached 90° C. Then, development processing was conducted using a developer (FHD-5, produced by Fujifilm Electronic Materials Co., Ltd.) for one minute and then a post back treatment was conducted at 110° C. for one minute to from a resist pattern. The resist pattern formed was a pattern in which square resist films each having one side length of 1.25 μm were arranged checkerwise, in consideration of an etching conversion difference (decrease in a pattern width by etching).

(Dry Etching)

Then, using the resist pattern as an etching mask, dry etching of the green color layer was conducted in the procedure described below.

A first stage etching treatment was conducted for 80 seconds using a dry etching device (U-621, produced by Hitachi, Ltd.) under the conditions of RF power: 800 W;

antenna bias: 400 W; wafer bias: 200 W; inner pressure of chamber: 4.0 Pa; substrate temperature: 50 C.°; and the kind and flow rate of mixed gas: $CF_4$: 80 ml/min, $O_2$: 40 ml/min and Ar: 800 ml/min.

The scraping amount of the green color layer under the conditions described above was 534 nm (etching amount of 89%) and about 58 nm of the green color layer remained.

Then, a second stage etching treatment and an over etching treatment were conducted with an over-etching ratio of 20% to the total etching using the same etching device under the conditions of RF power: 600 W; antenna bias: 100 W; wafer bias: 250 W; inner pressure of chamber: 2.0 Pa; substrate temperature: 50 C.°; and the kind and flow rate of mixed gas: $N_2$: 500 ml/min, $O_2$: 50 ml/min and Ar: 500 ml/min ($N_2/O_2/Ar=10/1/10$).

The etching rate of the green color layer under the conditions of second stage etching treatment was 600 nm/min or more and it took a period of about 10 seconds to etch the remaining green color layer. By adding 10 seconds of the etching time for the second stage etching treatment to 80 seconds of the etching time for the first stage etching treatment, the etching time was calculated. As a result, the etching time was 80+10=90 seconds, the over-etching time was 90×0.2=18 seconds, and the total etching time was 90+18=108 seconds.

After conducting the dry etching under conditions described above, a stripping treatment was conducted using a photoresist stripping solution (MS230C, produced by Fujifilm Electronic Materials Co., Ltd.) for 120 seconds to remove the resist pattern, and then washing with pure water and spin drying were conducted. Thereafter, a dehydration baking treatment was conducted at 100° C. for 2 minutes. Thus, a green color pattern in which square green color pixels each having one side length of 1.2 μm were arranged checkerwise was obtained.

Each green color pattern in which square green color pixels each having one side length of 1.2 μm were arranged checkerwise and which was prepared using the colored composition for forming green color filter of each of the examples in the step of forming green color pattern (green color pixel) by dry etching was prepared. The colored radiation-sensitive composition for forming red filter was coated on the green color pattern so as that an inside of each through-hole of the green color pattern was filled with the colored radiation-sensitive composition for forming red filter and that the thickness after drying and post bake became 0.40 μm to obtain a stacked color filter composed of the red color radiation-sensitive layer formed on the green color layer (corresponding to the state shown in FIG. 7).

The red color radiation-sensitive layer of the stacked color filter thus-obtained was subjected to pattern exposure using an i-ray stepper (produced by Canon Inc.) in an exposure amount of 350 mJ/cm². The exposed areas were areas corresponding to the through-halls located in even lines in the checkered green color pattern (corresponding to the position 21A in the second colored radiation-sensitive layer 21 corresponding to the first through-hole part group 121 formed in the first colored layer 11 (refer to FIG. 7)).

Then, the stacked color filter after exposure was mounted on a horizontal rotary table of a spin shower developing machine (Model DW-30, produced by Chemitronics Co., Ltd.) and subjected to puddle development at 23° C. for 60 seconds using a 60% diluted solution of CD-2000 (produced by Fujifilm Electronic Materials Co., Ltd.). Then, the color filter was fixed on the horizontal rotary table with a vacuum chuck system, and subjected to a rinse treatment by supplying a shower of pure water from a jet nozzle above the center of rotation while the color filter was rotated by a rotator at a rotation speed of 50 rpm, followed by spray drying.

Thus, a color filter precursor in which the red color radiation-sensitive layer and the red color pixels formed in the inside of the through-holes located in odd lines in the checkered green color pattern were removed was obtained (corresponding to the state shown in FIG. 8).

Figure 9:
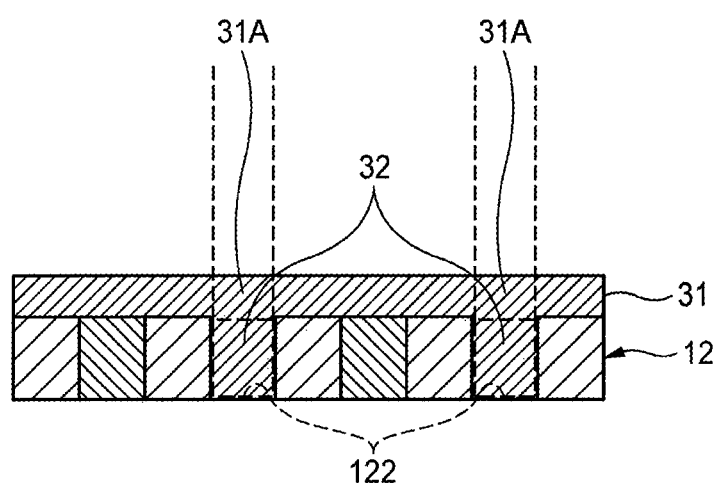
FIG. 9 is a schematic cross-sectional view illustrating a state where a third colored pattern and a third colored radiation sensitive layer are formed.

Then, the colored radiation-sensitive composition for forming blue filter was coated on the color filter precursor so as that an inside of each through-hole of the green color pattern of the color filter precursor was filled with the colored radiation-sensitive composition for forming blue filter and that the thickness after drying and post bake became 0.40 μm to obtain a stacked color filter composed of the blue color radiation-sensitive layer formed on the green color layer (corresponding to the state shown in FIG. 9).

The blue color radiation-sensitive layer of the stacked color filter thus-obtained was subjected to pattern exposure using an i-ray stepper (produced by Canon Inc.) in an exposure amount of 350 mJ/cm². The exposed areas were areas corresponding to the through-halls located in odd lines in the checkered green color pattern (corresponding to the position 31A in the third colored radiation-sensitive layer 31 corresponding to the second through-hole part group 122 formed in the first colored layer 11 (refer to FIG. 9)).

Then, the stacked color filter after exposure was mounted on a horizontal rotary table of a spin shower developing machine (Model DW-30, produced by Chemitronics Co., Ltd.) and subjected to puddle development at 23° C. for 60 seconds using a 60% diluted solution of CD-2000 (produced by Fujifilm Electronic Materials Co., Ltd.). Then, the color filter was fixed on the horizontal rotary table with a vacuum chuck system, and subjected to a rinse treatment by supplying a shower of pure water from a jet nozzle above the center of rotation while the color filter was rotated by a rotator at a rotation speed of 50 rpm, followed by spray drying.

Thus, a color filter in which the blue color radiation-sensitive layer in the stacked color filter was removed was obtained (corresponding to the state shown in FIG. 10).

To each of GRB color filters manufactured by combining each green-colored curable composition, the colored radiation-sensitive composition for forming red color filter, and the colored radiation-sensitive composition for forming blue color filter, each of propylene glycol monomethyl ether (PGMEA), acetone, N-methylpyrrolidone (NMP), stripping solution MS230C (manufactured by FUJIFILM ELECTRONIC MATERIALS CO., LTD.), alkaline developer FHD-5 (tetramethylammonium hydroxide (TMAH): 2.38% by mass, manufactured by FUJIFILM ELECTRONIC MATERIALS CO., LTD.) was dropped and allowed them to stand for 120 seconds, followed by rinsing with flowed water for 10 seconds.

The spectral variance of the transmittance before and after adding dropwise in the various liquids was measured and color difference ΔEab was measured.

Low value of ΔEab denotes excellent solvent resistance and alkaline developing solution resistance.

The green color filters of each of Examples show excellent solvent resistance and alkaline developing solution resistance as compared to Comparative Examples as well as the case of using the green color filter alone.

INDUSTRIAL APPLICABILITY

Therefore, when the coloring composition is used as a first coloring composition in the method for preparing a color filter of the present invention, since the first colored layer, furthermore, the first colored pixel is formed with a coloring composition having high concentration of a colorant, the thickness of the first pixel can be made very thin (for example, 0.7 µm or less). Accordingly, a color filter in which crosstalk (color mixing of light) is suppressed can be manufactured with the method.

Further, the first pixel formed with the coloring composition of the present invention has excellent solvent resistance and alkaline developing solution resistance. Accordingly, the occurrence of overlap region overlapped with colors in other colored layers and other colored patterns may be reduced, and as a result, a high performance color filter may be prepared.

This application is based on a Japanese patent application filed on Aug. 31, 2011 (Japanese Patent Application No. 2011-190186), and the contents thereof are incorporated herein by reference.

The invention claimed is:

1. A method for manufacturing a color filter comprising:
    (a) forming a first colored layer including a first coloring composition; and
    (b) patterning the first coloring composition by dry etching to form a group of through-holes in the first colored layer including a first group of through-holes and a second group of through-holes;
    (c) stacking a second colored radiation sensitive layer including a second coloring radiation sensitive composition on the first colored layer so that the second coloring radiation sensitive composition is embedded inside each of the through-holes in the first group of the through-holes and the second group of the through-holes so as to form a plurality of second colored pixels;
    (d) removing the second colored radiation sensitive layer and a plurality of the second colored pixels formed inside each of the through-holes in the second group of the through-holes by exposing and developing a position in the second colored radiation sensitive layer, which corresponds to the first group of the through-holes formed in the first colored layer;
    (e) stacking a third colored radiation sensitive layer including a third coloring radiation sensitive composition on the first colored layer so that the third coloring radiation sensitive composition is embedded inside each of the through-holes in the second group of the through-holes so as to form a plurality of third colored pixels; and
    (f) removing the third colored radiation sensitive layer by exposing and developing a position in the third colored radiation sensitive layer, which corresponds to the second group of the through-holes formed in the first colored layer,
    wherein the first coloring composition comprises:
    a colorant; and
    a resin,
    wherein the content of the colorant is 50% by mass or more based on the total solids of the first coloring composition, and
    the solid acid number of the resin having the highest solid acid number among all kinds of resins contained in the first coloring composition, is 80 mg KOH/g or less.

2. The method according to claim 1,
    wherein the second coloring radiation sensitive composition contains a colorant in an amount of 30% by mass or more based on the total solids of the second coloring radiation sensitive composition, and
    the third coloring radiation sensitive composition contains a colorant in an amount of 30% by mass or more based on the total solids of the third coloring radiation sensitive composition, and
    the second coloring composition contains a colorant in amount of 30% by mass or more based on the total solids of the third coloring radiation sensitive composition.

3. The method according to claim 1,
    wherein the first colored layer is a green transmitting layer.

4. The method according to claim 3,
    wherein one of the second colored pixels and the third colored pixels is a red transmitting part, and the other is a blue transmitting part.

* * * * *